(12) United States Patent
Yamazaki et al.

(10) Patent No.: US 9,876,058 B2
(45) Date of Patent: Jan. 23, 2018

(54) DISPLAY DEVICE, LIGHT-EMITTING DEVICE, AND ELECTRONIC APPLIANCE HAVING ORGANIC RESIN FILM

(71) Applicant: Semiconductor Energy Laboratory Co., Ltd., Atsugi-shi, Kanagawa-ken (JP)

(72) Inventors: Shunpei Yamazaki, Tokyo (JP); Shingo Eguchi, Kanagawa (JP); Toshiyuki Isa, Kanagawa (JP); Sayaka Kaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 104 days.

(21) Appl. No.: 14/705,774

(22) Filed: May 6, 2015

(65) Prior Publication Data

US 2015/0325631 A1 Nov. 12, 2015

(30) Foreign Application Priority Data

May 9, 2014 (JP) ................. 2014-097943

(51) Int. Cl.
*H01L 27/32* (2006.01)
*H01L 29/24* (2006.01)
*H01L 29/786* (2006.01)
*H01L 51/52* (2006.01)

(52) U.S. Cl.
CPC ...... *H01L 27/3244* (2013.01); *H01L 27/3248* (2013.01); *H01L 27/3258* (2013.01); *H01L 29/24* (2013.01); *H01L 29/786* (2013.01); *H01L 29/7869* (2013.01); *H01L 51/5237* (2013.01); *H01L 51/5246* (2013.01); *H01L 51/5253* (2013.01); *H01L 27/323* (2013.01)

(58) Field of Classification Search
CPC . H01L 27/3248; H01L 29/7869; H01L 29/24; H01L 27/3258; H01L 51/5237; H01L 27/32; H01L 51/52; H01L 29/786
USPC ........................................................ 257/40
See application file for complete search history.

(56) References Cited

U.S. PATENT DOCUMENTS

| | | | |
|---|---|---|---|
| 8,222,092 B2 | 7/2012 | Yamazaki et al. | |
| 8,293,595 B2 | 10/2012 | Yamazaki et al. | |
| 8,367,440 B2 | 2/2013 | Takayama et al. | |
| 8,383,470 B2 | 2/2013 | Akimoto et al. | |

(Continued)

FOREIGN PATENT DOCUMENTS

JP 2003-174153 A 6/2003

*Primary Examiner* — Alexander Oscar Williams
(74) *Attorney, Agent, or Firm* — Fish & Richardson P.C.

(57) ABSTRACT

A highly reliable display device or electronic appliance is provided. The display device or a light-emitting device includes a substrate; a light-emitting element including a first electrode, an EL layer, and a second electrode; an organic resin film in contact with the light-emitting element; and an oxide semiconductor film in contact with the light-emitting element and the organic resin film. The oxide semiconductor film is in contact with the first electrode or the second electrode included in the light-emitting element. The oxide semiconductor film is in contact with an exposed portion of the organic resin film, typically, a side surface of the organic resin film. The light-emitting element and the organic resin film are positioned between the substrate and the oxide semiconductor film.

13 Claims, 36 Drawing Sheets

(56) References Cited

U.S. PATENT DOCUMENTS

| | | | |
|---|---|---|---|
| 8,415,208 B2 | 4/2013 | Takayama et al. | |
| 8,450,144 B2 | 5/2013 | Sakata et al. | |
| 8,502,225 B2 | 8/2013 | Yamazaki et al. | |
| 8,704,219 B2 | 4/2014 | Yamazaki et al. | |
| 9,082,678 B2* | 7/2015 | Yamazaki | G06F 3/0412 |
| 9,403,947 B2* | 8/2016 | Katayama | C08J 5/18 |
| 9,695,283 B2* | 7/2017 | Katayama | C08G 73/1067 |
| 2006/0091793 A1 | 5/2006 | Baude et al. | |
| 2007/0258022 A1* | 11/2007 | Takechi | G02F 1/133555 |
| | | | 349/63 |
| 2008/0176041 A1* | 7/2008 | Sato | H01L 51/0097 |
| | | | 428/161 |
| 2008/0296568 A1 | 12/2008 | Ryu et al. | |
| 2011/0037068 A1* | 2/2011 | Yamazaki | H01L 27/1225 |
| | | | 257/43 |
| 2011/0057186 A1* | 3/2011 | Yamazaki | H01L 27/1225 |
| | | | 257/43 |
| 2012/0161125 A1 | 6/2012 | Yamazaki | |
| 2012/0248433 A1 | 10/2012 | Nakano et al. | |
| 2012/0287027 A1 | 11/2012 | Koyama | |
| 2013/0161684 A1* | 6/2013 | Momma | H01L 33/52 |
| | | | 257/100 |
| 2013/0187153 A1* | 7/2013 | Yamazaki | H01L 29/78606 |
| | | | 257/43 |
| 2013/0214324 A1 | 8/2013 | Takayama et al. | |
| 2013/0270549 A1* | 10/2013 | Okazaki | H01L 29/7869 |
| | | | 257/43 |
| 2014/0070208 A1* | 3/2014 | Yamazaki | H01L 27/1225 |
| | | | 257/43 |
| 2014/0110705 A1* | 4/2014 | Koezuka | H01L 21/022 |
| | | | 257/43 |
| 2015/0171115 A1* | 6/2015 | Yamazaki | H01L 27/1225 |
| | | | 257/43 |
| 2015/0255518 A1* | 9/2015 | Watanabe | H01L 27/1225 |
| | | | 257/40 |
| 2015/0325631 A1* | 11/2015 | Yamazaki | H01L 27/3248 |
| | | | 257/40 |
| 2016/0204389 A1* | 7/2016 | Nirengi | H01L 51/0023 |
| | | | 438/34 |
| 2016/0293684 A1* | 10/2016 | Murakami | H01L 27/12 |
| 2016/0293767 A1* | 10/2016 | Yamazaki | H01L 21/02554 |
| 2016/0299387 A1* | 10/2016 | Yamazaki | G02F 1/134309 |
| 2016/0299601 A1* | 10/2016 | Yamazaki | G06F 3/044 |
| 2016/0336380 A1* | 11/2016 | Yamazaki | G06F 3/0412 |
| 2017/0240707 A1* | 8/2017 | Katayama | C08G 73/1067 |

* cited by examiner

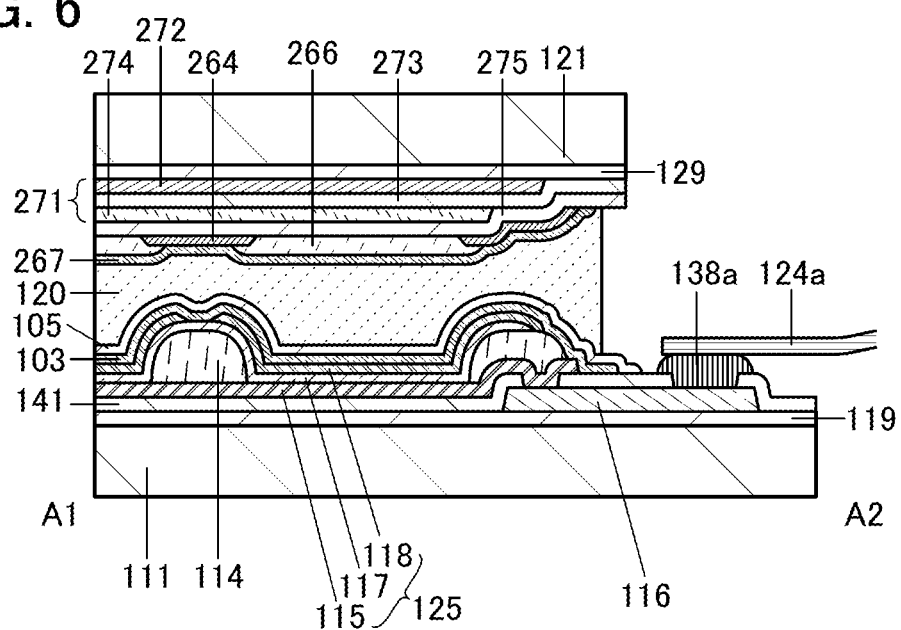

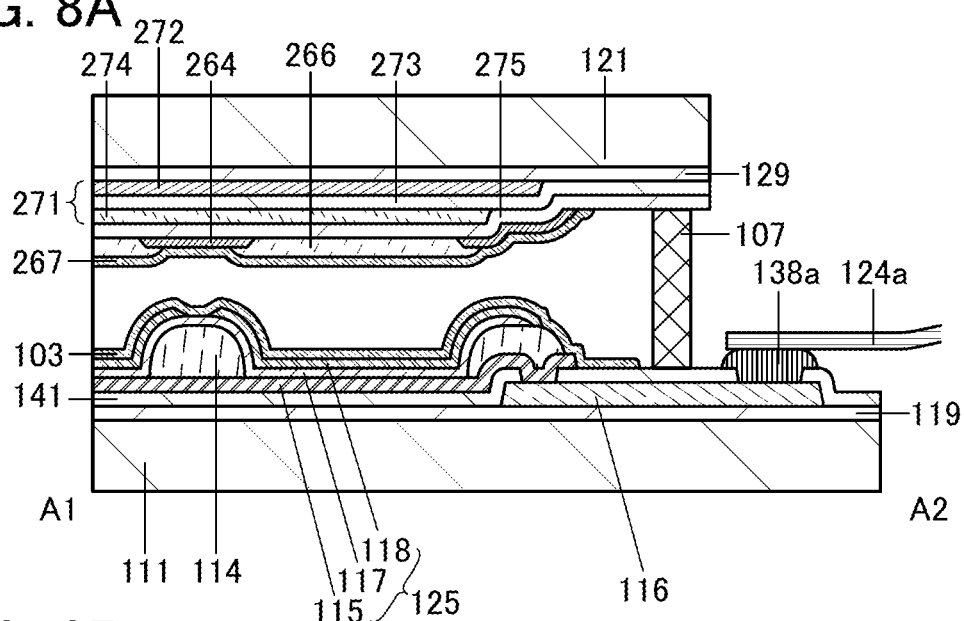
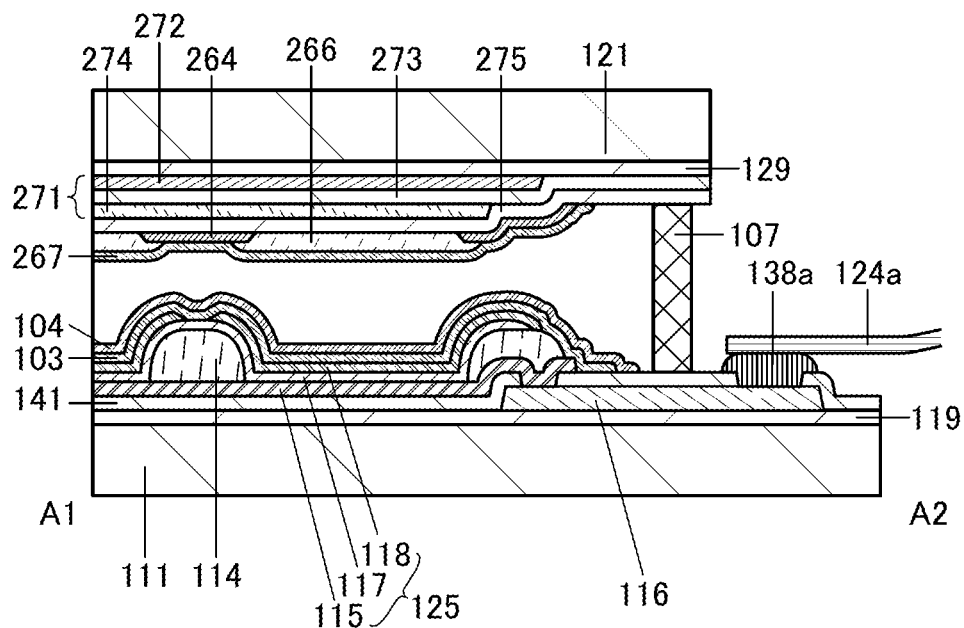

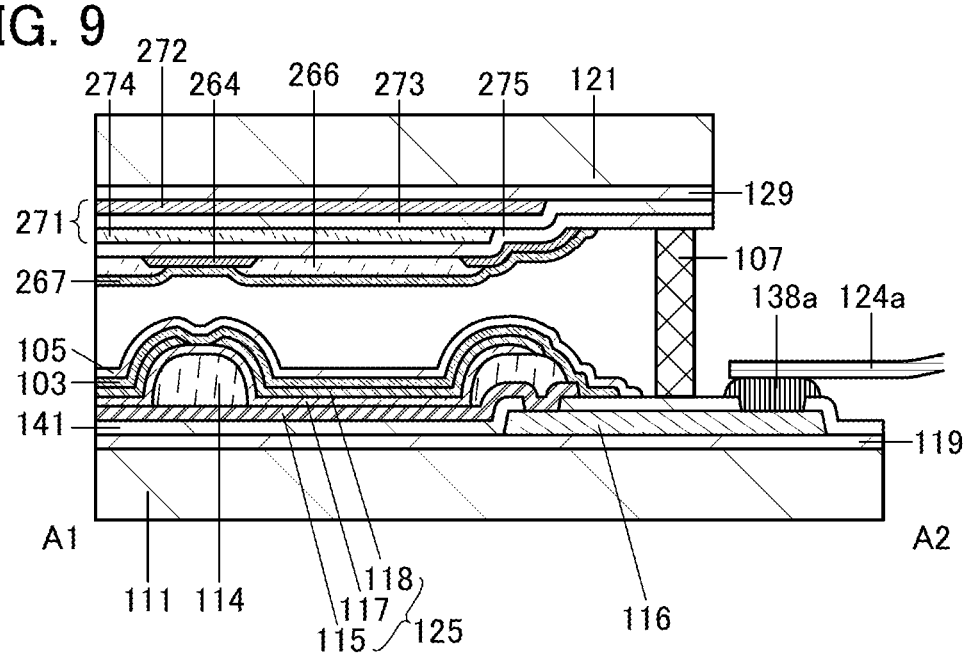

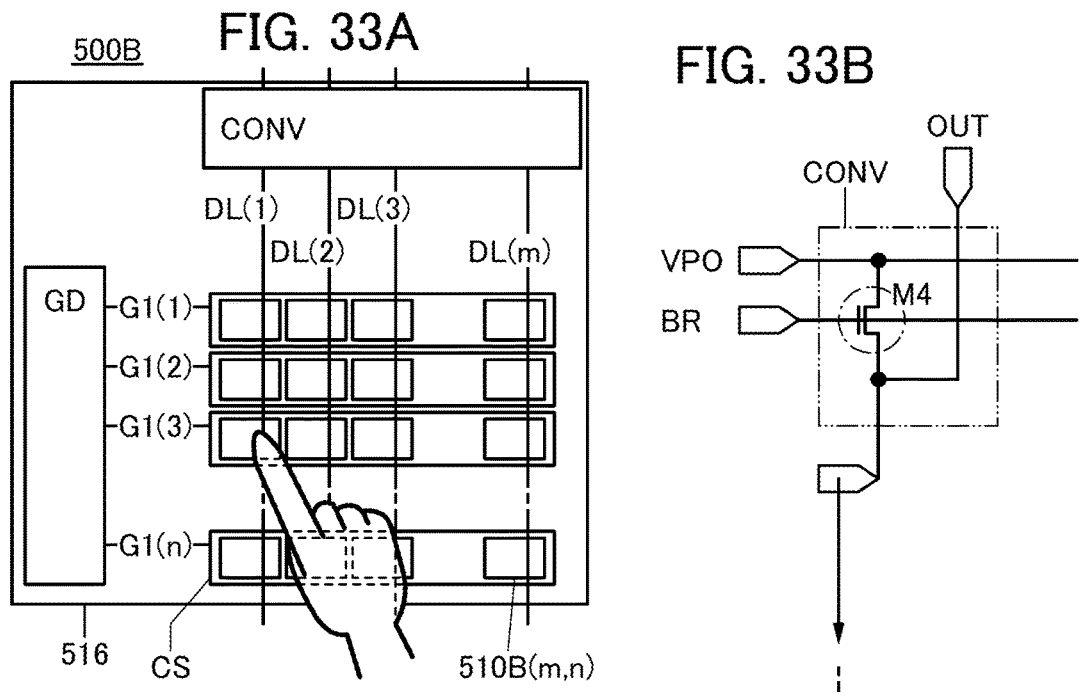
FIG. 33A
FIG. 33B
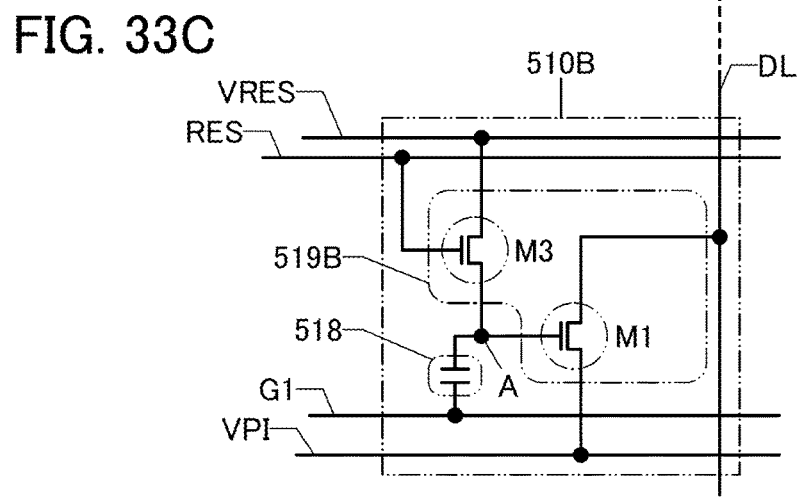
FIG. 33C
FIG. 33D

DISPLAY DEVICE, LIGHT-EMITTING DEVICE, AND ELECTRONIC APPLIANCE HAVING ORGANIC RESIN FILM

BACKGROUND OF THE INVENTION

1. Field of the Invention

One embodiment of the present invention relates to a display device. One embodiment of the present invention relates to a method for manufacturing a display device.

Note that one embodiment of the present invention is not limited to the above technical field. One embodiment of the present invention relates to, for example, an object, a method, or a manufacturing method. The present invention relates to a process, a machine, manufacture, or a composition of matter. One embodiment of the present invention relates to a memory device, a processor, a driving method thereof, or a manufacturing method thereof.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic appliance, and the like may include a semiconductor element or a semiconductor circuit. Thus, a display device, a light-emitting device, a lighting device, an electro-optical device, an electronic appliance, and the like may include a semiconductor device.

2. Description of the Related Art

In recent years, liquid crystal elements have been extensively researched and developed as a display element used in a display region of a display device. In addition, light-emitting elements utilizing electroluminescence (EL) have been extensively researched and developed. In a basic structure of a light-emitting element, a layer containing a light-emitting substance is interposed between a pair of electrodes. Voltage is applied to the light-emitting element to obtain light emission from the light-emitting substance.

The light-emitting element is a self-luminous element; thus, a display device using the light-emitting element particularly has advantages such as high visibility, no necessity of a backlight, and low power consumption. In addition, the light-emitting element has advantages in that the element can be manufactured to be thin and lightweight and has high response speed.

A display device including the display element can be flexible; thus, the use of a flexible substrate for the display device has been proposed.

As a method for manufacturing a display device using a flexible substrate, a technique has been developed in which a semiconductor element such as a thin film transistor is manufactured over a substrate such as a glass substrate or a quartz substrate, for example, a space between the semiconductor element and another substrate is filled with an organic resin, and then the semiconductor element is transferred from the glass substrate or the quartz substrate to the other substrate (e.g., a flexible substrate) (Patent Document 1).

In some cases, over a light-emitting element that has been formed over a flexible substrate, another flexible substrate is provided in order to protect a surface of the light-emitting element or prevent entry of moisture or impurities from the outside.

Display devices are expected to be applied to a variety of uses and become diversified. For example, a smartphone and a tablet with a touch sensor are being developed as portable information appliances.

REFERENCE

Patent Document 1: Japanese Published Patent Application No. 2003-174153

SUMMARY OF THE INVENTION

In particular, a light-emitting element that contains an organic compound as its main component easily deteriorates mainly because of water. This might result in a partial decrease in luminance of a display device. A non-light-emitting region might be formed in the display device.

An object of one embodiment of the present invention is to provide a highly reliable display device or electronic appliance. Another object of one embodiment of the present invention is to provide a display device or an electronic appliance that is unlikely to be broken. Another object of one embodiment of the present invention is to provide a display device or an electronic appliance that is thin or lightweight. Another object of one embodiment of the present invention is to provide a low-power-consumption display device or electronic appliance. Another object of one embodiment of the present invention is to provide a novel display device or electronic appliance.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device or a light-emitting device that includes a substrate; a light-emitting element including a first electrode, an EL layer, and a second electrode; an organic resin film in contact with the light-emitting element; and an oxide semiconductor film in contact with the light-emitting element and the organic resin film. The oxide semiconductor film is in contact with the first electrode or the second electrode included in the light-emitting element. The oxide semiconductor film is in contact with an exposed portion of the organic resin film, typically, a side surface of the organic resin film. The light-emitting element and the organic resin film are positioned between the substrate and the oxide semiconductor film.

The oxide semiconductor film has low moisture permeability. Thus, the oxide semiconductor film can prevent diffusion of water inside and outside the display device into the EL layer in the light-emitting element. The oxide semiconductor film also can prevent deterioration of the light-emitting element due to water. Note that the oxide semiconductor film is formed using a Ga oxide, a Zn oxide, an In—Ga oxide, an In—Zn oxide, an M-Zn oxide (M is Al, Ga, Y, Zr, Sn, La, Ce, or Nd), an In-M-Zn oxide (M is Al, Ga, Y, Zr, Sn, La, Ce, or Nd), or the like.

Another embodiment of the present invention is a display device or a light-emitting device that includes a light-emitting element, an organic resin film, and a first film. The organic resin film includes a region in contact with the light-emitting element. The light-emitting element includes a first electrode, an EL layer, and a second electrode. The first film includes a region in contact with the second electrode. The first film includes a region in contact with at least a side surface of the organic resin film. The first film contains oxygen and at least one of zinc and gallium. Furthermore, an insulating film in contact with the first film may be included.

Another embodiment of the present invention is a display device or a light-emitting device that includes a light-emitting element, an organic resin film in contact with the light-emitting element, a first film, and a second film. The organic resin film includes a region in contact with the light-emitting element. The light-emitting element includes a first electrode, an EL layer, and a second electrode. The second film is over the first film and includes a region in contact with the first film. The first film includes a region in contact with the second electrode. The first film includes a region in contact with at least a side surface of the organic resin film. The first film contains oxygen and at least one of zinc and gallium. The second film contains indium and oxygen.

Another embodiment of the present invention is a display device or a light-emitting device that includes a light-emitting element, an organic resin film in contact with the light-emitting element, a first film, and a second film. The organic resin film includes a region in contact with the light-emitting element. The light-emitting element includes a first electrode, an EL layer, and a second electrode. The first film is over the second film and includes a region in contact with the second film. The second film includes a region in contact with the second electrode. The second film includes a region in contact with at least a side surface of the organic resin film. The first film contains oxygen and at least one of zinc and gallium. The second film contains indium and oxygen.

Note that the first film may contain indium, M (M is Al, Ga, Y, Zr, Sn, La, Ce, or Nd), zinc, and oxygen. The atomic proportion of M may be larger than the atomic proportion of indium, and the atomic proportion of zinc may be larger than the atomic proportion of indium.

The display device or the light-emitting device of one embodiment of the present invention may include a transistor connected to the light-emitting element.

According to one embodiment of the present invention, a highly reliable display device or electronic appliance can be provided. According to one embodiment of the present invention, a display device, an electronic appliance, or the like that is unlikely to be broken can be provided. According to one embodiment of the present invention, a display device, an electronic appliance, or the like that is thin or lightweight can be provided. According to one embodiment of the present invention, a low-power-consumption display device, a low-power-consumption electronic appliance, or the like can be provided. According to one embodiment of the present invention, a novel display device, a novel electronic appliance, or the like can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIG. 6 is a cross-sectional view illustrating one embodiment of the present invention.

FIGS. 8A and 8B are cross-sectional views illustrating one embodiment of the present invention.

FIG. 9 is a cross-sectional view illustrating one embodiment of the present invention.

FIGS. 33A to 33D illustrate a structure example of a touch sensor and an example of a method for driving the touch sensor.

DETAILED DESCRIPTION OF THE INVENTION

Figure 1A:
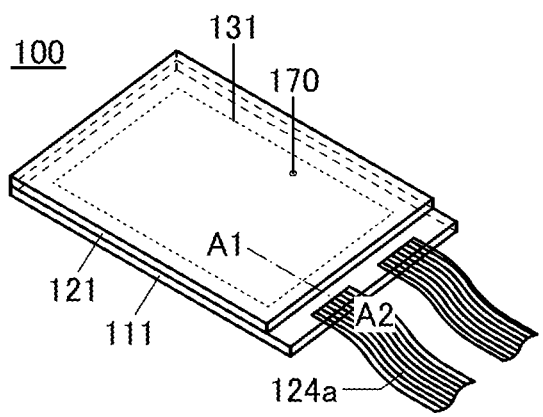
FIGS. 1A and 1B are a perspective view and a cross-sectional view illustrating one embodiment of the present invention.

Embodiments will be described in detail with reference to the accompanying drawings. Note that the present invention is not limited to the following description and it will be readily appreciated by those skilled in the art that modes and details can be modified in various ways without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating film A" does not necessarily mean that the electrode B is on and in direct contact with the insulating film A and can mean the case where another component is provided between the insulating film A and the electrode B.

Functions of a source and a drain might be switched depending on operation conditions, for example, when a transistor having opposite polarity is employed or the direction of current flow is changed in circuit operation. Thus, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (a GND potential)). A voltage can be referred to as a potential and vice versa.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Embodiment 1

Figure 1B:
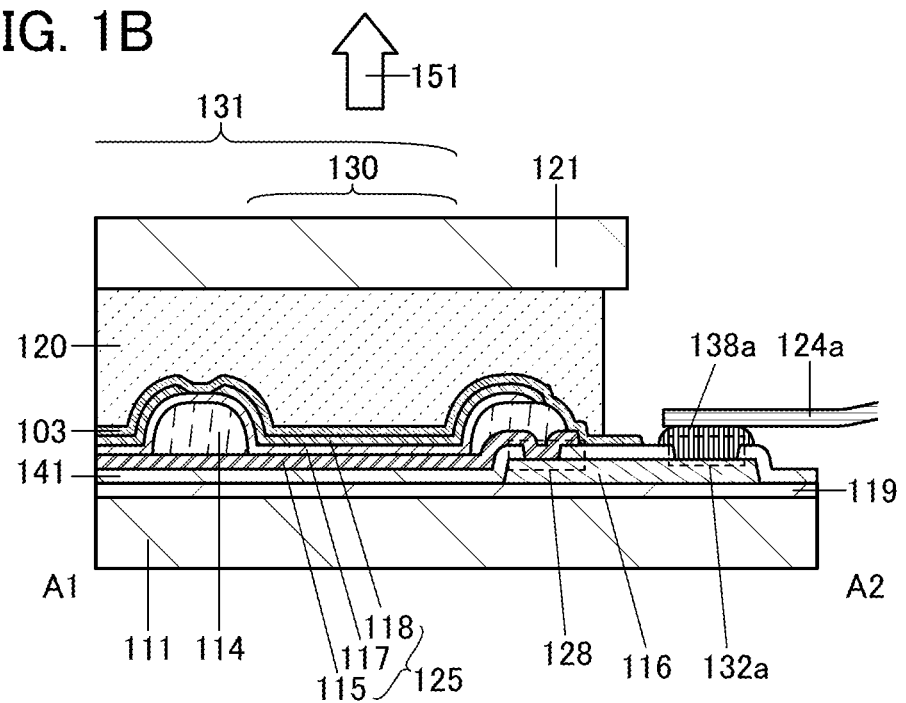

A structure example of a display device 100 of one embodiment of the present invention and a method for manufacturing the display device 100 are described with reference to FIGS. 1A and 1B, FIGS. 2A and 2B, FIGS. 3A and 3B, FIGS. 4A and 4B, FIGS. 5A and 5B, FIG. 6, FIGS. 7A to 7C, FIGS. 8A and 8B, FIG. 9, FIG. 10, FIGS. 11A and 11B, FIGS. 12A to 12E, FIGS. 13A to 13C, FIGS. 14A to 14E, FIGS. 15A to 15D, FIGS. 16A to 16C, FIGS. 17A and 17B, FIGS. 18A and 18B, FIGS. 19A to 19C, FIGS. 20A and 20B, FIGS. 21A to 21C, FIGS. 22A and 22B, FIGS. 23A and 23B, and FIGS. 24A and 24B. In this embodiment, the display device 100 having a passive matrix structure is described. FIG. 1A is a perspective view of the display device 100 to which an external electrode 124a is connected. FIG. 1B is a cross-sectional view taken along dashed-dotted line A1-A2 in FIG. 1A. Note that the display device 100 disclosed in this specification is an example of a display device in which a light-emitting element is used as a display element. As the display device 100 of one embodiment of the present invention, a display device having a top-emission structure is described as an example. Note that the display device 100 can be a display device having a bottom-emission structure or a dual-emission structure.

<Structure 1 of Display Device>

A structure example of the display device 100 of one embodiment of the present invention is described with reference to FIGS. 1A and 1B and FIGS. 2A and 2B. The display device 100 described in this embodiment includes a display region 131. The display region 131 includes a plurality of pixels 130. One pixel 130 includes at least one light-emitting element 125.

The display device 100 described in this embodiment includes at least a substrate 111, a light-emitting element 125, an insulating film 114 having a function as a partition wall, an electrode 116, a protective film 103, an adhesive portion 120, and a substrate 121. The light-emitting element 125 is provided between the substrate 111 and the protective film 103.

In the display device 100, an insulating film 119 is formed over the substrate 111. The electrode 116 is formed over the insulating film 119. An insulating film 141 is formed over the insulating film 119 and the electrode 116. An electrode 115 is formed over the insulating film 141. The insulating film 114 having a function as a partition wall is formed over the electrode 115. An EL layer 117 is formed over the electrode 115 and the insulating film 114. An electrode 118 is formed over the EL layer 117. The protective film 103 is formed over the EL layer 117, the electrode 118, and the insulating film 114. In addition, the substrate 121 is provided over the light-emitting element 125 with the adhesive portion 120 therebetween. The protective film 103 is formed of a film with low moisture permeability. The protective film 103 has a function of a barrier film that prevents diffusion of water from the outside of the display device 100 into the EL layer 117. The protective film 103 also has a function as a barrier film that prevents diffusion of water from the components of the display device 100 into the EL layer 117.

Since the display device 100 described in this embodiment has a top-emission structure, light 151 emitted from the light-emitting element 125 is extracted from the substrate 121 side.

In the display device 100 described in this embodiment, the insulating film 141 has openings 128 and 132a that overlap with the electrode 116.

In the opening 128, the electrode 115 and the electrode 116 are electrically connected to each other. In the opening 132a, the external electrode 124a and the electrode 116 are electrically connected to each other through an anisotropic conductive connection portion 138a.

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

The substrates 111 and 121 are not limited to a certain type. Examples of the substrate include a semiconductor substrate (e.g., a single crystal substrate or a silicon substrate), an SOI substrate, a glass substrate, a quartz substrate, an organic resin substrate, a metal substrate, a flexible substrate, an attachment film, paper including a fibrous material, and a base material film. Other examples include an organic resin material, a glass material that is thin enough to be flexible, and a metal material (including an alloy material) that is thin enough to be flexible.

In the case where the display device 100 is a bottom-emission display device or a dual-emission display device, a material having a property of transmitting light emitted from the EL layer 117 is used for the substrate 111. In the case where the display device 100 is a top-emission display device or a dual-emission display device, a material having a property of transmitting light from the EL layer 117 is used for the substrate 121.

An organic resin material has a smaller specific gravity than a glass material or a metal material. Thus, the use of the organic resin material for the substrates 111 and 121 results in a lightweight display device.

The substrate 111 and/or the substrate 121 is/are preferably formed using a material with high toughness. In that case, a display device with high impact resistance that is unlikely to be broken can be obtained. An organic resin material and a metal material have higher toughness than the glass material in many cases. When the organic resin material or the metal material is used as the substrate 111 and/or the substrate 121, a display device that is unlikely to be broken can be provided as compared with the case of using the glass material.

The metal material has higher thermal conductivity than the organic resin material or the glass material and thus can easily conduct heat to the whole substrate. Accordingly, a local temperature rise in the display device can be suppressed.

Although there is no particular limitation on the metal material used for the substrate 111 and/or the substrate 121, for example, aluminum, copper, nickel, an alloy such as an aluminum alloy or stainless steel can be used.

When a material with high thermal emissivity is used for the substrate 111 and/or the substrate 121, the surface temperature of the display device can be prevented from rising, leading to prevention of breakage or a decrease in the reliability of the display device. For example, the substrate may have a stacked-layer structure of a film formed using the metal material (hereinafter referred to as a "metal layer") and a film formed using the material with high thermal emissivity (e.g., a metal oxide or a ceramic material).

A hard coating film (e.g., a silicon nitride film) by which a surface of the display device is protected from damage or the like, a film that can disperse pressure (e.g., an aramid resin film), or the like may be stacked over the substrate 111 and/or the substrate 121.

The substrate 111 and/or the substrate 121 may have a stacked-layer structure of a plurality of layers using the above-described materials. In the case of a structure including a film formed using a glass material (hereinafter referred to as a "glass film"), barrier properties of the display device against water and oxygen can be particularly improved, resulting in a highly reliable display device.

The thermal expansion coefficient of each of the substrates 111 and 121 is preferably less than or equal to 30 ppm/K, further preferably less than or equal to 10 ppm/K. On a surface of each of the substrates 111 and 121, a protective film having low moisture permeability may be formed in advance; examples of the protective film include a film containing nitrogen and silicon, such as a silicon nitride film or a silicon oxynitride film, and a film containing nitrogen and aluminum, such as an aluminum nitride film.

[Insulating films 119 and 141]

The insulating films 119 and 141 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating film 119 may have, for example, a two-layer structure of silicon oxide and silicon nitride or a five-layer structure in which materials selected from the above are combined. The insulating film 119 can be formed by a sputtering method, a CVD method, a thermal oxidation method, a coating method, a printing method, or the like.

The insulating film 119 can prevent or reduce diffusion of an impurity element from the substrate 111 or the like into the light-emitting element 125. The insulating film 119 is preferably formed using an insulating film with low moisture permeability. The water vapor transmittance of the insulating film with low moisture permeability is, for example, lower than or equal to $1 \times 10^{-5}$ g/(m$^2$·day), preferably lower than or equal to $1 \times 10^{-6}$ g/(m$^2$·day), further preferably lower than or equal to $1 \times 10^{-7}$ g/(m$^2$·day), still further preferably lower than or equal to $1 \times 10^{-8}$ g/(m$^2$·day).

Note that in this specification, a nitride oxide refers to a compound that contains more nitrogen than oxygen. An oxynitride refers to a compound that contains more oxygen than nitrogen. The content of each element can be measured by, for example, Rutherford backscattering spectrometry (RBS).

[Electrode 116]

The electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the conductive film, and a variety of formation methods such as an evaporation method, a CVD method, a sputtering method, and a spin coating method can be employed.

The electrode 116 can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrode 116 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, or the like can be used. Alternatively, a film, an alloy film, or a nitride film that contains aluminum and one or more elements selected from titanium, tantalum, tungsten, molybdenum, chromium, neodymium, and scandium may be used.

The electrode 116 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The electrode 116 can also be formed to have a single-layer structure or a stacked-layer structure using any of the materials.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a film in contact with the EL layer 117 may be a light-transmitting film, such as an indium tin oxide layer, having a higher work function than the EL layer 117 and a film having high reflectance (e.g., aluminum, an alloy containing aluminum, or silver) may be provided in contact with the film.

For the conductive material that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked in contact with an aluminum alloy film, oxidation of the aluminum alloy film can be prevented. Examples of the material for the metal film or the metal oxide film are titanium and titanium oxide. Alternatively, a stack of the conductive film that transmits visible light and a film containing any of the above metal materials may be used. For example, a stack of silver and indium tin oxide (ITO), a stack of an alloy of silver and magnesium and ITO, or the like can be used.

The display device having a top-emission structure is described as an example in this embodiment. In the case of a display device having a bottom-emission structure or a dual emission structure, the electrode 115 may be formed using a light-transmitting conductive material.

As a light-transmitting conductive material, for example, indium oxide, indium tin oxide, indium zinc oxide, zinc oxide, or zinc oxide to which gallium is added can be used. It is also possible to use a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) when the film is thin enough to have a light-transmitting property. Alternatively, a stack of any of the above materials can be used as the electrode 115. For example, a stacked film of ITO and an alloy of silver and magnesium is preferably used, in which case conductivity can be increased. Further alternatively, graphene or the like may be used.

[Insulating Film 114 Having Function as Partition Wall]

The insulating film 114 is provided in order to prevent an electrical short circuit between the adjacent electrodes 118. In the case of using a metal mask for formation of the EL layer 117 described later, the insulating film 114 has a function of preventing contact of the metal mask with a region where the light-emitting element 125 is formed. The insulating film 114 can be formed using an organic resin material such as an epoxy resin, an acrylic resin, or an imide resin, or an inorganic material such as silicon oxide. The insulating film 114 is preferably formed so that its sidewall has a tapered shape or a tilted surface with a continuous curvature. The sidewall of the insulating film 114 having the above-described shape enables favorable coverage with the EL layer 117 and the electrode 118 formed later. Note that in this specification, parts of a surface of the insulating film 114 that are not parallel to a surface of the substrate 111 are referred to as side surfaces of the insulating film 114.

[EL Layer 117]

A structure of the EL layer 117 is described in Embodiment 7.

[Electrode 118]

The electrode 118 is used as a cathode in this embodiment. The electrode 118 is preferably formed using a material that has a low work function and can inject electrons into the EL layer 117 described later. As well as a single layer of a metal having a low work function, a stack in which a metal material such as aluminum is formed over a several-nanometer-thick film, which is formed as a buffer film and formed using an alkali metal or an alkaline earth metal having a low work function, may be used as the electrode 118. As the buffer film, an oxide of an alkaline earth metal, a halide, a magnesium-silver alloy, or the like can also be used. Note that in the case where the display device has a bottom-emission structure, the efficiency of light extraction can be increased when the electrode 118 has reflectivity.

In the case where the display device has a top-emission structure or a dual-emission structure, the electrode 118 preferably transmits visible light when light emitted from the EL layer 117 is extracted through the electrode 118.

In the case where the display device has a bottom-emission structure and aluminum or an aluminum alloy is used as the electrode 118, a titanium film, a silver film, a magnesium-silver alloy film, or the like is preferably provided over aluminum or the aluminum alloy. This can prevent electrolytic corrosion caused by contact between aluminum or the aluminum alloy and an oxide semiconductor film that is the protective film 103 and can improve the yield of the display device.

[Protective Film 103]

The protective film 103 is formed of a film with low moisture permeability. The protective film 103 has a function of a barrier film that prevents diffusion of water from the outside of the display device 100 into the EL layer 117. The protective film 103 also has a function of a barrier film that prevents diffusion of water from the components of the display device 100 into the EL layer 117. Thus, deterioration of the light-emitting element 125 due to water can be prevented.

In this embodiment, an oxide semiconductor film formed using a Ga oxide, a Zn oxide, an In—Ga oxide, an In—Zn oxide, an M-Zn oxide (M is Al, Ga, Y, Zr, Sn, La, Ce, or Nd), an In-M-Zn oxide (M is Al, Ga, Y, Zr, Sn, La, Ce, or Nd), or the like can be used as the protective film 103.

The energy gap of the protective film 103 is 2 eV or more, preferably 2.5 eV or more, further preferably 3 eV or more. The protective film 103 transmits visible light because of its large energy gap.

The thickness of the protective film 103 is greater than or equal to 3 nm and less than or equal to 200 nm, preferably greater than or equal to 3 nm and less than or equal to 100 nm, further preferably greater than or equal to 3 nm and less than or equal to 50 nm. When the thickness of the protective film 103 is less than or equal to 100 nm, preferably less than or equal to 50 nm, the protective film 103 can function as a barrier film against water and reduce stress on the film. Thus, peeling of the protective film 103 due to an increase in the stress on the film can be prevented, so that the yield of the display device can be improved.

In the case where the protective film 103 is an In-M-Zn oxide (M is Al, Ga, Y, Zr, Sn, La, Ce, or Nd) film, the atomic ratio of metal elements included in a sputtering target used for forming the In-M-Zn oxide film preferably satisfies In M and Zn M. Preferable atomic ratios of In to M and Zn are 1:1:1, 1:1:1.2, 2:1:1.5, 2:1:2.3, 2:1:3, 3:1:2, 4:2:4.1, and the like. Note that the proportion of each metal element in the atomic ratio of the formed protective film 103 varies as an error within the range of ±40% of that in the above atomic ratio of the sputtering target.

When the atomic ratio of In to M and Zn in the target used for forming the protective film 103 is $x_2:y_2:z_2$, $x_2 \leq y_2$ and $x_2 \leq z_2$ are preferable, and $x_2 \leq y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a c-axis aligned crystalline oxide semiconductor (CAAC-OS) film to be described later is easily formed as the protective film 103. Typical examples of the atomic ratio of In to M and Zn in the target are 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, and 1:6:9.

Note that the proportion of each metal element in the atomic ratio of the protective film 103 varies as an error within the range of ±40% of that in the above atomic ratio of the target.

The atomic ratio is not limited to those described above and may be appropriately set in accordance with needed moisture permeability.

The protective film 103 may have, for example, a non-single-crystal structure. The non-single-crystal structure includes, for example, a CAAC-OS described later, a polycrystalline structure, a microcrystalline structure described later, and an amorphous structure. Water easily moves through a grain boundary. The protective film 103 preferably has an amorphous structure, in which case the moisture permeability of the protective film 103 can be further reduced because a crystal grain boundary is not included. The CAAC-OS includes a plurality of c-axis aligned crystal parts, and metal atoms are arranged in a layered manner in the crystal part. Boundaries between the plurality of crystal parts, that is, grain boundaries are not easily found. Thus, a CAAC-OS film is preferably formed as the protective film 103, in which case the permeability of the protective film 103 can be further reduced.

Note that the protective film 103 may be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure. Furthermore, in some cases, the mixed film has a stacked-layer structure including, for example, two or more of a region having an amorphous structure, a region having a microcrystalline structure, a region having a polycrystalline structure, a CAAC-OS region, and a region having a single-crystal structure.

In the case where the insulating film 114 is formed using an organic resin material such as an epoxy resin, an acrylic resin, or an imide resin, water inside and outside the display device 100 (e.g., water included in the adhesive portion 120 and water included in the outside air) is diffused into the insulating film 114. Since the EL layer 117 included in the light-emitting element 125 is in contact with the insulating film 114, water is diffused into the EL layer 117 in the light-emitting element 125 through the insulating film 114, resulting in reduced luminance of the light-emitting element 125. In view of the above, the protective film 103 is provided so as to cover an exposed portion of the EL layer 117, an exposed portion of the insulating film 114, and an exposed portion of the electrode 118, so that water inside and outside the display device 100 can be prevented from being diffused into the EL layer 117. As a result, a partial decrease in the luminance of the display device 100 can be prevented. In addition, formation of a non-light-emitting region in the display device 100 can be prevented.

[Adhesive Portion 120]

A light curable adhesive, a reaction curable adhesive, a thermosetting adhesive, or an anaerobic adhesive can be used as the adhesive portion 120. For example, an epoxy resin, an acrylic resin, a silicone resin, a phenol resin, an imide resin, a poly(vinyl chloride) (PVC) resin, a poly(vinyl butyral) (PVB) resin, or an ethylene-vinyl acetate (EVA) resin can be used. In particular, a material with low moisture permeability, such as an epoxy resin, is preferable. Alternatively, a two-component-mixture-type resin may be used. Further alternatively, an adhesive sheet or the like may be used.

A drying agent may be contained in the adhesive portion 120. Particularly in the case where the display device 100 has a top-emission structure or a dual-emission structure, a drying agent having a size less than or equal to the wavelength of light (a substance that adsorbs moisture by chemical adsorption (e.g., an oxide of an alkaline earth metal, such as calcium oxide or barium oxide) or a substance that adsorbs moisture by physical adsorption, such as zeolite or silica gel) or a filler with a high refractive index (e.g., titanium oxide or zirconium) is preferably mixed into the adhesive portion 120, in which case the efficiency of extraction of light emitted from the EL layer 117 is difficult to decrease, entry of impurities such as moisture into a display element can be prevented, and the reliability of the display device 100 can be improved.

[Anisotropic Conductive Connection Portion 138a]

The anisotropic conductive connection portion 138a can be formed using any of various anisotropic conductive films (ACF), anisotropic conductive pastes (ACP), and the like.

The anisotropic conductive connection portion 138a is formed by curing a paste-form or sheet-form material that is obtained by mixing conductive particles with a thermosetting resin or a thermosetting and photocurable resin. The anisotropic conductive connection portion 138a exhibits an anisotropic conductive property by light irradiation or thermocompression bonding. As the conductive particles used for the anisotropic conductive connection portion 138a, for example, particles of a spherical organic resin coated with a thin-film metal such as Au, Ni, or Co can be used.

Figure 2A:
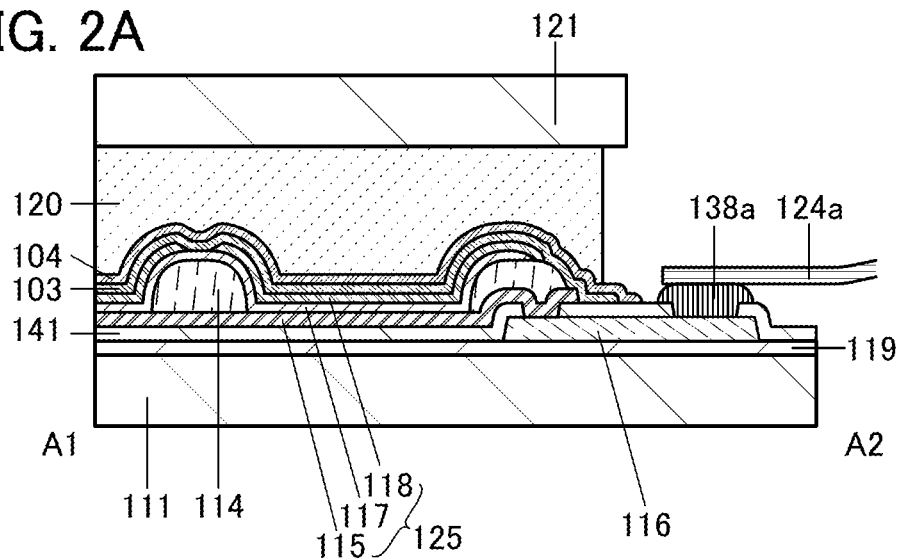
FIGS. 2A and 2B are cross-sectional views illustrating one embodiment of the present invention.
Figure 2B:
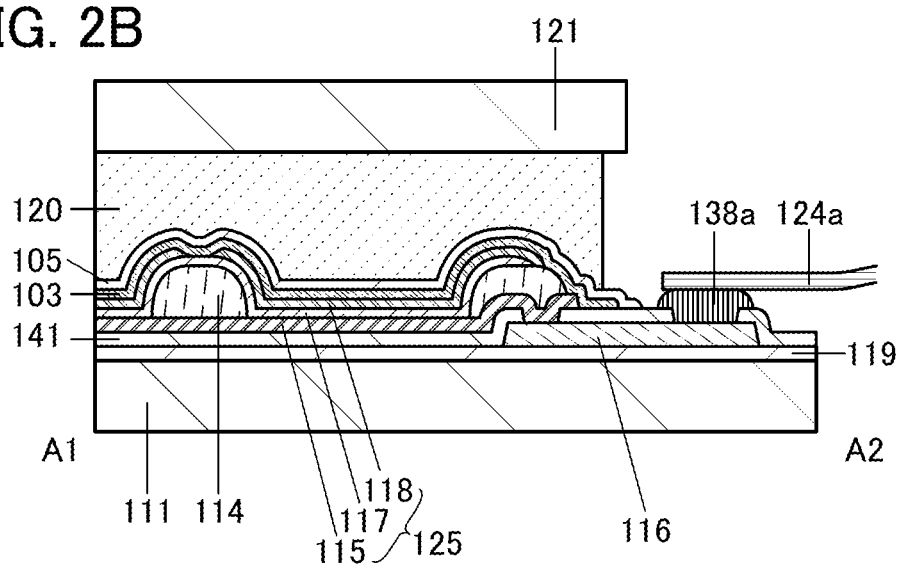

Next, a display device having a structure different from the structure illustrated in FIG. 1B is described with reference to FIGS. 2A and 2B. FIGS. 2A and 2B are cross-sectional views of the display device 100.

As illustrated in FIG. 2A, the display device 100 may include a conductive film 104 over the protective film 103 covering the exposed portions of the EL layer 117, the electrode 118, and the insulating film 114.

The conductive film 104 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, or indium tin oxide containing silicon oxide. When the conductive film 104 has a light-transmitting property, the efficiency of extraction of light emitted from the light-emitting element 125 can be increased.

The conductive film 104 is preferably formed using a material with high wettability with respect to the material for the adhesive portion 120. As a result, the wettability with respect to the material for the adhesive portion 120 is high and the adhesive strength between the substrate 111 and the substrate 121 can be increased at the time of bonding the substrate 111 and the substrate 121 together, so that the yield of the display device can be improved.

In addition, when the conductive film 104 is formed using the light-transmitting conductive material, the protective film 103 and the conductive film 104 prevent diffusion of water included in the adhesive portion 120. This can prevent diffusion of water inside and outside the display device 100 into the EL layer 117. As a result, a partial decrease in the luminance of the display device 100 can be prevented. In addition, formation of a non-light-emitting region in the display device 100 can be prevented.

Alternatively, as illustrated in FIG. 2B, the display device 100 may include the protective film 103 covering exposed portions of the EL layer 117, the electrode 118, and the insulating film 114, and an insulating film 105 over the protective film 103.

The insulating film 105 can be formed using an insulating film having a blocking effect against oxygen, hydrogen, water, and the like. The insulating film having a blocking effect against oxygen, hydrogen, water, and the like can be formed using aluminum oxide, aluminum oxynitride, gallium oxide, gallium oxynitride, yttrium oxide, yttrium oxynitride, hafnium oxide, hafnium oxynitride, silicon nitride, silicon nitride oxide, and the like.

The thickness of the insulating film 105 is greater than or equal to 3 nm and less than or equal to 200 nm, preferably greater than or equal to 3 nm and less than or equal to 100 nm, further preferably greater than or equal to 3 nm and less than or equal to 50 nm.

In addition, when the insulating film 105 is formed using the insulating film having a blocking effect against oxygen, hydrogen, water, and the like, the protective film 103 and the insulating film 105 prevent diffusion of water included in the adhesive portion 120. This can prevent diffusion of water inside and outside the display device 100 into the EL layer 117. As a result, a partial decrease in the luminance of the display device 100 can be prevented. In addition, formation of a non-light-emitting region in the display device 100 can be prevented.

Since the protective film 103 is included in the display device 100, the thickness of the insulating film 105 can be reduced. Thus, the stress on the insulating film 105 can be reduced and peeling of the insulating film 105 due to an increase in the stress on the film can be prevented, so that the yield of the display device can be improved.

<Structure 2 of Display Device>

Figure 3A:
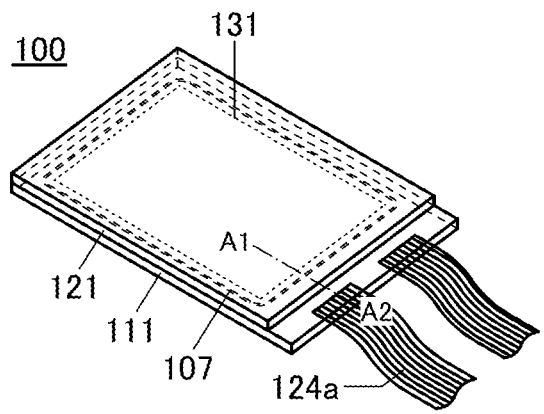
FIGS. 3A and 3B are a perspective view and a cross-sectional view illustrating one embodiment of the present invention.
Figure 3B:
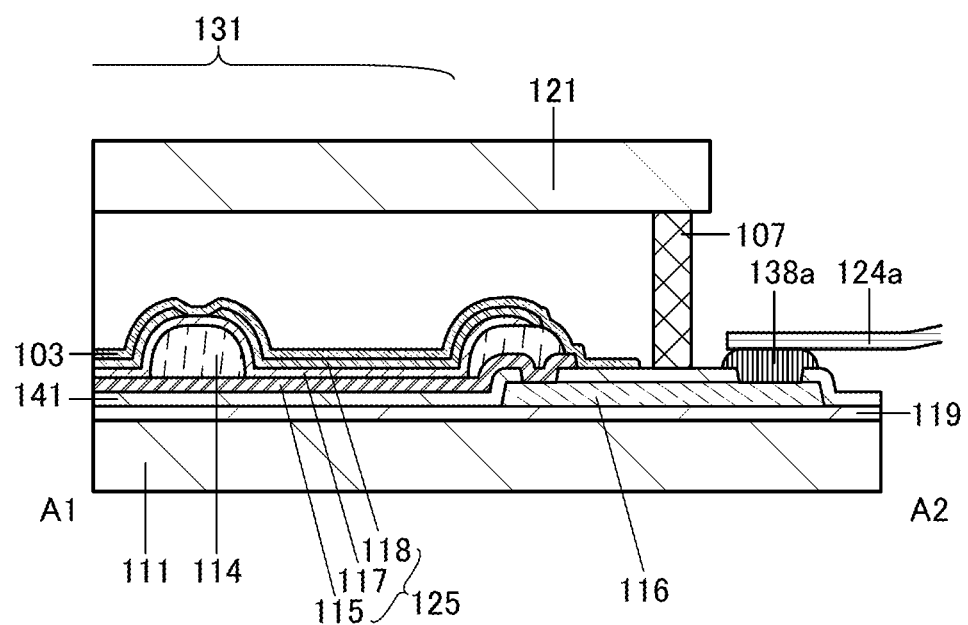

FIG. 3A is a perspective view of the display device 100. FIG. 3B is a cross-sectional view taken along dashed-dotted line A1-A2 in FIG. 3A. The display device 100 described in this embodiment includes the display region 131. In addition, a sealant 107 with a closed-loop shape is provided outside the display region 131.

The display device 100 illustrated in FIGS. 3A and 3B differs from the display devices illustrated in FIGS. 1A and 1B and FIGS. 2A and 2B in that the substrate 111 and the substrate 121 are firmly attached to each other with the sealant 107. A region surrounded by the substrate 111, the substrate 121, and the sealant 107 (also referred to as a sealed region) in the display device 100 has a hollow structure. The sealed region may be filled with an inert gas such as a rare gas or a nitrogen gas. Alternatively, the sealed region can have a reduced-pressure atmosphere. As a result, water or the like in the sealed region can be reduced, so that the reliability of the light-emitting element 125 can be improved.

The display device 100 includes the protective film 103 in contact with the EL layer 117, the electrode 118, and the insulating film 114. Note that the protective film 103 covers exposed portions of the EL layer 117 and the electrode 118. In addition, the protective film 103 also covers an exposed portion of the insulating film 114, typically, a side surface of the insulating film 114.

[Sealant 107]

As the sealant 107, an organic resin such as a thermosetting resin or a photocurable resin, low-melting-point glass (also referred to as fritted glass), or the like can be used. A drying agent may be contained in the sealant 107. For example, a substance that adsorbs moisture by chemical adsorption, such as an oxide of an alkaline-earth metal (e.g., calcium oxide or barium oxide) can be dispersed in the sealant 107. Alternatively, a substance that adsorbs moisture by physical adsorption, such as zeolite or silica gel, may be used as the drying agent. The sealant 107 preferably contains a drying agent, in which case water or the like in the sealed region is reduced and the reliability of the light-emitting element 125 is improved. The use of low-melting-point glass as the sealant 107 can prevent diffusion of water outside the display device 100 into the EL layer 117. As a result, a partial decrease in the luminance of the display device 100 can be prevented. In addition, formation of a non-light-emitting region in the display device 100 can be prevented.

In the display device 100 illustrated in FIGS. 3A and 3B, an adhesive portion is not included in the display region 131. Thus, a reduction in the luminance of the light-emitting element 125 can be suppressed. In addition, application of stress on the light-emitting element 125 due to a reduction in volume caused by curing of a material for an adhesive portion does not occur. Moreover, breakage of the light-emitting element 125 due to the stress does not occur. Consequently, a reduction in the yield of the display device can be prevented.

Figure 4A:
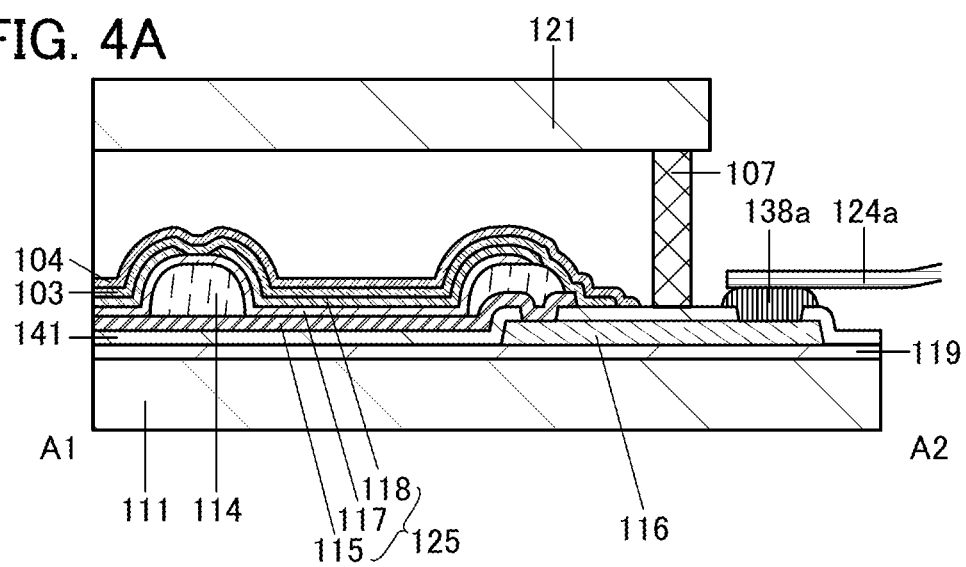
FIGS. 4A and 4B are cross-sectional views illustrating one embodiment of the present invention.
Figure 4B:
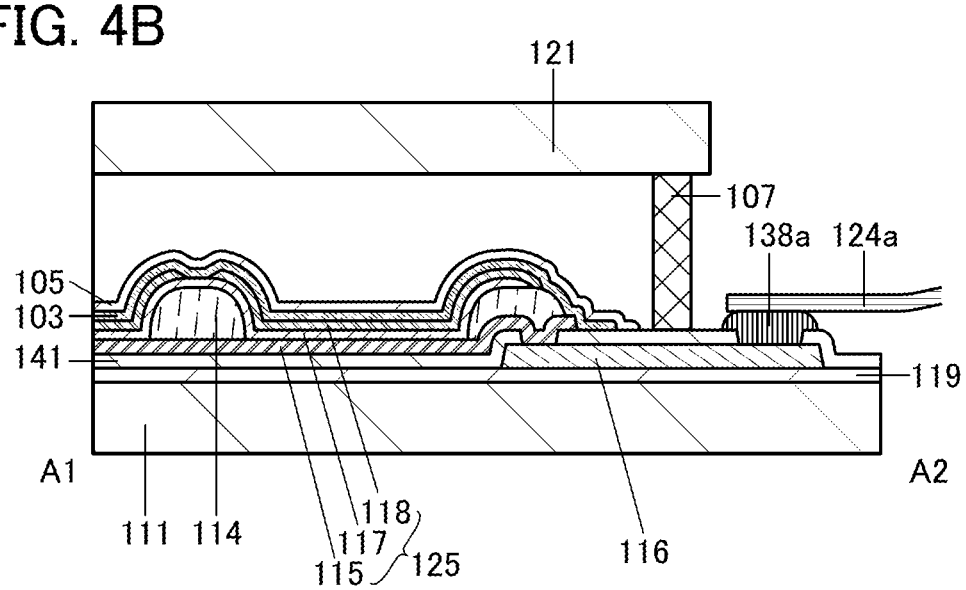

Next, display devices each having a structure different from the structure illustrated in FIG. 3B are described with reference to FIGS. 4A and 4B. FIGS. 4A and 4B are each a cross-sectional view of the display device 100.

As illustrated in FIG. 4A, the display device 100 may include the conductive film 104 over the protective film 103 covering exposed portions of the insulating film 114, the EL layer 117, and the electrode 118.

Alternatively, as illustrated in FIG. 4B, the display device 100 may include the protective film 103 covering exposed portions of the insulating film 114, the EL layer 117, and the electrode 118, and the insulating film 105 over the protective film 103.

<Structure 3 of Display Device>

Figure 5A:
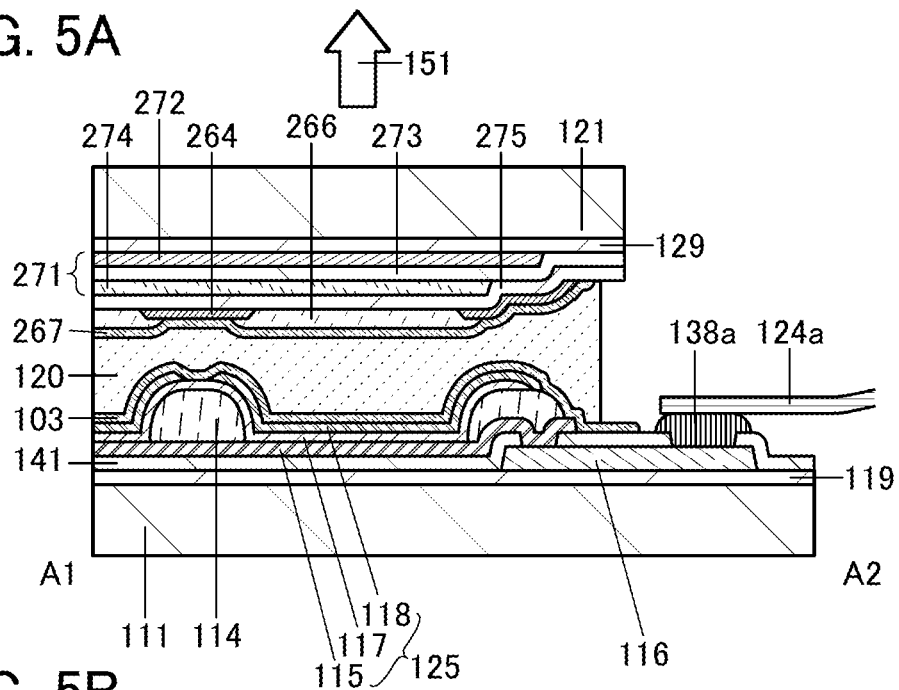
FIGS. 5A and 5B are cross-sectional views illustrating one embodiment of the present invention.
Figure 5B:
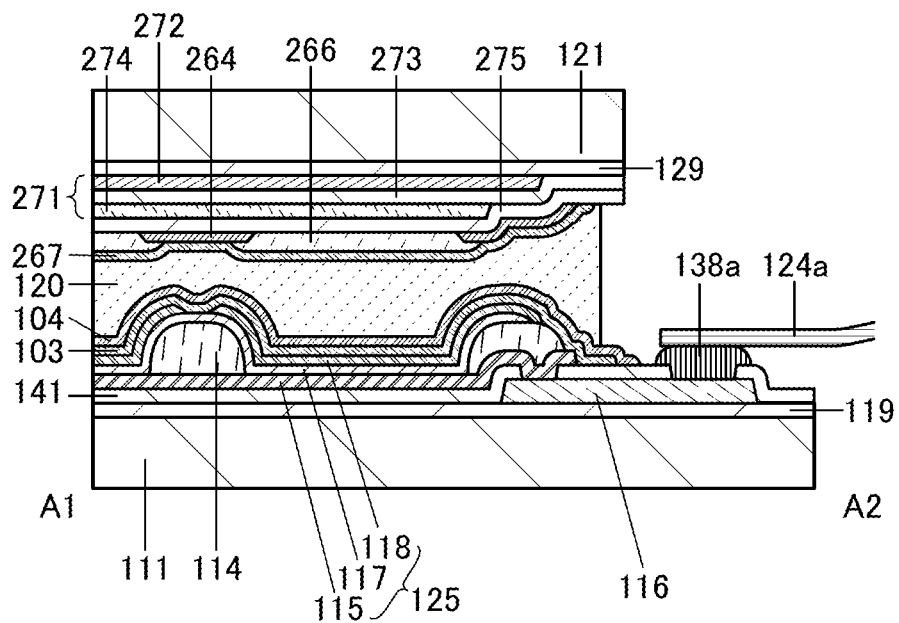

The display device 100 described in this embodiment may include a coloring film on the substrate 121 side. The display device 100 described in this embodiment may include a touch sensor on the substrate 121 side. FIGS. 5A and 5B and FIG. 6 are each a cross-sectional view of the display device 100 that includes the coloring film and the touch sensor on the substrate 121 side.

As illustrated in FIG. 5A, the display device 100 described in this embodiment includes, over the substrate 101, the insulating film 114, the electrode 116, the insulating film 119, the insulating film 141, the light-emitting element 125, and the protective film 103 as in FIG. 1B. The substrate 121 is provided over the light-emitting element 125 with the adhesive portion 120 therebetween. The substrate 121 is provided with an insulating film 129, a touch sensor 271, an insulating film 275, a light-blocking film 264, a coloring film 266, and a protective film 267. In this embodiment, for example, a capacitive touch sensor is used as the touch sensor 271. The touch sensor 271 includes an electrode 272, an insulating film 273, and an electrode 274. The protective film 267 has a function as a barrier film that prevents diffusion of water from the light-blocking film 264 and the coloring film 266 into the EL layer 117. The protective film 267 has low moisture permeability like the protective film 103. The protective film 267 can be formed as appropriate using the material and the method for the protective film 103.

The protective film 267 has a function as a barrier film that prevents diffusion of water from the light-blocking film 264 and the coloring film 266 into the EL layer 117. Thus, deterioration of the light-emitting element 125 due to water contained in the light-blocking film 264 and the coloring film 266 can be prevented.

The display device 100 also includes the protective film 103 in contact with the insulating film 114, the EL layer 117, and the electrode 118. Note that the protective film 103 covers exposed portions of the EL layer 117 and the electrode 118. The protective film 103 also covers an exposed portion of the insulating film 114, typically, a side surface of the insulating film 114.

Since the display device 100 described in this embodiment has a top-emission structure, the light 151 emitted from the light-emitting element 125 is extracted from the substrate 121 side. The light 151 (e.g., white light) emitted from the EL layer 117 is partly absorbed when transmitted through the coloring film 266 and is converted into light of a specific color. In other words, the coloring film 266 transmits light with a specific spectrum (wavelength range). The coloring film 266 can function as an optical filter film for converting the light 151 into light of a different color.

Note that in the case where the EL layer 117 is provided by what is called side-by-side patterning in which the colors of the lights 151 emitted from different pixels are different, the coloring film 266 may be provided or is not necessarily provided.

When the light-blocking film 264 or the coloring film 266 is not provided, the manufacturing cost of the display device 100 can be reduced or the yield of the display device 100 can be improved. Moreover, the light 151 can be emitted efficiently when the coloring film 266 is not provided; thus, an increase in luminance, a reduction in power consumption, and the like can be achieved.

On the other hand, when the light-blocking film 264 and the coloring film 266 are provided, reflection of external light is suppressed, so that a contrast ratio, color reproducibility, or the like can be improved.

In the case where the display device 100 has a bottom-emission structure, the touch sensor 271, the light-blocking film 264, and the coloring film 266 may be provided on the substrate 111 side.

In the case where the display device 100 has a dual-emission structure, the touch sensor 271, the light-blocking film 264, and the coloring film 266 may be provided on one or both of the substrate 111 side and the substrate 121 side. The touch sensor 271 and the coloring film 266 may be provided on the different substrate sides.

The display devices 100 each having a structure different from the structure illustrated in FIG. 5A are described with reference to FIG. 5B and FIG. 6.

As illustrated in FIG. 5B, the display device may include the conductive film 104 over the protective film 103.

As illustrated in FIG. 6, the display device 100 may include the protective film 103 covering exposed portions of the insulating film 114, the EL layer 117, and the electrode 118, and the insulating film 105 over the protective film 103.

[Example of Pixel Configuration]

Figure 7A:
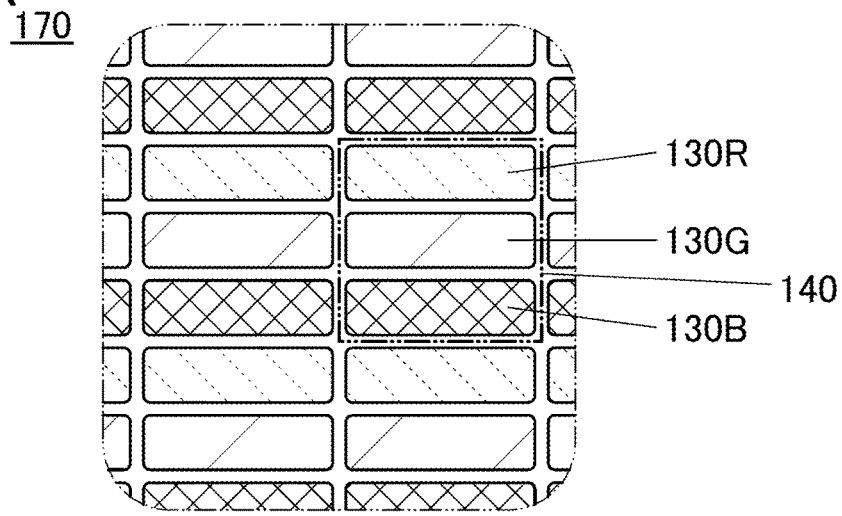
FIGS. 7A to 7C each illustrate an example of a pixel configuration.
Figure 7B:
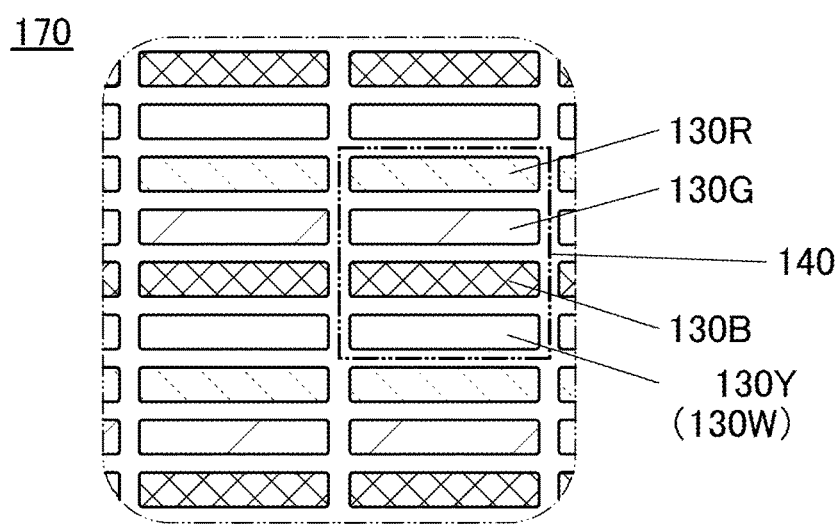
Figure 7C:
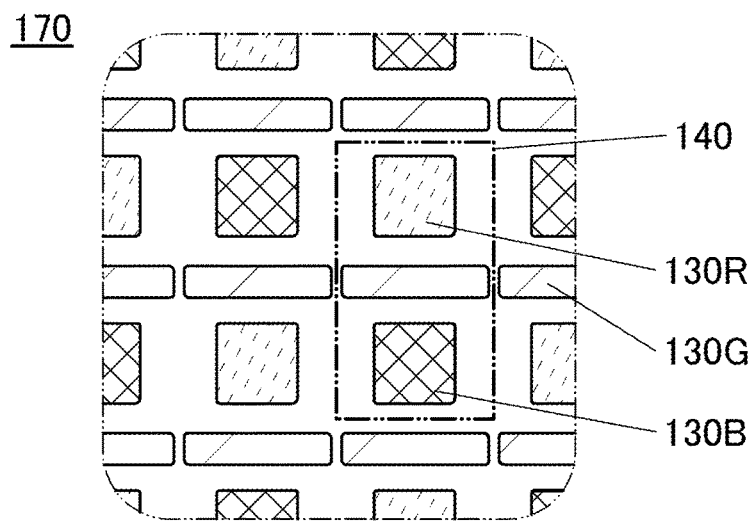
Figure 10:
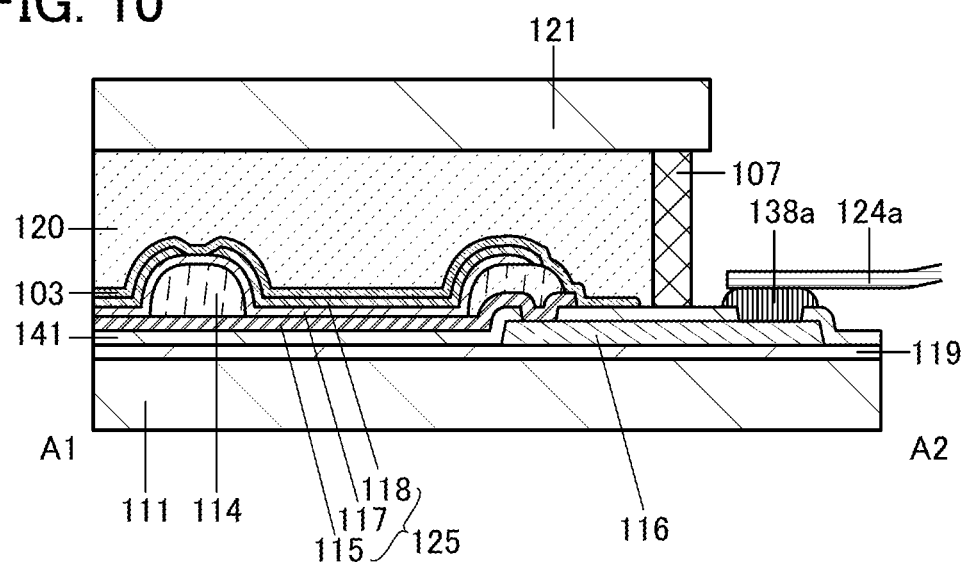
FIG. 10 is a cross-sectional view illustrating one embodiment of the present invention.

Here, examples of a pixel configuration for achieving color display are described with reference to FIGS. 7A to 7C. FIGS. 7A to 7C are enlarged plan views of a region 170 in the display region 131 in FIG. 1A.

Figure 15A:
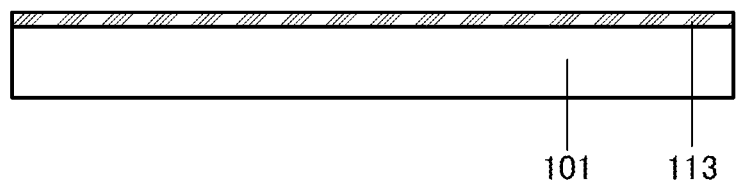
FIGS. 15A to 15D illustrate a manufacturing process of one embodiment of the present invention.

For example, as illustrated in FIG. 7A, three pixels 130 may function as subpixels and may be collectively used as one pixel 140. Full color display can be achieved in such a manner that the red, green, and blue coloring films 266 are used so as to correspond to the three pixels 130. In FIG. 15A, the pixel 130 emitting red light, the pixel 130 emitting green light, and the pixel 130 emitting blue light are illustrated as a pixel 130R, a pixel 130G, and a pixel 130B, respectively. Note that the colors of the coloring films 266 may be colors other than red, green, and blue; for example, the coloring film 266 may be yellow, cyan, magenta, or the like.

As illustrated in FIG. 7B, four pixels 130 may function as subpixels and may be collectively used as one pixel 140. For example, the coloring films 266 corresponding to the four pixels 130 may be red, green, blue, and yellow. In FIG. 7B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the color reproducibility can be particularly improved. Thus, the display quality of the display device can be improved. With the pixel 130 emitting yellow light (a pixel 130Y), the luminance of the display region can be increased. Accordingly, the power consumption of the display device can be reduced.

Alternatively, the coloring films 266 corresponding to the four pixels 130 may be red, green, blue, and white (see FIG. 7B). With the pixel 130 emitting white light (a pixel 130W), the luminance of the display region can be increased. Accordingly, the power consumption of the display device can be reduced.

Note that in the case where the pixel 130 emitting white light is provided, the coloring film 266 corresponding to the pixel 130W is not necessarily provided. When the white coloring film 266 is not provided, a reduction in luminance at the time of transmission of light through the coloring film 266 does not occur, so that the luminance of the display region can be increased. Accordingly, the power consumption of the display device can be reduced. On the other hand, the color temperature of white light can be controlled when the white coloring film 266 is provided. Thus, the display quality of the display device can be improved. Depending on the intended use of the display device, each pixel 130 may function as a subpixel and two pixels 130 may be collectively used as one pixel 140.

Note that the occupation areas or shapes of the pixels 130 may be the same or different. In addition, arrangement is not limited to stripe arrangement. For example, delta arrangement, Bayer arrangement, PenTile arrangement, or the like can be used. FIG. 7C illustrates an example of PenTile arrangement.

<Structure 4 of Display Device>

The display device 100 illustrated in FIG. 8A differs from the display devices illustrated in FIGS. 5A and 5B and FIG. 6 in that the substrate 111 and the substrate 121 are firmly attached to each other with the sealant 107. A sealed region surrounded by the substrate 111, the substrate 121, and the sealant 107 in the display device 100 has a hollow structure. The sealed region may be filled with an inert gas such as a rare gas or a nitrogen gas. Alternatively, the sealed region can have a reduced-pressure atmosphere. As a result, water or the like in the sealed region can be reduced, so that the reliability of the light-emitting element 125 can be improved.

Next, display devices having structures different from the structure illustrated in FIG. 8A are described with reference to FIG. 8B and FIG. 9.

As illustrated in FIG. 8B, the display device 100 may include the conductive film 104 over the protective film 103 covering exposed portions of the insulating film 114, the EL layer 117, and the electrode 118.

As illustrated in FIG. 9, the display device 100 may include the protective film 103 covering exposed portions of the insulating film 114, the EL layer 117, and the electrode 118, and the insulating film 105 over the protective film 103.

<Structure 5 of Display Device>

In the display device 100 described in this embodiment, the substrate 111 and the substrate 121 may be firmly attached to each other with the adhesive portion 120 and the sealant 107. In the display device 100 illustrated in FIG. 10, the substrate 111 and the substrate 121 are firmly attached to each other with the adhesive portion 120 and the sealant 107.

Since the substrate 111 and the substrate 121 are firmly attached to each other with the adhesive portion 120 and the sealant 107, the adhesive strength between the substrate 111 and the substrate 121 can be increased, so that the yield of the display device can be improved. When low-melting-point glass is used as the sealant 107 or when a drying agent is contained in the sealant 107, diffusion of water outside the display device 100 into the EL layer 117 can be prevented. As a result, a partial decrease in the luminance of the display device 100 can be prevented. In addition, formation of a non-light-emitting region in the display device 100 can be prevented.

<Structure 6 of Display Device>

In the display device 100 described in this embodiment, a flexible substrate may be used instead of the substrate 111. In the display device 100 described in this embodiment, a flexible substrate may be used instead of the substrate 121. In the display device 100 illustrated in FIG. 11A, a flexible substrate 111a is firmly attached to the insulating film 119 with an adhesive portion 112. In addition, a flexible substrate 121a is firmly attached to the protective film 103 with the adhesive portion 120. The display device 100 illustrated in FIG. 11B includes the insulating film 129, the touch sensor 271, the insulating film 275, the light-blocking film 264, the coloring film 266, and the protective film 267, which are provided on the flexible substrate 121a side. In addition, the flexible substrate 121a is firmly attached to the insulating film 129 with an adhesive portion 122.

[Flexible Substrates 111a and 121a]

The thickness of each of the flexible substrates 111a and 121a is preferably greater than or equal to 10 μm and less than or equal to 200 μm, further preferably greater than or equal to 20 μm and less than or equal to 50 μm. This enables a display device that is flexible, has high impact resistance, and is unlikely to be broken to be manufactured.

Examples of the flexible substrates 111a and 121a include an organic resin substrate, a metal substrate, a flexible substrate, an attachment film, paper including a fibrous material, a base material film, and a structure in which a fibrous body is impregnated with an organic resin (also called prepreg).

In the case where the display device 100 has a bottom-emission structure or a dual-emission structure, a material having a property of transmitting light emitted from the EL layer 117 is used for the substrate 111a. In the case where the display device 100 has a top-emission structure or a dual-emission structure, a material having a property of transmitting light emitted from the EL layer 117 is used for the substrate 121a.

As a material that has flexibility and transmits visible light, which can be used for the flexible substrates 111a and 121a, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a cycloolefin resin, a polystyrene resin, a poly(amide imide) resin, a polypropylene resin, a polyester resin, a vinyl resin, an aramid resin, an epoxy resin, or the like. Alternatively, a mixture or a stack including any of these materials may be used. Note that the same material or different materials may be used for the flexible substrates 111a and 121a.

The use of an organic resin material for the flexible substrates 111a and 121a results in a lightweight display device. In addition, the use of an organic resin material for the flexible substrates 111a and 121a can achieve a display device that is less likely to be broken than a display device using a glass material.

The flexible substrates 111a and 121a may have a structure in which a plurality of materials are stacked. For example, a flexible substrate in which a glass film, an adhesive portion, and a film formed using an organic resin material (hereinafter referred to as an "organic resin film") are stacked in this order over the light-emitting element can be used. The thickness of the glass film is greater than or equal to 20 μm and less than or equal to 200 μm, preferably greater than or equal to 25 μm and less than or equal to 100 μm. With such a thickness, the glass film can have both a high barrier property against water and oxygen and high flexibility. The thickness of the organic resin film is greater than or equal to 10 μm and less than or equal to 200 μm, preferably greater than or equal to 20 μm and less than or equal to 50 μm. With such an organic resin film provided outside the glass film, breakage or a crack of the glass film can be inhibited, resulting in increased mechanical strength of the display device. With the substrate using a composite layer of the glass film and the organic resin film, a highly reliable flexible display device can be achieved.

Figure 11A:
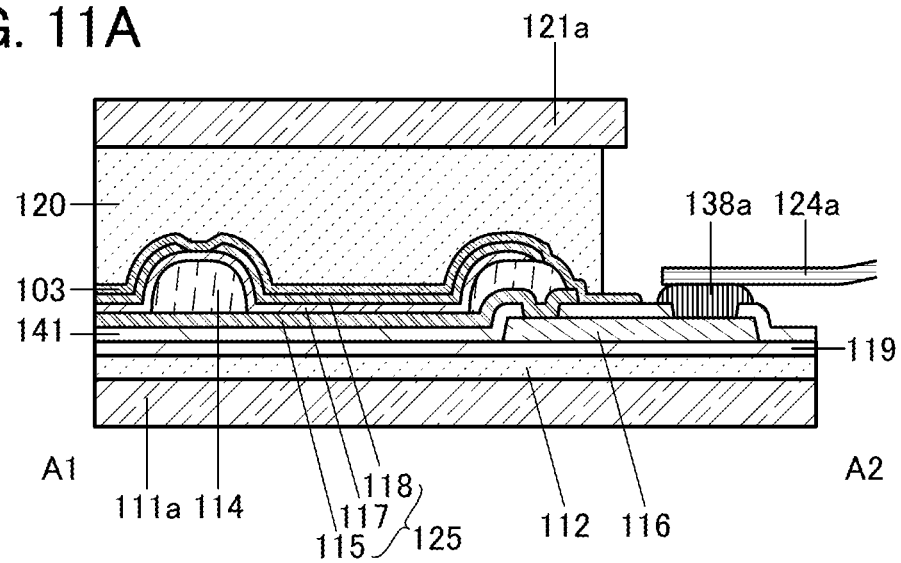
FIGS. 11A and 11B are cross-sectional views illustrating one embodiment of the present invention.
Figure 11B:
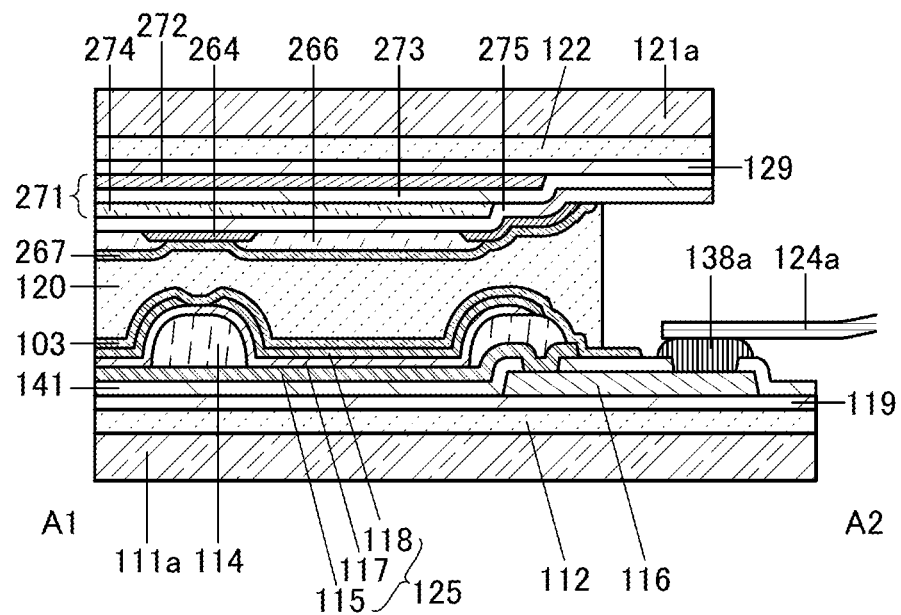

In the display device 100, a film with low moisture permeability, such as the protective film 103, can be formed instead of an insulating film between the flexible substrate 111a and the electrode 115, for example, the insulating film 119 and the insulating film 141 illustrated in FIGS. 11A and 11B.

In addition, in the display device 100, a film with low moisture permeability, such as the protective film 103, can be formed instead of an insulating film provided for the flexible substrate 121a, for example, the insulating film 129, the insulating film 273, and the insulating film 275 illustrated in FIG. 11B.

When the thickness of the film with low moisture permeability is less than or equal to 100 nm, preferably less than or equal to 50 nm, the film can function as a barrier film against water and stress on the film can be reduced. Thus, peeling of the film with low moisture permeability due to an increase in the stress on the film can be prevented, so that the yield of the display device can be improved. In addition, resistance to bending is increased and occurrence of a crack in the display device can be inhibited, so that the yield of the display device can be improved.

<Method 1 for Manufacturing Display Device>

Next, a method for manufacturing the display device 100 is described with reference to FIGS. 12A to 12E, FIGS. 13A to 13C, FIGS. 14A to 14E, FIGS. 15A to 15D, and FIGS. 16A to 16C. FIGS. 12A to 12E, FIGS. 13A to 13C, FIGS. 14A to 14E, FIGS. 15A to 15D, and FIGS. 16A to 16C are cross-sectional views taken along dashed-dotted line A1-A2 in FIGS. 1A and 1B. First, a method for forming the substrate 111 provided with an element layer including a light-emitting element is described.

[Formation of Insulating Film 119]

The insulating film 119 is formed over the substrate 111. The insulating film 119 can prevent or reduce diffusion of impurity elements from the substrate 101 or the like. The thickness of the insulating film 119 is preferably greater than or equal to 30 nm and less than or equal to 2 μm, further preferably greater than or equal to 50 nm and less than or equal to 1 μm. In this embodiment, the insulating film 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film in this order over the substrate 101 by a plasma CVD method.

[Formation of Electrode 116]

Figure 12A:
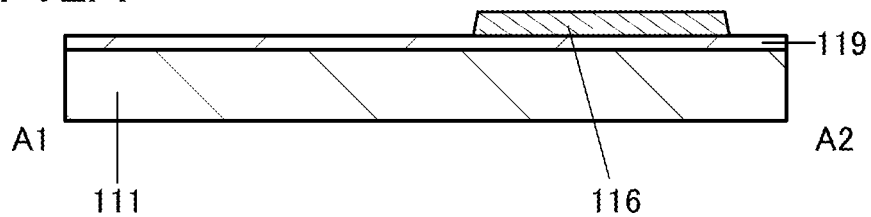
FIGS. 12A to 12E illustrate a manufacturing process of one embodiment of the present invention.

Next, the electrode 116 is formed over the insulating film 119 (see FIG. 12A). First, a three-layer metal film in which aluminum is interposed between two layers of molybdenum is formed by a sputtering method. After that, a resist mask is formed over the metal film, and the metal film is etched into a desired shape with the use of the resist mask. In the above-described manner, the electrode 116 can be formed. The resist mask can be formed by a lithography method, a printing method, an inkjet method, or the like as appropriate. Formation of the resist mask by an inkjet method needs no photomask; thus, manufacturing cost can be reduced.

The metal film may be etched by either a dry etching method or a wet etching method, or by both a dry etching method and a wet etching method. After the etching treatment, the resist mask is removed.

When the electrode 116 has a taper-shaped end portion, the coverage with a film that covers side surfaces of the electrode 116 can be improved. Specifically, the end portion has a taper angle θ of 80° or less, preferably 60° or less, further preferably 45° or less. Note that the "taper angle" refers to an inclination angle formed by the side surface and a bottom surface of the electrode 116. A taper angle smaller than 90° is called forward tapered angle and a taper angle of larger than or equal to 90° is called inverse tapered angle.

When the cross section of the end portion of the electrode 116 has a step-like shape including a plurality of steps, the coverage with a film that covers the electrode 116 can be improved. The above description is not limited to the electrode 116. When the end portion of each film has a forward taper shape or a step-like shape in its cross section, a phenomenon that a layer formed to cover the end portion is cut (disconnection) at the end portion can be prevented, so that the coverage becomes favorable.

[Formation of Insulating Film 141]

Figure 12B:
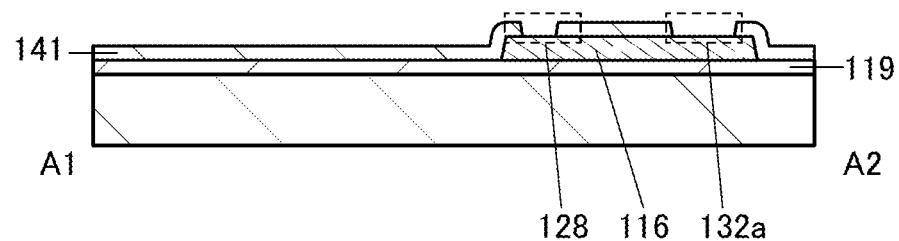

Next, the insulating film 141 having the openings 128 and 132a is formed over the insulating film 119 and the electrode 116 (see FIG. 12B). First, an insulating film formed of silicon oxynitride is formed by a plasma CVD method.

Next, a resist mask is formed over the insulating film, and part of the insulating film 127 overlapping with the electrode 116 is selectively removed using the resist mask, so that the insulating film 141 having the openings 128 and 132a is formed. Note that the insulating film may be etched by either a dry etching method or a wet etching method, or by both a dry etching method and a wet etching method.

[Formation of Electrode 115]

Figure 12C:
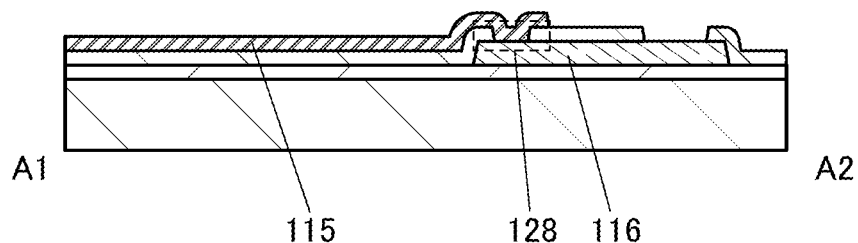

Next, the electrode 115 is formed over the insulating film 141 (see FIG. 12C). The electrode 115 can be formed using a material and a method that are similar to those of the electrode 116. Here, a metal film to be the electrode 115 is formed by a sputtering method. Then, a resist mask is formed over the metal film, and part of the metal film is selectively removed using the resist mask, so that the electrode 115 is formed. The metal film may be etched by either a dry etching method or a wet etching method, or by both a dry etching method and a wet etching method. In this embodiment, the electrode 115 and the electrode 116 are electrically connected to each other in the opening 128.

[Formation of Insulating Film 114]

Figure 12D:
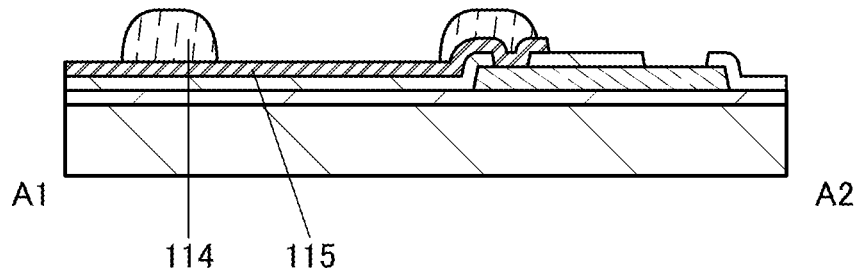
Figure 12E:
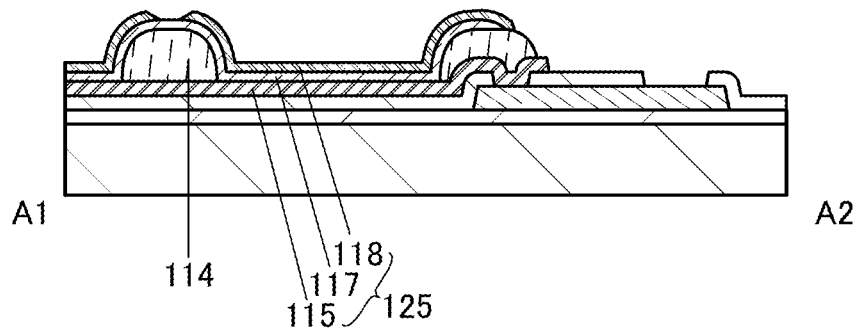

Next, the insulating film 114 is formed (see FIG. 12D). In this embodiment, the insulating film 114 is formed in such a manner that a photosensitive organic resin material is applied by a coating method and processed into a desired shape. In this embodiment, the insulating film 114 is formed using a photosensitive polyimide resin.

[Formation of EL Layer]

Next, the EL layer 117 is formed over the electrode 115 and the insulating film 114.

[Formation of Electrode 118]

Next, the electrode 118 is formed over the EL layer 117. In this embodiment, an alloy of magnesium and silver is used for the electrode 118. The electrode 118 can be formed by an evaporation method, a sputtering method, or the like (see FIG. 12E).

[Formation of Protective Film 103]

Figure 13A:
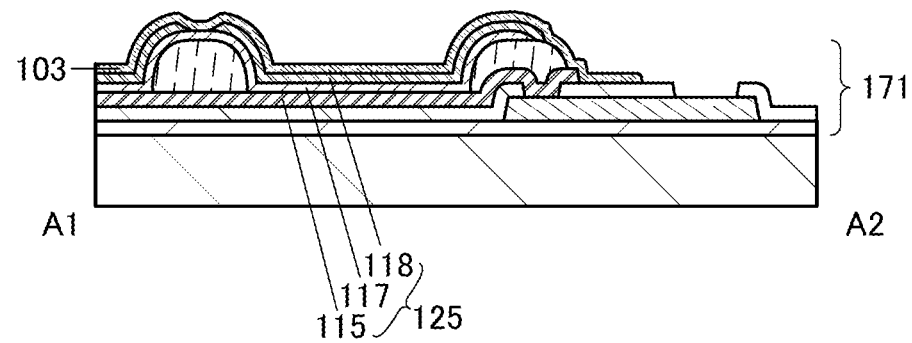
FIGS. 13A to 13C illustrate a manufacturing process of one embodiment of the present invention.

Next, the protective film 103 is formed over the insulating film 114, the EL layer 117, and the electrode 118 (see FIG. 13A). Thus, the protective film 103 that covers exposed portions of the insulating film 114, the EL layer 117, and the electrode 118 can be formed. In this embodiment, as the protective film 103, an oxide semiconductor film is formed by a sputtering method using an In—Ga—Zn oxide with an atomic ratio of In to Ga and Zn of 1:4:5 (In:Ga:Zn=1:4:5) as a sputtering target.

The protective film 103 can be formed by a sputtering method, a coating method, a pulsed laser deposition method, a laser ablation method, a metal organic chemical vapor deposition (MOCVD) method, an atomic layer deposition (ALD) method, or the like.

As a power supply device for generating plasma in the case of forming the oxide semiconductor film by a sputtering method, an RF power supply device, an AC power supply device, a DC power supply device, or the like can be used as appropriate.

Note that in the case where the oxide semiconductor film is formed with a magnetron sputtering apparatus having a magnet on a rear surface of a sputtering target, the oxide semiconductor film is formed while swinging one or more of the sputtering target, the magnet, and a substrate, so that the oxide semiconductor film can have uniform thickness.

As a sputtering gas, a rare gas (typically argon), oxygen, or a mixed gas of a rare gas and oxygen is used as appropriate.

Furthermore, a target may be selected as appropriate in accordance with the composition of an oxide semiconductor film to be formed. Note that a CAAC-OS film and a microcrystalline oxide semiconductor film can be formed using a target including an In—Ga—Zn oxide, preferably a polycrystalline target including an In—Ga—Zn oxide.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

The CAAC-OS film is preferably formed under the following conditions.

By inhibiting entry of impurities during the deposition, the crystal state can be prevented from being broken by the impurities. For example, the concentration of impurities (e.g., hydrogen, water, carbon dioxide, or nitrogen) existing in a deposition chamber may be reduced. Furthermore, the concentration of impurities in a deposition gas may be reduced. Specifically, a deposition gas whose dew point is −80° C. or lower, preferably −100° C. or lower, further preferably −125° C. is used.

In the case where an oxide semiconductor film, for example, an $InGaZnO_X$ (X>0) film is formed with a deposition apparatus employing an ALD method, an $In(CH_3)_3$ gas and an $O_3$ gas are sequentially introduced more than once to form an $InO_2$ layer, a $Ga(CH_3)_3$ gas and an $O_3$ gas are sequentially introduced more than once to form a GaO layer, and then a $Zn(CH_3)_2$ gas and an $O_3$ gas are sequentially introduced more than once to form a ZnO layer. Note that the order of these layers is not limited to this example. A mixed compound layer such as an $InGaO_2$ layer, an $InZnO_2$ layer, or a GaZnO layer may be formed using these gases. Note that although an $H_2O$ gas that is obtained by bubbling with an inert gas such as Ar may be used instead of an $O_3$ gas, it is preferable to use an $O_3$ gas that does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Instead of a $Zn(CH_3)_2$ gas, a $Zn(C_2H_5)_2$ gas may be used.

In this embodiment, a stack including films from the insulating film 119 to the protective film 103, which are provided over the substrate 101, is called an element layer 171.

[Attachment of Element Layer 171 to Substrate 121]

Figure 13B:
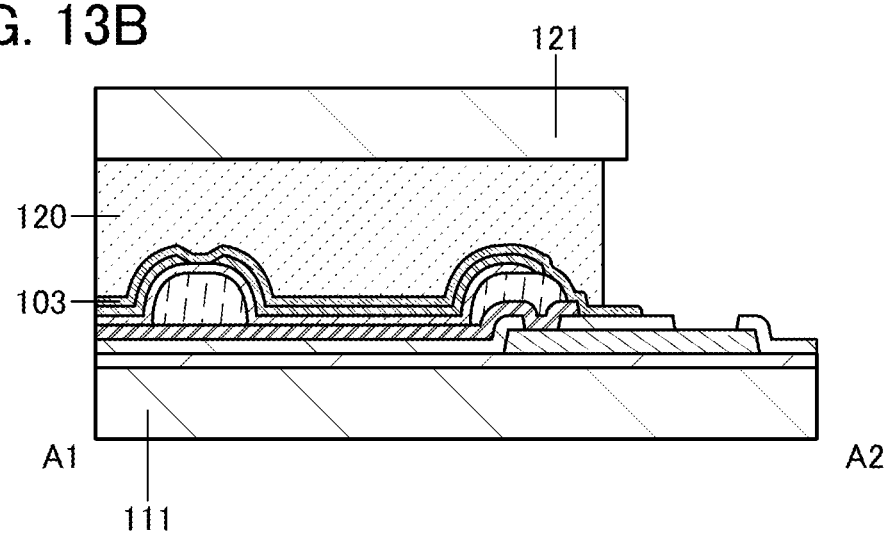

Next, the element layer 171 and the substrate 121 are attached to each other with the adhesive portion 120 therebetween (see FIG. 13B).

[Formation of External Electrode]

Figure 13C:
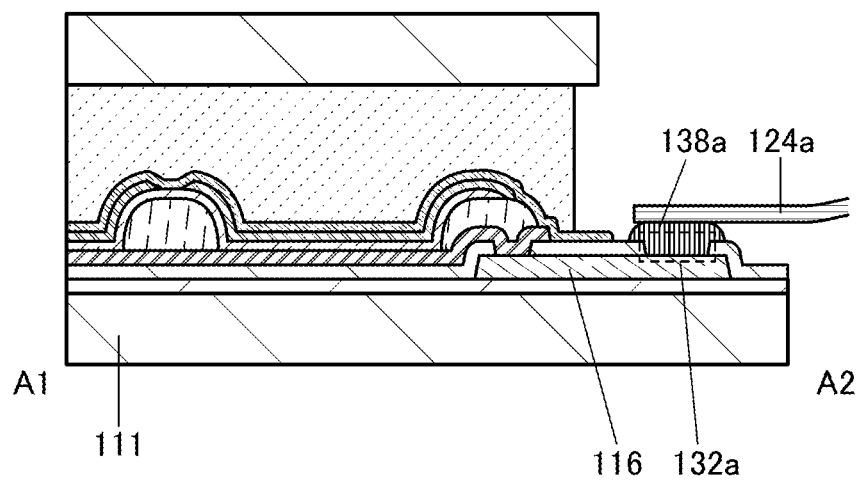

Next, the anisotropic conductive connection portion 138a is formed in the opening 132a, and the external electrode 124a for inputting electric power or a signal to the display device 100 is formed over the anisotropic conductive connection portion 138a (see FIG. 13C). The external electrode 124a includes a plurality of electrodes. At least one of the electrodes included in the external electrode 124a is electrically connected to the electrode 116 through the anisotropic conductive connection portion 138a, whereby electric power or a signal can be input to the display device 100.

Note that an FPC can be used as the external electrode 124a. A metal wire can also be used as the external electrode 124a. Although the metal wire and the electrode 116 may be connected to each other using the anisotropic conductive connection portion, the connection can be made by a wire bonding method. Alternatively, the connection may be made by a soldering method.

Through the above-described steps, the display device 100 can be manufactured.

Note that one or more of films each formed using a material having a specific function (hereinafter, referred to as a "function film"), such as an anti-reflection film, a light diffusion film, a microlens array, a prism sheet, a retardation plate, or a polarizing plate, may be provided on the outside of the substrate 111 or the substrate 121 through which light is extracted. As the anti-reflection film, for example, a circularly polarizing plate can be used. With the functional film, the display device can have higher display quality. Moreover, the power consumption of the display device can be reduced.

<Method 2 for Manufacturing Display Device>

Next, a method for manufacturing the display device 100 that includes a touch sensor and a coloring film as illustrated in FIGS. 5A and 5B is described. First, a method for forming the substrate 121 provided with an element layer including a touch sensor and a coloring film is described.

[Formation of Insulating Film 129]

The insulating film 129 is formed over the substrate 121. The insulating film 129 can be formed using a material and a method that are similar to those of the insulating film 119. In this embodiment, the insulating film 129 is formed by stacking a 200-nm-thick silicon oxynitride film, a 140-nm-thick silicon nitride oxide film, and a 100-nm-thick silicon oxynitride film in this order over the substrate 102 by a plasma CVD method.

[Formation of Electrode 272]

Next, the electrode 272 is formed over the insulating film 129. The electrode 272 can be formed in such a manner that a light-transmitting conductive film is formed over the insulating film 129 and part of the conductive film is selectively etched. The light-transmitting conductive film can be formed using, for example, the above-described light-transmitting conductive material. In this embodiment, the electrode 272 is formed using an indium tin oxide film.

[Formation of Insulating Film 273]

Figure 14A:
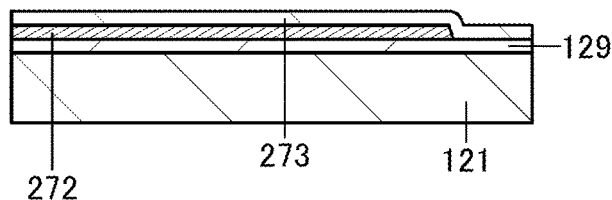
FIGS. 14A to 14E illustrate a manufacturing process of one embodiment of the present invention.

Next, the insulating film 273 is formed over the electrode 272 (see FIG. 14A). In this embodiment, as the insulating film 273, a silicon oxynitride film is formed by a plasma CVD method.

[Formation of Electrode 274]

Next, the electrode 274 is formed over the insulating film 273. The electrode 274 can be formed in such a manner that a light-transmitting conductive film is formed over the insulating film 273 and part of the conductive film is selectively etched. In this embodiment, the electrode 274 is formed using indium tin oxide. Through the above-described steps, the touch sensor 271 can be formed.

Note that although not illustrated, an electrode that is connected to the electrode 272 or the electrode 274 is preferably formed. The method for forming the electrode 116 in the above-described <Method 1 for Manufacturing Display Device> can be employed as appropriate for the electrode.

[Formation of Insulating Film 275]

Figure 14B:
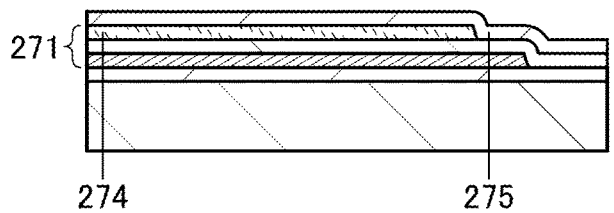

Next, the insulating film 275 is formed over the electrode 274 (see FIG. 14B). In this embodiment, as the insulating film 275, a silicon oxynitride film is formed by a plasma CVD method. Note that the insulating film 275 is not necessarily formed.

[Formation of Light-Blocking Film 264]

Next, the light-blocking film 264 is formed over the insulating film 275. The light-blocking film 264 blocks light emitted from an adjacent display element and suppresses color mixture between adjacent display elements. The light-blocking film 264 is provided such that its end portion overlaps with an end portion of the coloring film 266, whereby light leakage can be suppressed. The light-blocking film 264 may have either a single-layer structure or a layered structure including two or more layers. Examples of a material for the light-blocking film 264 include a metal material containing chromium, titanium, nickel, or the like; an oxide material containing chromium, titanium, nickel, or the like; and a resin material containing a metal material, a pigment, or dye.

The light-blocking film 264 can be formed by a lithography process. In the case where a macromolecular material in which carbon black is dispersed, or the like is used for the light-blocking film 264, direct writing of the light-blocking film 264 can be performed on the insulating film 275 by an inkjet method.

[Formation of Coloring Film 266]

Figure 14C:
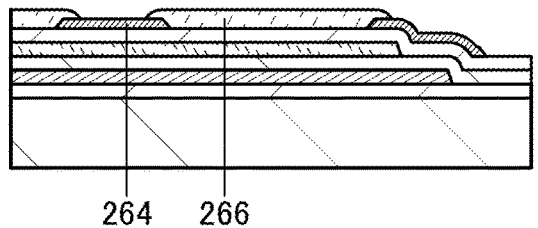

Next, the coloring film 266 is formed over the insulating film 275 (see FIG. 14C). As described above, the coloring film transmits light with a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. The coloring film 266 is formed in a desired position with any of various materials by a printing method, an inkjet method, or a photolithography method. At this time, the coloring film 266 is preferably provided so as to partly overlap with the light-blocking film 264. Color display can be performed by providing the coloring films 266 of different colors in different pixels.

[Formation of Protective Film 267]

Figure 14D:
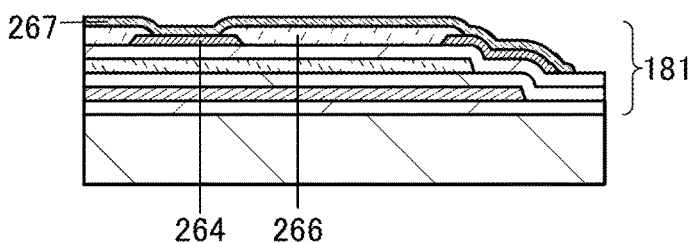

Next, the protective film 267 is formed over the light-blocking film 264 and the coloring film 266 (see FIG. 14D).

The protective film 267 can be formed in a manner similar to that of the protective film 103 illustrated in FIG. 13A. The formation of the protective film 267 can prevent diffusion of water or the like contained in the light-blocking film 264 and the coloring film 266 to the light-emitting element 125 side, for example. Note that the protective film 267 is not necessarily formed.

In this embodiment, a stack including films from the insulating film 129 to the protective film 267, which are provided over the substrate 121, is called an element layer 181. Note that the coloring film 266 is not necessarily provided for the substrate 121.

[Attachment of Substrate 111 to Substrate 121]

Next, the substrate 111 provided with the element layer 171 and the substrate 121 provided with the element layer 181 are attached to each other with the adhesive portion 120 therebetween. At this time, the substrate 111 and the substrate 121 are positioned so that the light-emitting element 125 included in the element layer 171 and the coloring film 266 included in the element layer 181 face each other.

Figure 14E:
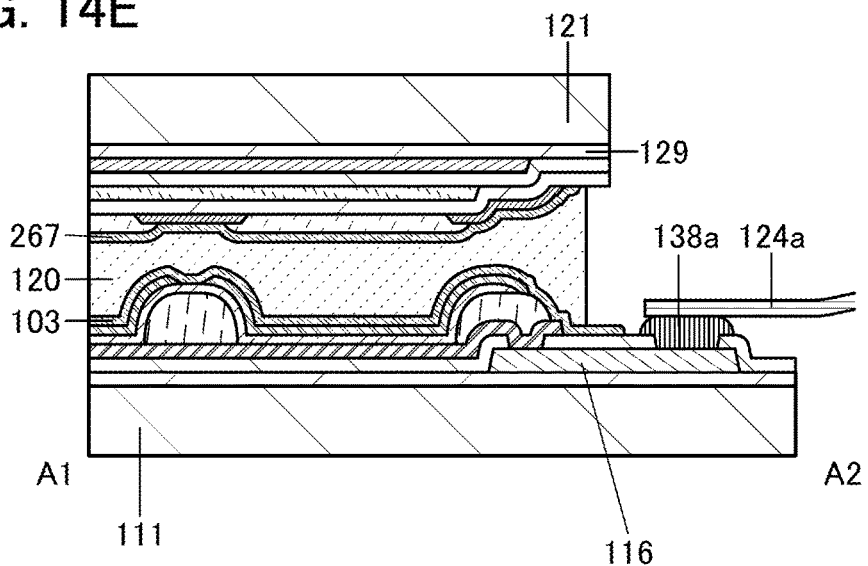

Next, the anisotropic conductive connection portion 138a is formed in the opening 132a in the element layer 171, and the external electrode 124a for inputting electric power or a signal to the display device 100 is formed over the anisotropic conductive connection portion 138a (see FIG. 14E).

Through the above-described steps, the display device 100 can be manufactured.

Note that one or more of films each formed using a material having a specific function (hereinafter, referred to as a "function film"), such as an anti-reflection film, a light diffusion film, a microlens array, a prism sheet, a retardation plate, or a polarizing plate, may be provided on the outside of the substrate 111 or the substrate 121 from which light is extracted. As the anti-reflection film, for example, a circularly polarizing plate can be used.

<Method 3 for Manufacturing Display Device>

Next, a method for manufacturing the display device 100 that uses a flexible substrate and includes a touch sensor and a coloring film as illustrated in FIG. 11B is described.

[Formation of Peeling Film 113]

First, a peeling film 113 is formed over the substrate 101 (also referred to as an "element formation substrate") (see FIG. 15A). As the substrate 101, a glass substrate, a quartz substrate, a sapphire substrate, a ceramic substrate, a metal substrate, a semiconductor substrate, or the like can be used. Alternatively, a plastic substrate having heat resistance to the processing temperature in this embodiment may be used. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, and a substrate including tungsten foil. Examples of a glass substrate include a barium borosilicate glass substrate, an aluminoborosilicate glass substrate, and a soda lime glass substrate.

The peeling film 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling film 113 can also be formed to have a single-layer structure or a stacked-layer structure using any of the materials. Note that the crystalline structure of the peeling film 113 may be amorphous, microcrystalline, or polycrystalline. The peeling film 113 can also be formed using a metal oxide such as aluminum oxide, gallium oxide, zinc oxide, titanium dioxide, indium oxide, indium tin oxide, indium zinc oxide, or In—Ga—Zn—O (IGZO).

The peeling film 113 can be formed by a sputtering method, a CVD method, a coating method, a printing method, or the like. Note that the coating method includes a spin coating method, a droplet discharge method, and a dispensing method.

In the case where the peeling film 113 has a single-layer structure, the peeling film 113 is preferably formed using tungsten, molybdenum, or a material containing tungsten and molybdenum. Alternatively, the peeling film 113 is preferably formed using an oxide or oxynitride of tungsten, an oxide or oxynitride of molybdenum, or an oxide or oxynitride of a material containing tungsten and molybdenum.

In the case where the peeling film 113 has a stacked-layer structure including, for example, a film containing tungsten and a film containing an oxide of tungsten, the film containing an oxide of tungsten may be formed as follows: the film containing tungsten is formed first and then an insulating oxide film is formed in contact therewith, so that the film containing an oxide of tungsten is formed at the interface between the film containing tungsten and the insulating oxide film. Alternatively, the layer containing an oxide of tungsten may be formed by performing thermal oxidation treatment, oxygen plasma treatment, treatment with a highly oxidizing solution such as ozone water, or the like on the surface of the film containing tungsten. Moreover, an insulating film may be provided between the substrate 101 and the peeling film 113.

In this embodiment, aluminoborosilicate glass is used for the substrate 101. The peeling film 113 is formed of tungsten over the substrate 101 by a sputtering method.

Note that it is preferable to expose the surface of the peeling film 113 to an atmosphere containing oxygen before the formation of the insulating film 119.

As the gas used in the atmosphere containing oxygen, oxygen, dinitrogen monoxide, nitrogen dioxide, carbon dioxide, carbon monoxide, or the like can be used. A mixed gas of a gas containing oxygen and another gas may be used. For example, a mixed gas of a gas containing oxygen and a rare gas, for example, a mixed gas of carbon dioxide and argon may be used. Oxidizing the surface of the peeling film 113 can facilitate peeling of the substrate 101 performed later.

Figure 15B:
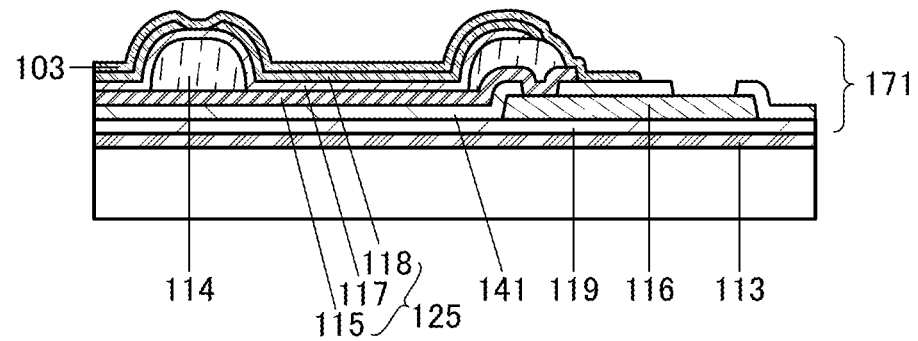

Next, the element layer 171 is formed over the peeling film 113 through steps similar to those in the above-described <Method 1 for Manufacturing Display Device> (see FIG. 15B).

Figure 15C:
Figure 15D:
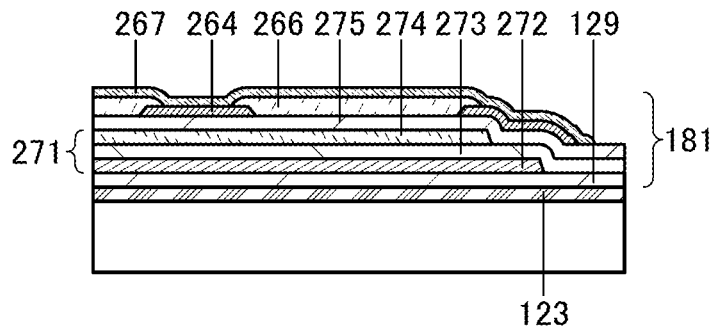

A peeling film 123 is formed over the substrate 102 (see FIG. 15C). The substrate 102 can be formed using a material similar to that of the substrate 101. Note that the same material or different materials may be used for the substrate 101 and the substrate 102. The peeling film 123 can be formed using a material and a method similar to those of the peeling film 113. Moreover, an insulating film may be provided between the substrate 102 and the peeling film 123.

In this embodiment, aluminoborosilicate glass is used for the substrate 102. The peeling film 123 is formed of tungsten over the substrate 102 by a sputtering method.
[Formation of Peeling Film 123]

Next, the element layer 181 is formed over the peeling film 123 through steps similar to those in the above-described <Method 2 for Manufacturing Display Device> (see FIG. 15D).
[Attachment of Substrate 101 to Substrate 102]

Next, the substrate 101 provided with the element layer 171 and the substrate 102 provided with the element layer 181 are attached to each other with the adhesive portion 120 therebetween. At this time, the substrate 101 and the substrate 102 are positioned so that the light-emitting element 125 included in the element layer 171 and the coloring film 266 included in the element layer 181 face each other (see FIG. 16A).
[Peeling of Substrate 101]

Figure 16A:
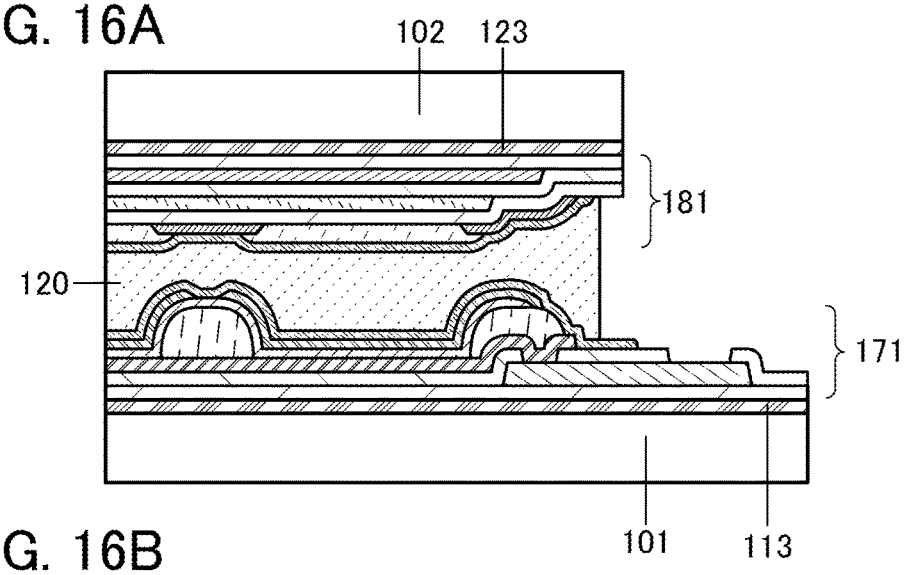
FIGS. 16A to 16C illustrate a manufacturing process of one embodiment of the present invention.
Figure 16B:
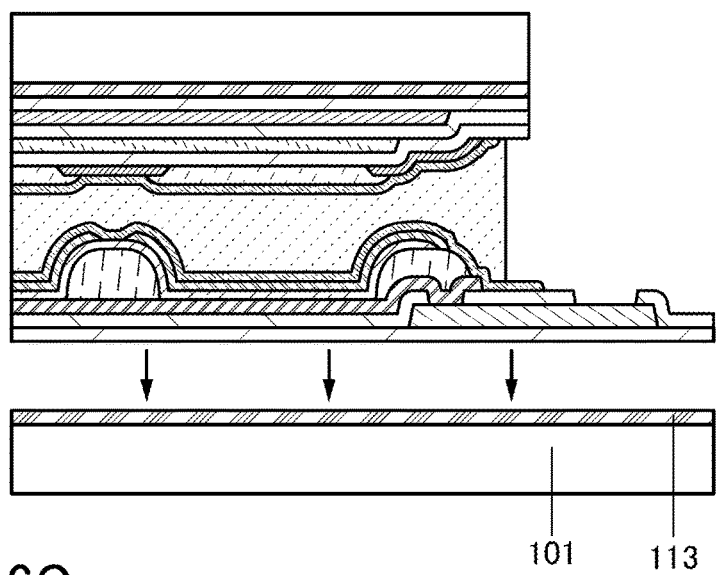
Figure 16C:
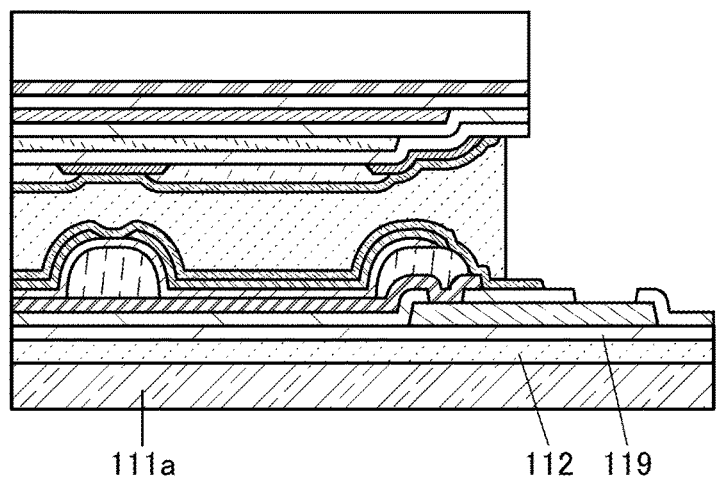
Figure 17A:
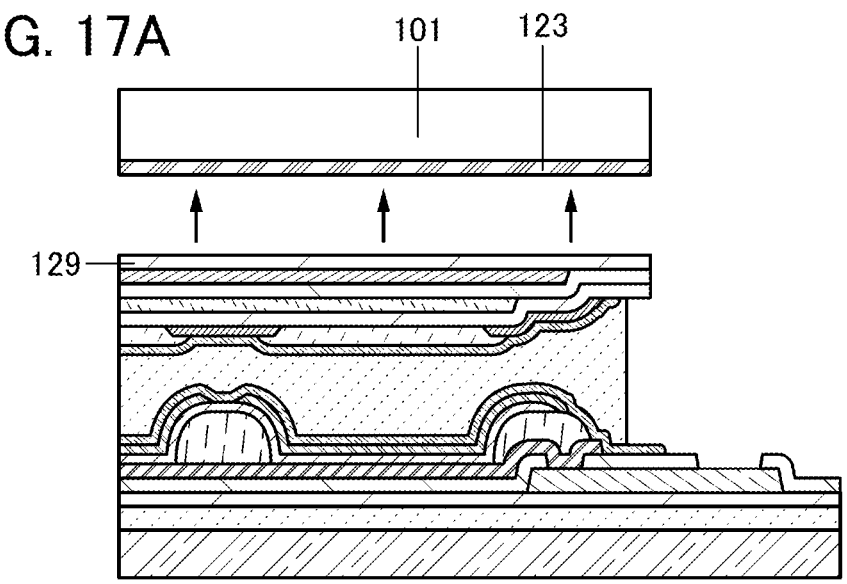
FIGS. 17A and 17B illustrate a manufacturing process of one embodiment of the present invention.
Figure 17B:
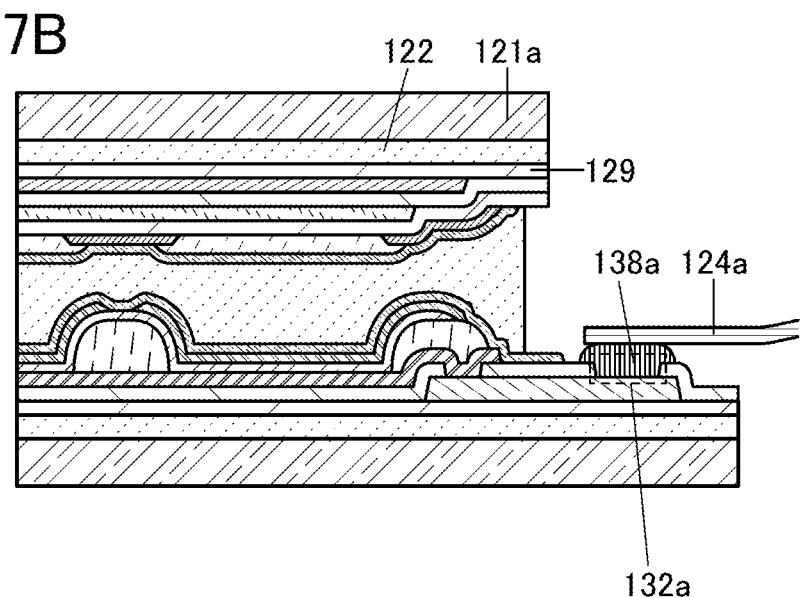

Next, the substrate 101 provided with the element layer 171 is peeled from the insulating film 119 together with the peeling film 113 (see FIG. 16B). As a peeling method, mechanical force (a separation process with a human hand or a gripper, a separation process by rotation of a roller, ultrasonic waves, or the like) may be used. For example, a cut is made in the peeling film 113 with a sharp edged tool, by laser beam irradiation, or the like and water is injected into the cut. A portion between the peeling film 113 and the substrate 101 absorbs water through capillarity action, so that the substrate 101 can be separated easily.
[Attachment of Substrate 111]

Next, the substrate 111a is attached to the insulating film 119 with the adhesive portion 112 therebetween (see FIG. 16C).
[Peeling of Substrate 102]

Next, the substrate 102 provided with the element layer 181 is peeled from the insulating film 129 together with the peeling film 123 (see FIG. 17A).
[Attachment of Substrate 121]

Next, the substrate 121a is attached to the insulating film 129 with the adhesive portion 122 therebetween (see FIG. 17B).
[Formation of External Electrode]

Next, the anisotropic conductive connection portion 138a is formed in the opening 132a, and the external electrode 124a for inputting electric power or a signal to the display device 100 is formed over the anisotropic conductive connection portion 138a.

Through the above-described steps, the display device 100 can be manufactured.

Note that one or more of films each formed using a material having a specific function (hereinafter, referred to as a "function film"), such as an anti-reflection film, a light diffusion film, a microlens array, a prism sheet, a retardation plate, or a polarizing plate, may be provided on the outside of the substrate 111a or the substrate 121a from which light is extracted. As the anti-reflection film, for example, a circularly polarizing plate can be used.

For the substrate 111a or the substrate 121a, a material having a specific function may be used. For example, a circularly polarizing plate may be used as the substrate 111a or the substrate 121a. Alternatively, for example, the substrate 111a or the substrate 121a may be formed using a retardation plate, and a polarizing plate may be provided so as to overlap with the substrate. As another example, the substrate 111a or the substrate 121a may be formed using a prism sheet, and a circularly polarizing plate may be provided so as to overlap with the substrate. With the use of the material having a specific function for the substrate 111a or the substrate 121a, the display quality can be improved and the manufacturing cost can be reduced.

This embodiment can be implemented in an appropriate combination with any of the structures described in the other embodiments.

Embodiment 2

Figure 18A:
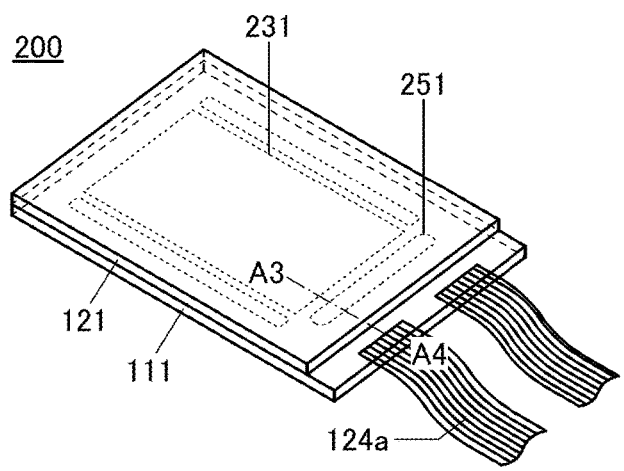
FIGS. 18A and 18B are a perspective view and a cross-sectional view illustrating one embodiment of the present invention.
Figure 18B:
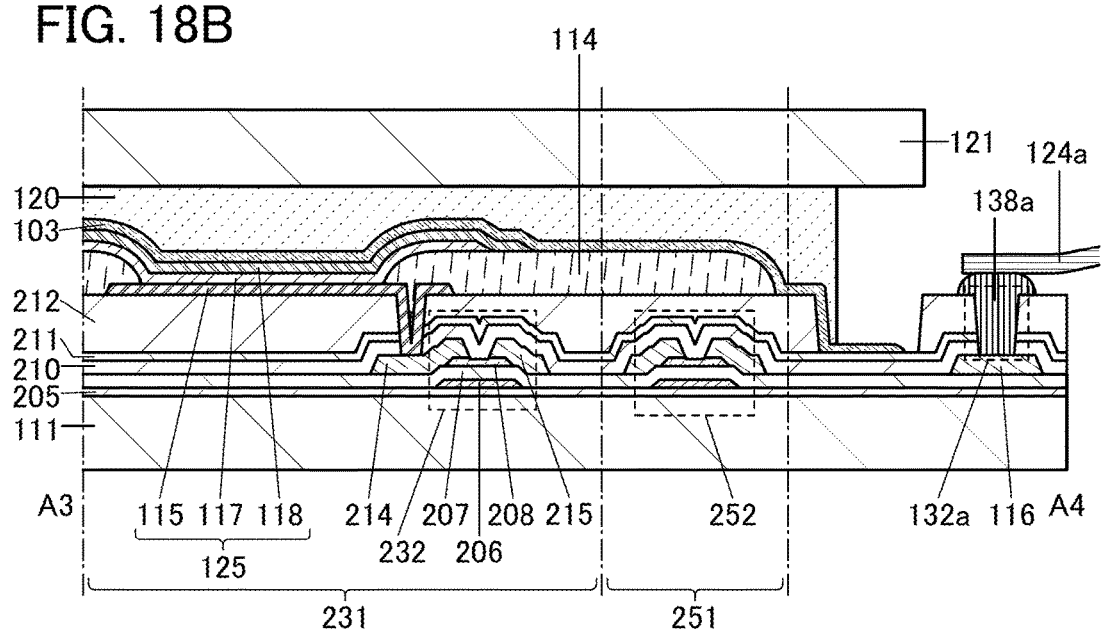

In this embodiment, a display device 200 that has a structure different from the structure of the display device 100 described in the above embodiment is described with reference to FIGS. 18A and 18B. In this embodiment, the display device 200 having an active matrix structure is described. FIG. 18A is a top view of the display device 200, and FIG. 18B is a cross-sectional view taken along dashed-dotted line A3-A4 in FIG. 18A.
<Structure 1 of Display Device>

The display device 200 described in this embodiment includes a display region 231 and a driver circuit 251. The display device 200 also includes the electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125.

The electrode 116 is electrically connected to the external electrode 124a through the anisotropic conductive connection portion 138a formed in the opening 132a. In addition, the electrode 116 is electrically connected to the driver circuit 251.

The driver circuit 251 includes a plurality of transistors 252. The driver circuit 251 has a function of determining which of the light-emitting elements 125 in the display region 231 is supplied with a signal from the external electrode 124a.

In the display device 200 illustrated in FIGS. 18A and 18B, the substrate 111 and the substrate 121 are attached to each other with the adhesive portion 120 therebetween. An insulating film 205 is formed over the substrate 111. The insulating film 205 can be formed using a material and a method that are similar to those of the insulating film 119 described in Embodiment 1.

Note that the insulating film 205 functions as a base film and can prevent or reduce diffusion of impurity elements from the substrate 111 or the like to the transistor or the light-emitting element.

The transistor 232, the transistor 252, and the electrode 116 are formed over the insulating film 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor film in which a channel is formed is interposed between two gate electrodes. Furthermore, without limitation to a transistor having a single-gate structure; a multi-gate transistor having a plurality of channel formation regions, such as a double-gate transistor may be used.

As the transistor 232 and the transistor 252, a transistor with any of a variety of structures such as a planar type, a FIN-type, and a Tri-Gate type can be used.

The transistor 232 and the transistor 252 may have the same structure or different structures. The size (e.g., channel length and channel width) or the like of each transistor can be adjusted as appropriate.

The transistor 232 and the transistor 252 each include an electrode 206 that can function as a gate electrode, an insulating film 207 that can function as a gate insulating film, a semiconductor film 208, an electrode 214 that can function as one of a source electrode and a drain electrode, and an electrode 215 that can function as the other of the source electrode and the drain electrode.

The electrode 214 and the electrode 215 can be formed at the same time as the electrode 116 using parts of the conductive film for forming the electrode 116. In addition, the insulating film 207 can be formed using a material and a method that are similar to those of the insulating film 205.

The semiconductor film 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor film 208, a CAAC-OS, a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Thus, a display device with low power consumption can be provided.

In the case where an oxide semiconductor is used for the semiconductor film 208, an insulating film containing oxygen is preferably used as an insulating film in contact with the semiconductor film 208. For the insulating film in contact with the semiconductor film 208, it is particularly preferable to use an insulating film from which oxygen is released by heat treatment.

In addition, an insulating film 210 is formed over the transistor 232 and the transistor 252, and an insulating film 211 is formed over the insulating film 210. The insulating film 210 functions as a protective insulating film and can prevent or reduce diffusion of impurity elements from a film above the insulating film 210 to the transistor 232 and the transistor 252. The insulating film 210 can be formed using a material and a method that are similar to those of the insulating film 205.

An insulating film 212 can be formed using an insulating material with a planarization function over the insulating film 211 in order to reduce surface unevenness of a surface on which the light-emitting element 125 is formed. As the insulating material with a planarization function, for example, an organic material such as a polyimide resin or an acrylic resin can be used. Other than such organic materials, it is also possible to use a low-dielectric constant material (a low-k material) or the like. Note that the insulating film 212 may be formed by stacking a plurality of insulating films formed using these materials.

In addition, the light-emitting element 125 and the insulating film 114 for separating the adjacent light-emitting elements 125 are formed over the insulating film 212.

The light-emitting element 125 is electrically connected to the transistor 232 in an opening formed in the insulating films 210, 211, and 212.

With a micro optical resonator (also referred to as microcavity) structure that allows light emitted from the EL layer 117 to resonate, lights with different wavelengths and narrowed spectra can be extracted even when one EL layer 117 is used for different light-emitting elements 125.

The display device 200 includes the protective film 103 in contact with the insulating film 114, the electrode 118, and the insulating film 212. Note that the protective film 103 covers at least exposed portions of the insulating film 114 and the insulating film 212, typically, top surfaces and side surfaces of the insulating film 114 and the insulating film 212. The protective film 103 also covers an exposed portion of the electrode 118, typically, a top surface and a side surface of the electrode 118. Note that in the case where the top surfaces of the insulating film 114 and the insulating film 212 are covered with an electrode or a film, the side surfaces of the insulating film 114 and the insulating film 212 may be covered with the protective film 103. The protective film 103 has low moisture permeability. The protective film 103 can prevent diffusion of water inside and outside the display device 200 into the EL layer 117. Typically, the protective film 103 can prevent diffusion of water entering the top surfaces and the side surfaces of the insulating film 114 and the insulating film 212 into the EL layer 117. As a result, a partial decrease in the luminance of the display device 200 can be prevented. In addition, formation of a non-light-emitting region in the display device 200 can be prevented.

Figure 19A:
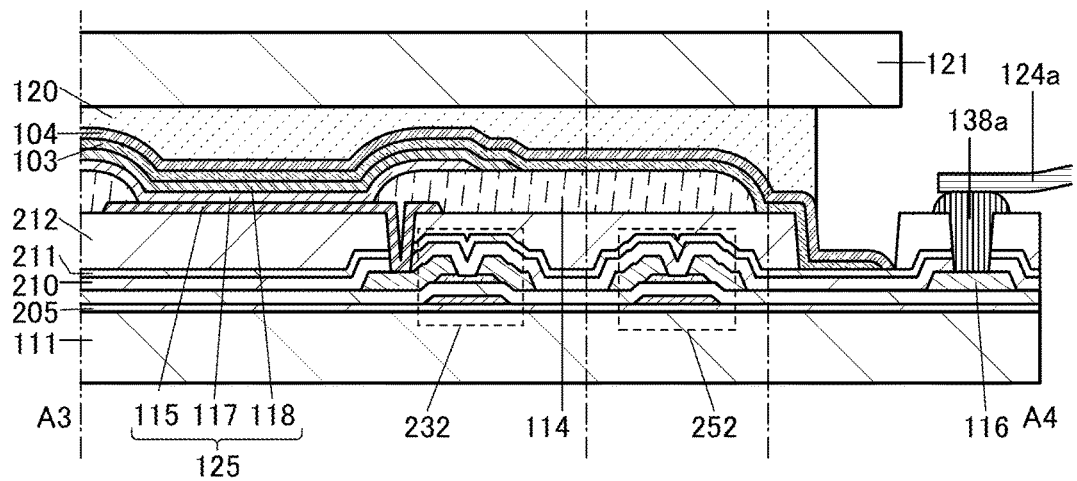
FIGS. 19A to 19C are cross-sectional views each illustrating one embodiment of the present invention.
Figure 19B:
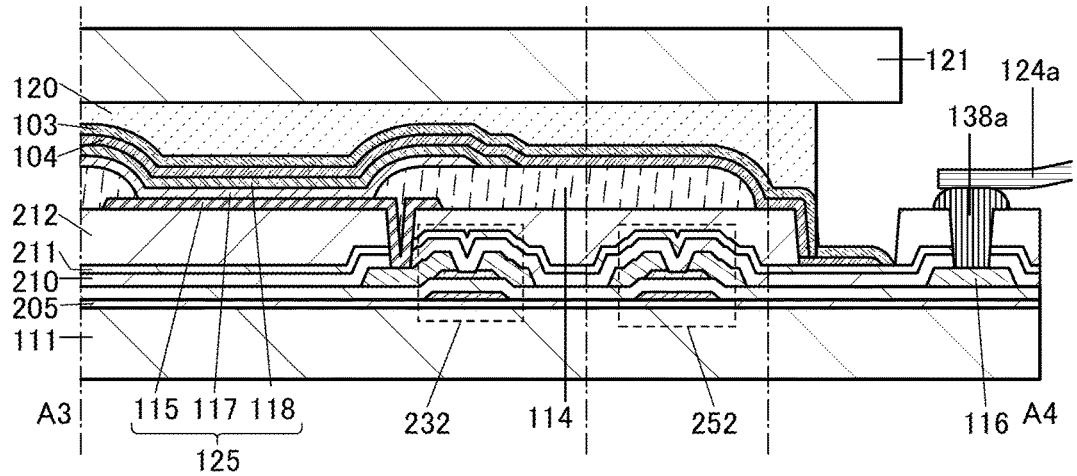
Figure 19C:
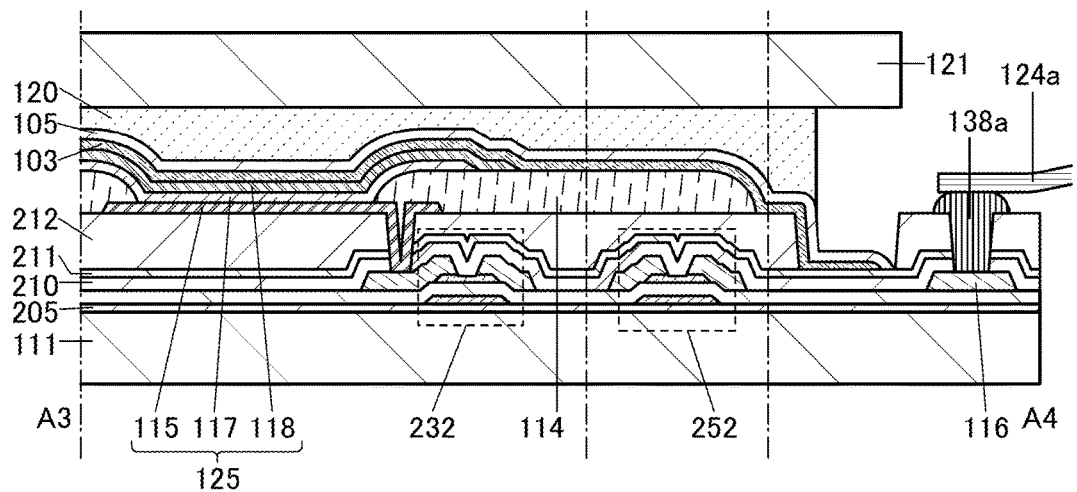

Next, a display device having a structure different from the structure illustrated in FIG. 18B is described with reference to FIGS. 19A to 19C. FIGS. 19A to 19C are cross-sectional views of the display device 200.

As illustrated in FIG. 19A, the display device 200 may include the conductive film 104 over the protective film 103 covering exposed portions of the insulating film 114, the electrode 118, and the insulating film 212.

As illustrated in FIG. 19B, the display device 200 may include the conductive film 104 covering exposed portions of the insulating film 114, the electrode 118, and the insulating film 212, and the protective film 103 over the conductive film 104.

When the protective film 103 is provided over the conductive film 104, the protective film 103 and the conductive film 104 prevent diffusion of water included in the adhesive portion 120. Thus, diffusion of water inside and outside the display device 200 into the EL layer 117 can be prevented. As a result, a partial decrease in the luminance of the display device 200 can be prevented. In addition, formation of a non-light-emitting region in the display device 200 can be prevented.

As illustrated in FIG. 19C, the display device 200 may include the protective film 103 covering exposed portions of the insulating film 114, the electrode 118, and the insulating film 212, and the insulating film 105 over the protective film 103.

<Structure 2 of Display Device>

Figure 20A:
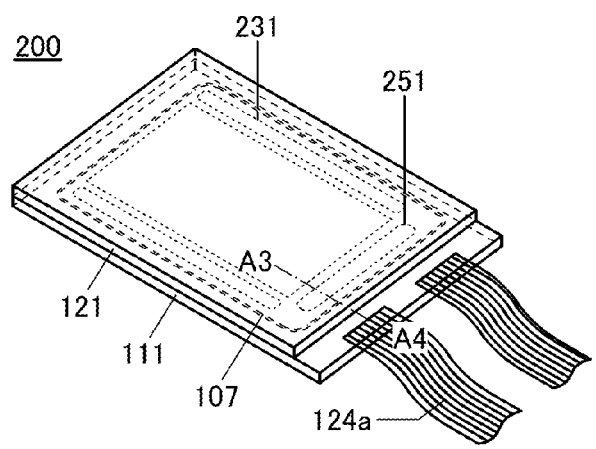
FIGS. 20A and 20B are a perspective view and a cross-sectional view illustrating one embodiment of the present invention.
Figure 20B:
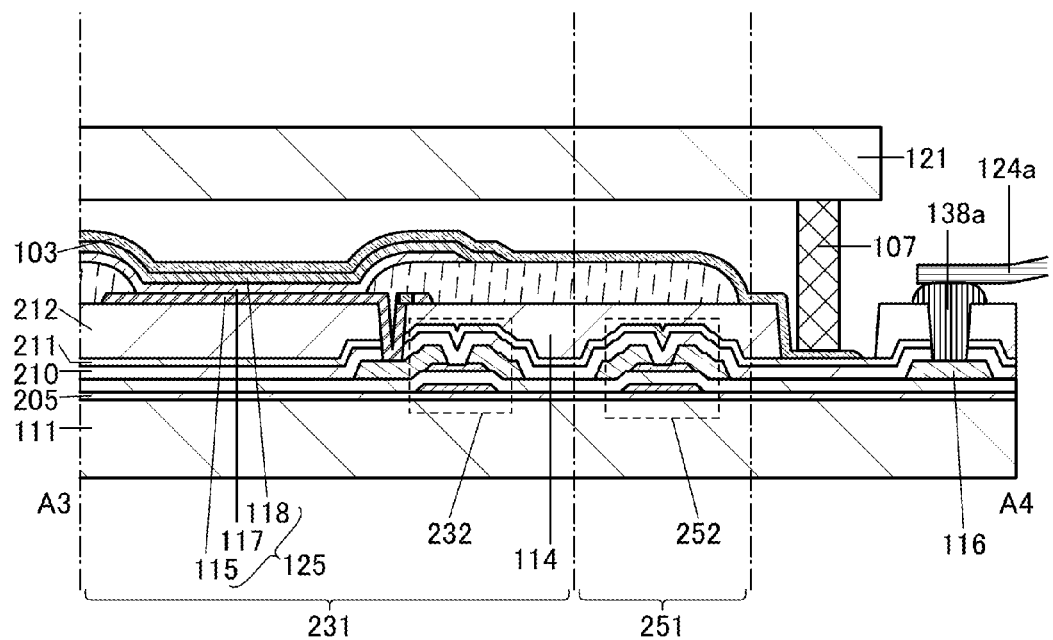

FIG. 20A is a perspective view of the display device 200. FIG. 20B is a cross-sectional view taken along dashed-dotted line A1-A2 in FIG. 20A. The display device 200 described in this embodiment includes a display region 231 and a driver circuit 251. In addition, the sealant 107 with a closed-loop shape is provided outside the display region 231.

The display device 200 illustrated in FIGS. 20A and 20B differs from the display devices 200 illustrated in FIGS. 18A and 18B and FIGS. 19A to 19C in that the substrate 111 and the substrate 121 are firmly attached to each other with the sealant 107. A sealed region surrounded by the substrate 111, the substrate 121, and the sealant 107 in the display device 200 has a hollow structure. The sealed region may be filled with an inert gas such as a rare gas or a nitrogen gas. Alternatively, the sealed region can have a reduced-pressure atmosphere. As a result, water or the like in the sealed region can be reduced, so that the reliability of the light-emitting element 125 can be improved.

The display device 200 includes the protective film 103 in contact with the insulating film 114, the electrode 118, and the insulating film 212. The protective film 103 covers at least exposed portions of the insulating film 114 and the insulating film 212, typically, top surfaces and side surfaces of the insulating film 114 and the insulating film 212. In the case where the top surfaces of the insulating film 114 and the insulating film 212 are covered with an electrode or a film, the side surfaces of the insulating film 114 and the insulating film 212 may be covered with the protective film 103. The protective film 103 also covers an exposed portion of the electrode 118, typically, a top surface and a side surface of the electrode 118.

Figure 21A:
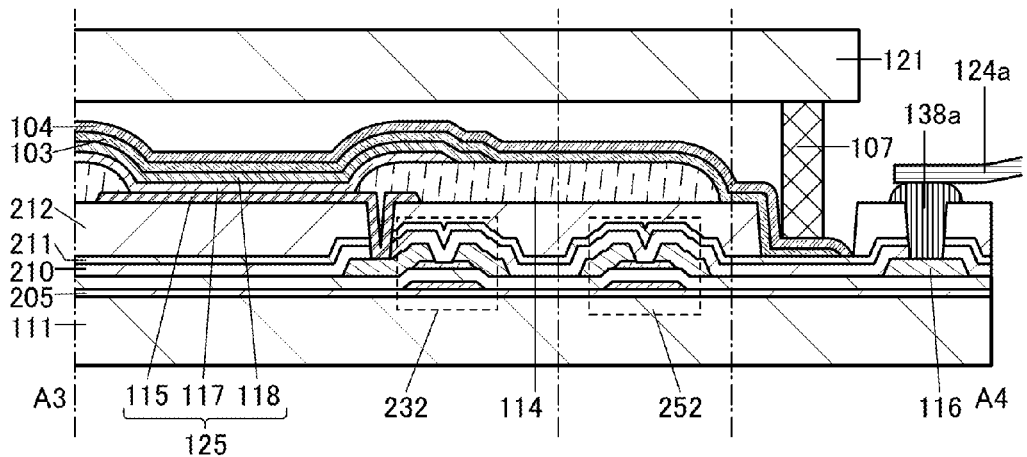
FIGS. 21A to 21C are cross-sectional views each illustrating one embodiment of the present invention.
Figure 21B:
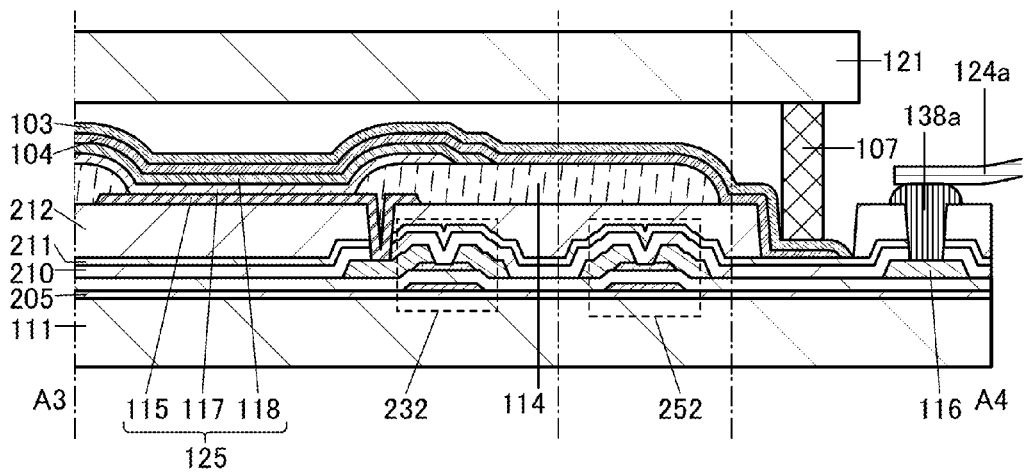
Figure 21C:
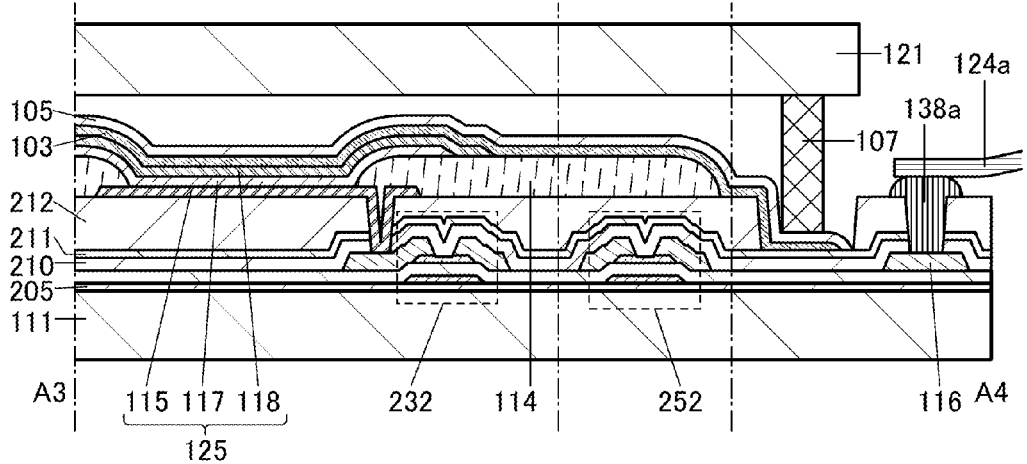

Next, a display device having a structure different from the structure illustrated in FIG. 20B is described with reference to FIGS. 21A to 21C. FIGS. 21A to 21C are cross-sectional views of the display device 200.

As illustrated in FIG. 21A, the display device 200 may include the conductive film 104 over the protective film 103 covering exposed portions of the insulating film 114, the electrode 118, and the insulating film 212.

As illustrated in FIG. 21B, the display device 200 may include the conductive film 104 covering exposed portions of the insulating film 114, the electrode 118, and the insulating film 212, and the protective film 103 over the conductive film 104.

As illustrated in FIG. 21C, the display device 200 may include the protective film 103 covering exposed portions of the insulating film 114, the electrode 118, and the insulating film 212, and the insulating film 105 over the protective film 103.

<Structure 3 of Display Device>

The display device 200 described in this embodiment may include a coloring film on the substrate 121 side. The display device 200 described in this embodiment may include a touch sensor on the substrate 121 side. FIGS. 22A and 22B and FIGS. 23A and 23B are each a cross-sectional view of the display device 200 that includes the coloring film and the touch sensor on the substrate 121 side.

Figure 22A:
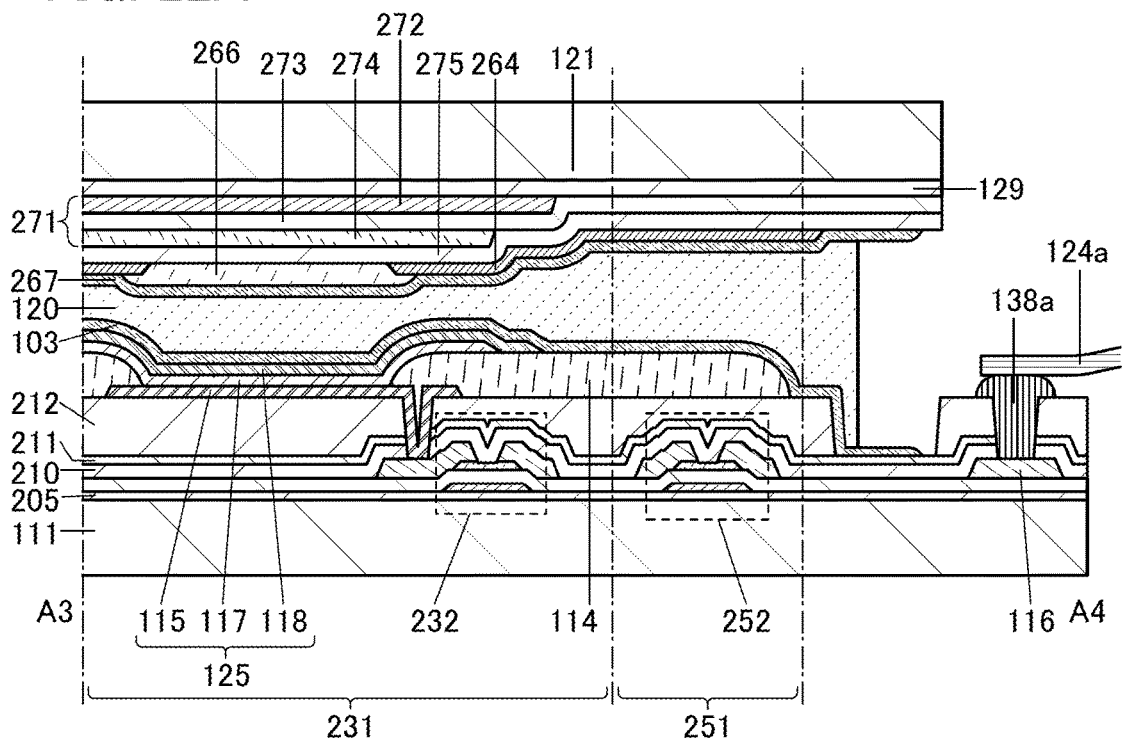
FIGS. 22A and 22B are cross-sectional views each illustrating one embodiment of the present invention.

As illustrated in FIG. 22A, the display device 200 described in this embodiment includes, over the substrate 101, the insulating film 205, the transistor 232, the transistor 252, the electrode 116, the insulating films 210, 211, and 212, the light-emitting element 125, the insulating film 114, and the protective film 103 as in FIG. 18B. The substrate 121 is provided over the light-emitting element 125 with the adhesive portion 120 therebetween. The substrate 121 is provide with a touch sensor 271, an insulating film 275, a light-blocking film 264, a coloring film 266, and a protective film 267. In this embodiment, for example, a capacitive touch sensor is used as the touch sensor 271. The touch sensor 271 includes an electrode 272, an insulating film 273, and an electrode 274.

Note that in the case where the EL layer 117 is provided by what is called side-by-side patterning in which the colors of the lights emitted from different pixels are different, the coloring film 266 may be provided or is not necessarily provided.

When the light-blocking film 264 or the coloring film 266 is not provided, the manufacturing cost of the display device 200 can be reduced or the yield of the display device 200 can be improved. Moreover, light from the EL layer 117 can be emitted efficiently when the coloring film 266 is not provided; thus, an increase in luminance, a reduction in power consumption, and the like can be achieved.

On the other hand, when the light-blocking film 264 and the coloring film 266 are provided, reflection of external light is suppressed, so that a contrast ratio, color reproducibility, or the like can be improved.

In the case where the display device 200 has a bottom-emission structure, the touch sensor 271, the light-blocking film 264, and the coloring film 266 may be provided on the substrate 111 side.

In the case where the display device 200 has a dual-emission structure, the touch sensor 271, the light-blocking film 264, and the coloring film 266 may be provided on one or both of the substrate 111 side and the substrate 121 side. The touch sensor 271 and the coloring film 266 may be provided on the different substrate sides.

The display device 200 includes the protective film 103 in contact with the insulating film 114, the electrode 118, and the insulating film 212. The protective film 103 covers at least exposed portions of the insulating film 114 and the insulating film 212, typically, top surfaces and side surfaces of the insulating film 114 and the insulating film 212. In the case where the top surfaces of the insulating film 114 and the insulating film 212 are covered with an electrode or a film, the side surfaces of the insulating film 114 and the insulating film 212 may be covered with the protective film 103. The protective film 103 also covers an exposed portion of the electrode 118, typically, a top surface and a side surface of the electrode 118.

The display devices 200 each having a structure different from the structure illustrated in FIG. 22A are described with reference to FIG. 22B and FIGS. 23A and 23B.

Figure 22B:
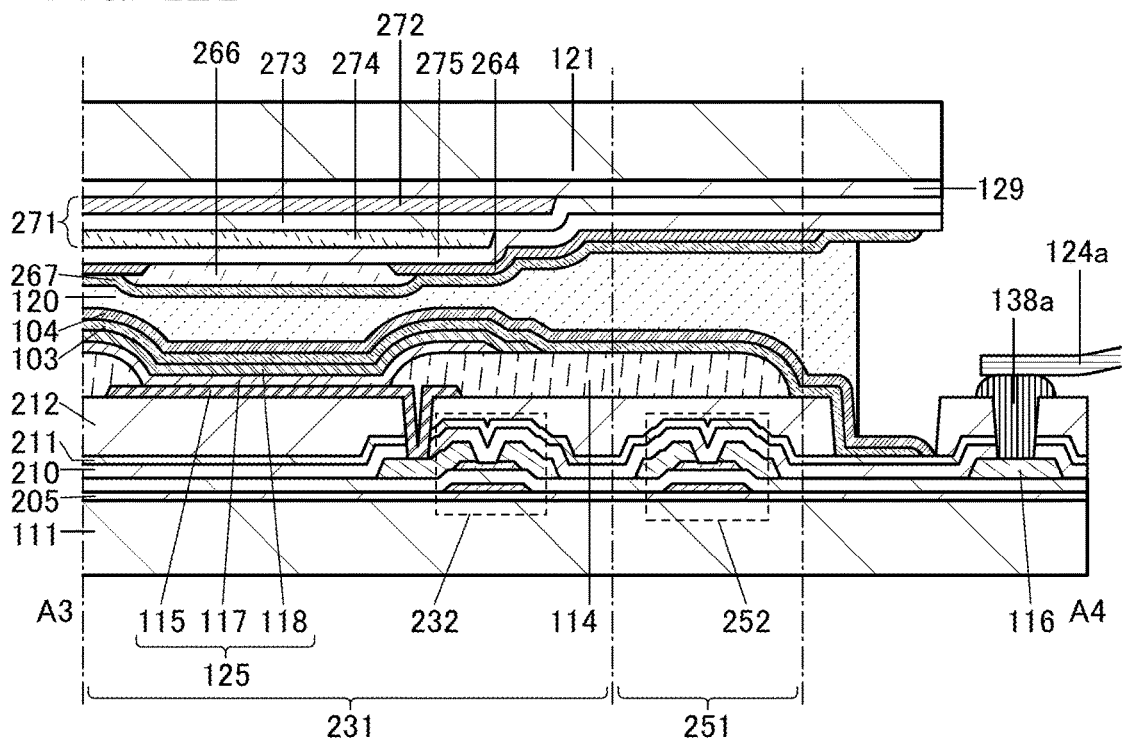

As illustrated in FIG. 22B, the display device 200 may include the conductive film 104 over the protective film 103.

Figure 23A:
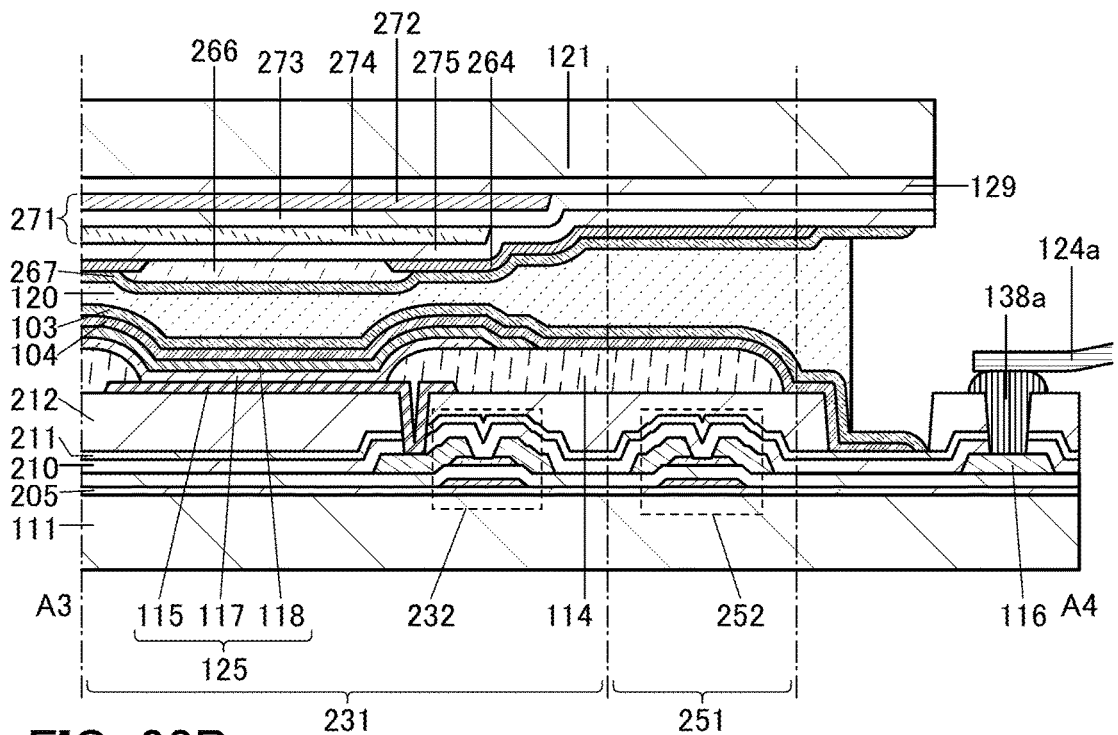
FIGS. 23A and 23B are cross-sectional views each illustrating one embodiment of the present invention.

As illustrated in FIG. 23A, the display device 200 may include the conductive film 104 covering exposed portions of the insulating film 114, the electrode 118, and the insulating film 212, and the protective film 103 over the conductive film 104.

Figure 23B:
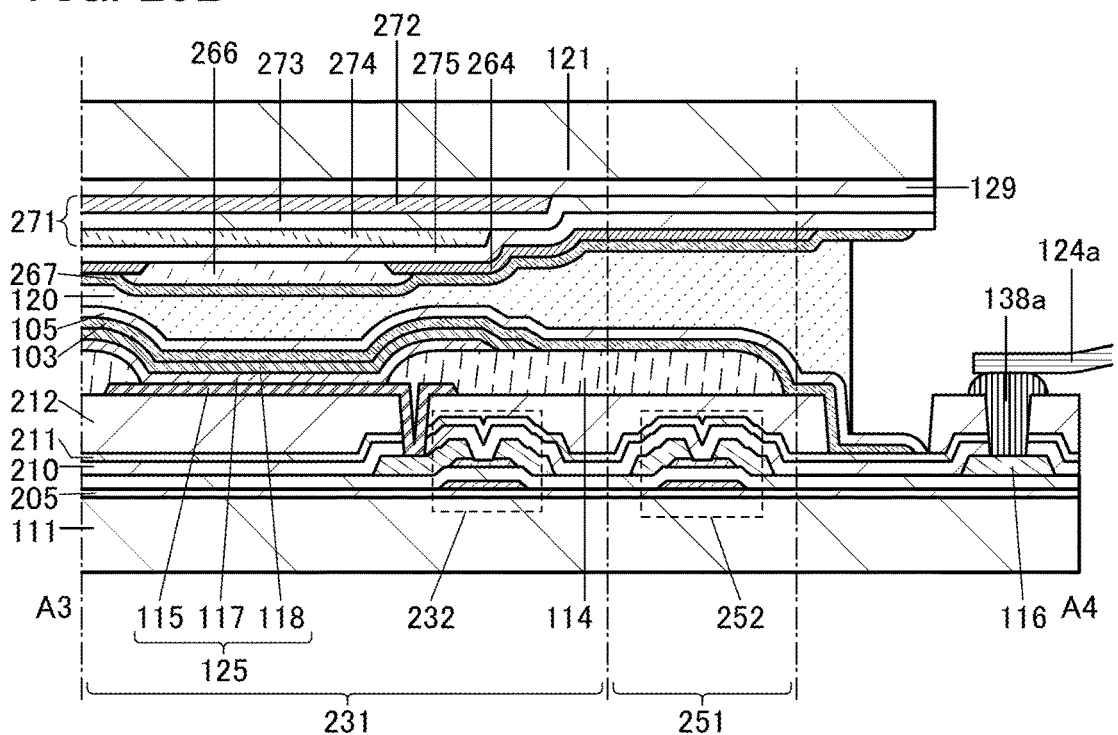

As illustrated in FIG. 23B, the display device 200 may include the protective film 103 covering exposed portions of the insulating film 114, the electrode 118, and the insulating film 212, and the insulating film 105 over the protective film 103.

<Structure 4 of Display Device>

Figure 24A:
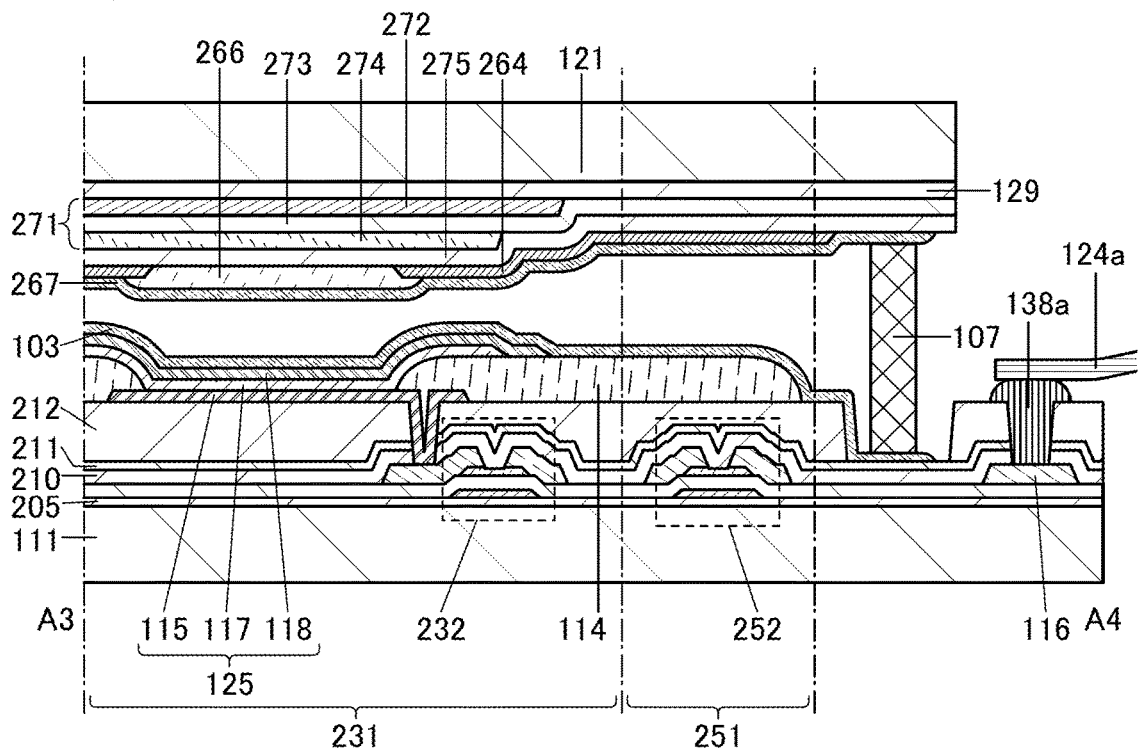
FIGS. 24A and 24B are cross-sectional views each illustrating one embodiment of the present invention.

The display device 200 illustrated in FIG. 24A differs from the display devices 200 illustrated in FIGS. 22A and 22B and FIGS. 23A and 23B in that the substrate 111 and the substrate 121 are firmly attached to each other with the sealant 107. A sealed region surrounded by the substrate 111, the substrate 121, and the sealant 107 in the display device 200 has a hollow structure. The sealed region may be filled with an inert gas such as a rare gas or a nitrogen gas. Alternatively, the sealed region can have a reduced-pressure atmosphere. As a result, water or the like in the sealed region can be reduced, so that the reliability of the light-emitting element 125 can be improved.

The display device 200 includes the protective film 103 in contact with the insulating film 114, the electrode 118, and the insulating film 212. The protective film 103 covers at least exposed portions of the insulating film 114 and the insulating film 212, typically, top surfaces and side surfaces of the insulating film 114 and the insulating film 212. In the case where the top surfaces of the insulating film 114 and the insulating film 212 are covered with an electrode or a film, the side surfaces of the insulating film 114 and the insulating film 212 may be covered with the protective film 103. The protective film 103 also covers an exposed portion of the electrode 118, typically, a top surface and a side surface of the electrode 118.

Next, display devices each having a structure different from the structure illustrated in FIG. 24A are described with reference to FIG. 24B and FIGS. 25A and 25B.

Figure 24B:
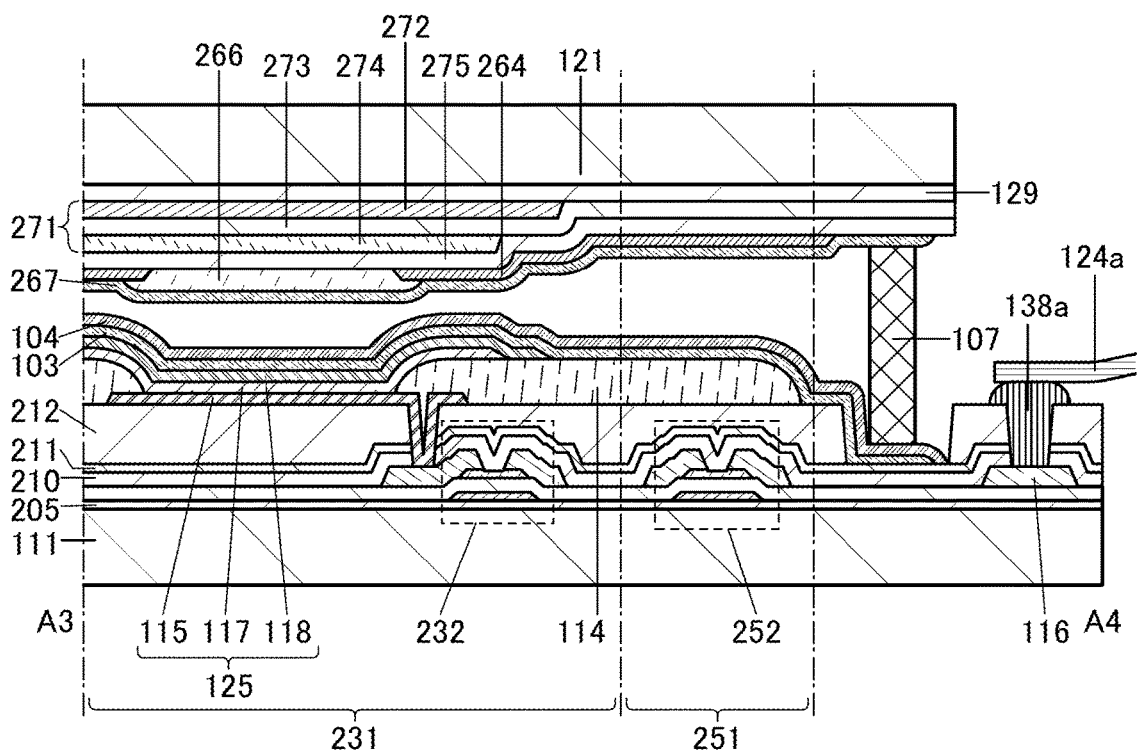

As illustrated in FIG. 24B, the display device 200 may include the conductive film 104 over the protective film 103 covering exposed portions of the insulating film 114, the electrode 118, and the insulating film 212.

Figure 25A:
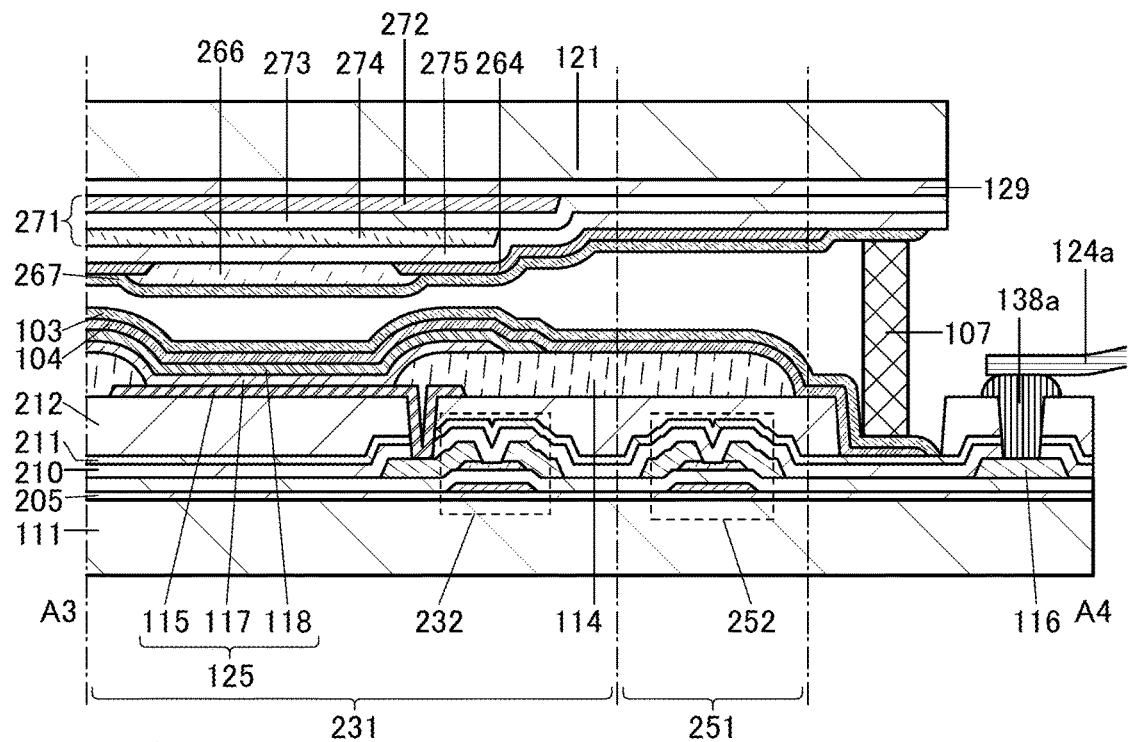
FIGS. 25A and 25B are cross-sectional views each illustrating one embodiment of the present invention.

As illustrated in FIG. 25A, the display device 200 may include the conductive film 104 covering exposed portions of the insulating film 114, the electrode 118, and the insulating film 212, and the protective film 103 over the conductive film 104.

Figure 25B:
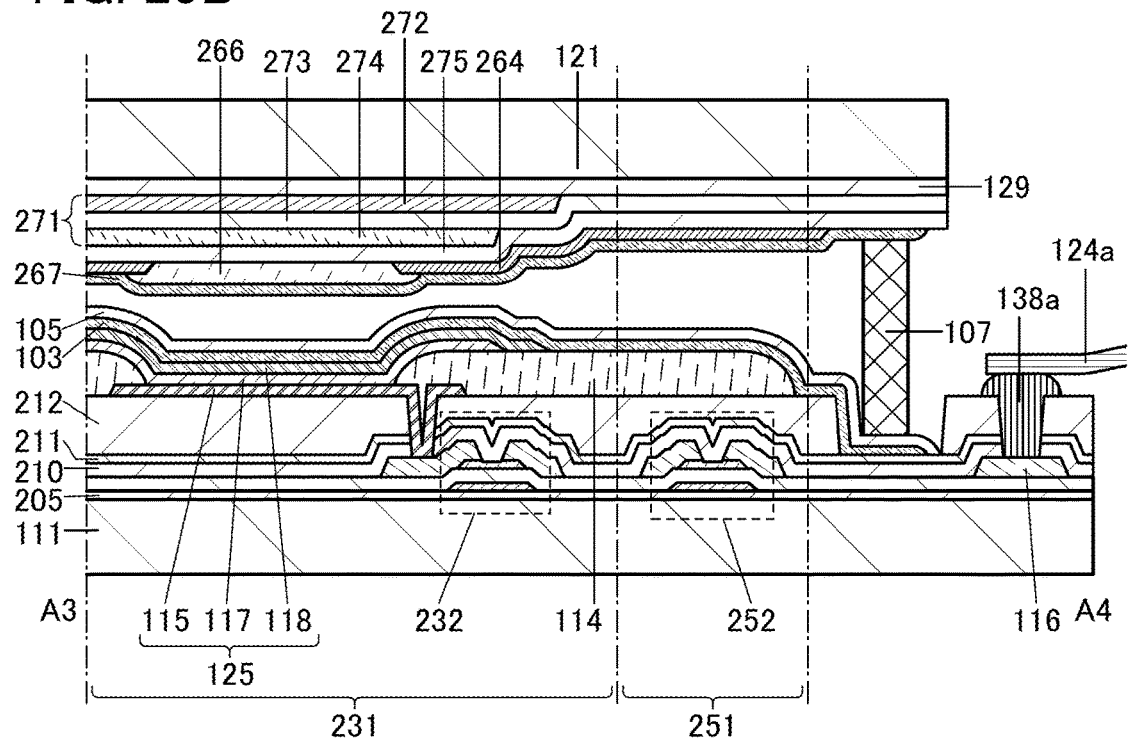

As illustrated in FIG. 25B, the display device 200 may include the protective film 103 covering exposed portions of the insulating film 114, the electrode 118, and the insulating film 212, and the insulating film 105 over the protective film 103.

<Structure 5 of Display Device>

Figure 26:
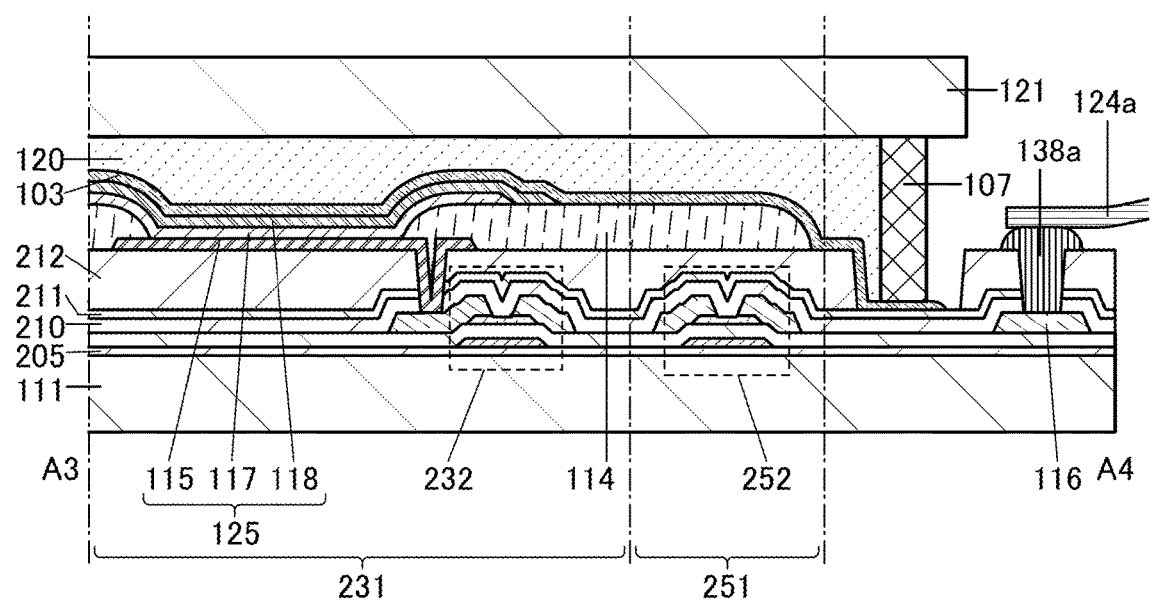
FIG. 26 is a cross-sectional view illustrating one embodiment of the present invention.

In the display device 200 described in this embodiment, the substrate 111 and the substrate 121 may be firmly attached to each other with the adhesive portion 120 and the sealant 107. In the display device 200 illustrated in FIG. 26, the substrate 111 and the substrate 121 are firmly attached to each other with the adhesive portion 120 and the sealant 107.

<Structure 6 of Display Device>

Figure 27A:
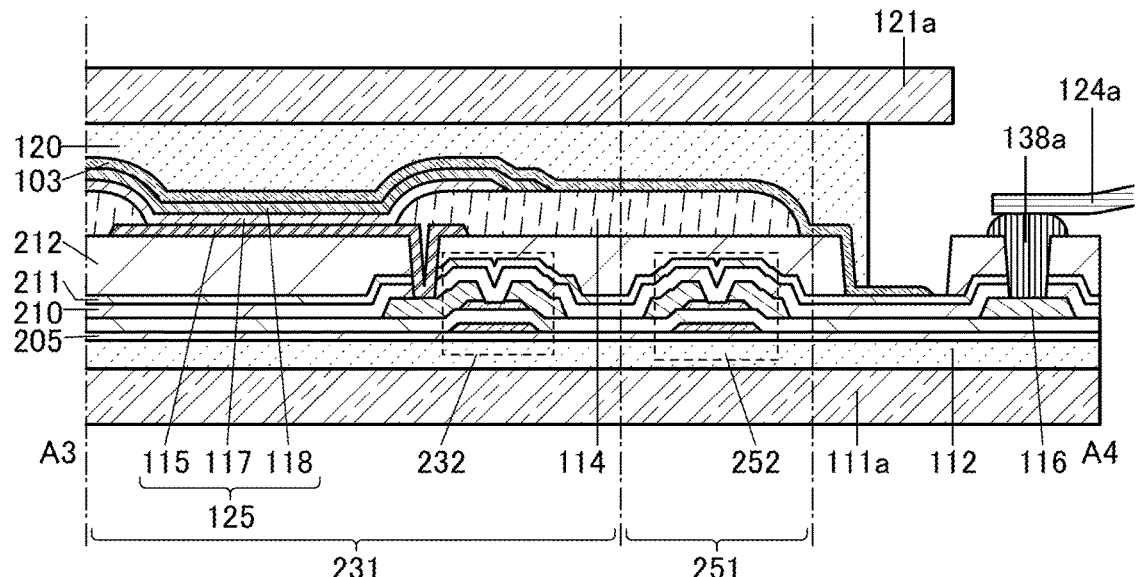
FIGS. 27A and 27B are cross-sectional views each illustrating one embodiment of the present invention.
Figure 27B:
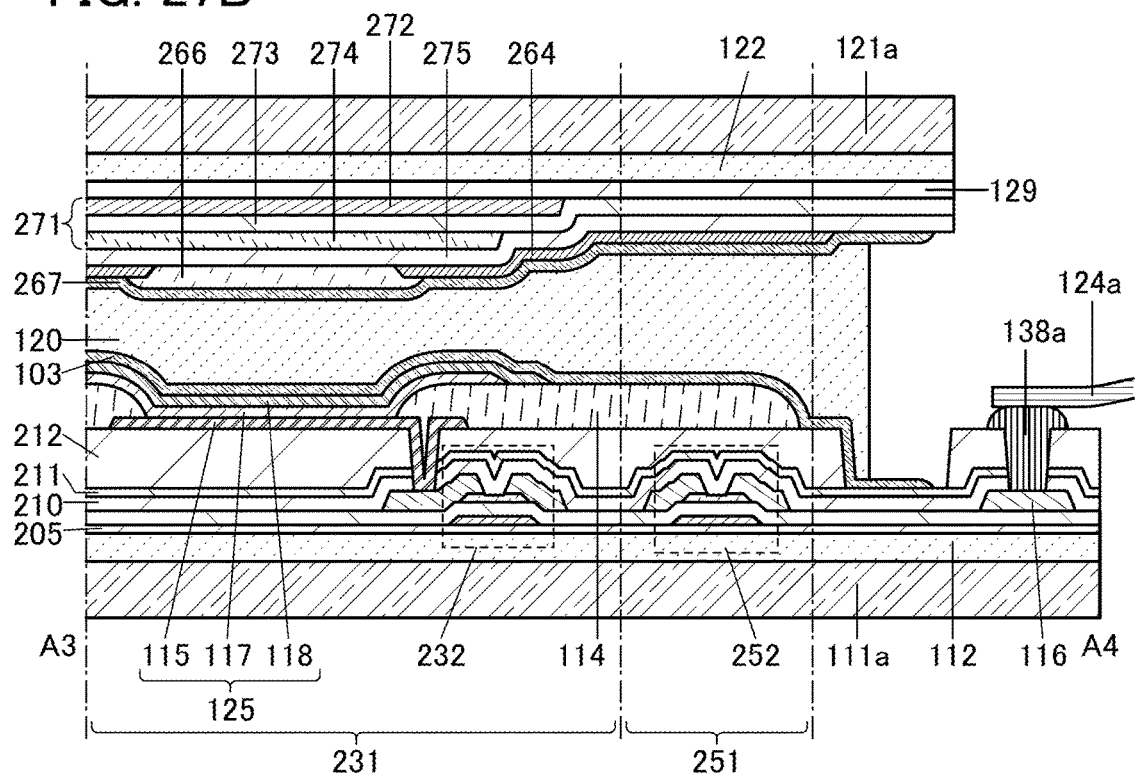

In the display device 200 described in this embodiment, a flexible substrate may be used instead of the substrate 111. In the display device 200 described in this embodiment, a flexible substrate may be used instead of the substrate 121. In the display device 200 illustrated in FIG. 27A, the flexible substrate 111a is firmly attached to the insulating film 205 with the adhesive portion 112. In addition, the flexible substrate 121a is firmly attached to the protective film 103 with the adhesive portion 120. The display device 200 illustrated in FIG. 27B includes the insulating film 129, the touch sensor 271, the insulating film 275, the light-blocking film 264, the coloring film 266, and the protective film 267, which are provided on the flexible substrate 121a side. In addition, the flexible substrate 121a is firmly attached to the insulating film 129 with the adhesive portion 122.

This embodiment can be implemented in an appropriate combination with any of the structures described in the other embodiments.

Embodiment 3

Figure 28A:
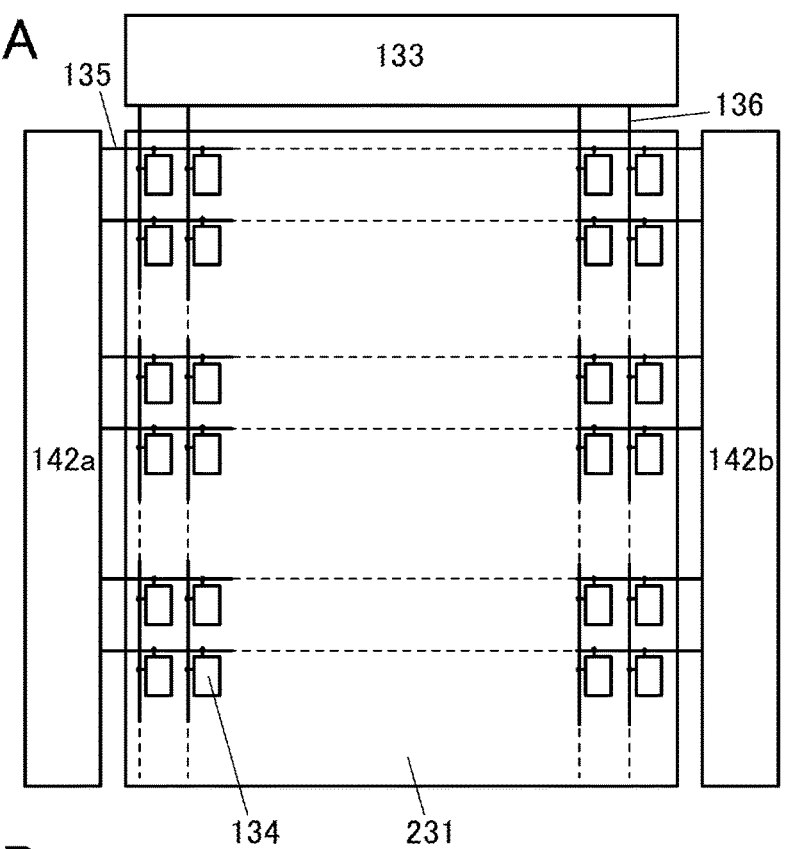
FIGS. 28A to 28C are a block diagram and circuit diagrams illustrating one embodiment of a display device.

In this embodiment, a specific structure example of the display device 200 is described with reference to FIGS. 28A to 28C. FIG. 28A is a block diagram illustrating the structure example of the display device 200.

The display device 200 illustrated in FIG. 28A includes the display region 231, a driver circuit 142a, a driver circuit 142b, and a driver circuit 133. The driver circuits 142a, 142b, and 133 correspond to the driver circuit 251 described in the above embodiment. The driver circuits 142a, 142b, and 133 are collectively referred to as a driver circuit portion in some cases.

The driver circuits 142a and 142b function as, for example, scan line driver circuits. The driver circuit 133 functions as, for example, a signal line driver circuit. Note that one of the driver circuits 142a and 142b may be omitted. Alternatively, some sort of circuit facing the driver circuit 133 with the display region 231 therebetween may be provided.

The display device 200 includes m wirings 135 that are arranged substantially parallel to each other and whose potentials are controlled by the driver circuit 142a and/or the driver circuit 142b, and n wirings 136 that are arranged substantially parallel to each other and whose potentials are controlled by the driver circuit 133. The display region 231 includes a plurality of pixel circuits 134 arranged in matrix. One pixel circuit 134 is used for driving one subpixel (the pixel 130).

Each of the wirings 135 is electrically connected to the n pixel circuits 134 in a given row among the pixel circuits 134 arranged in m rows and n columns in the display region 231. Each of the wirings 136 is electrically connected to the m pixel circuits 134 in a given column among the pixel circuits 134 arranged in m rows and n columns. Note that m and n are each an integer of 1 or more.

Figure 28B:
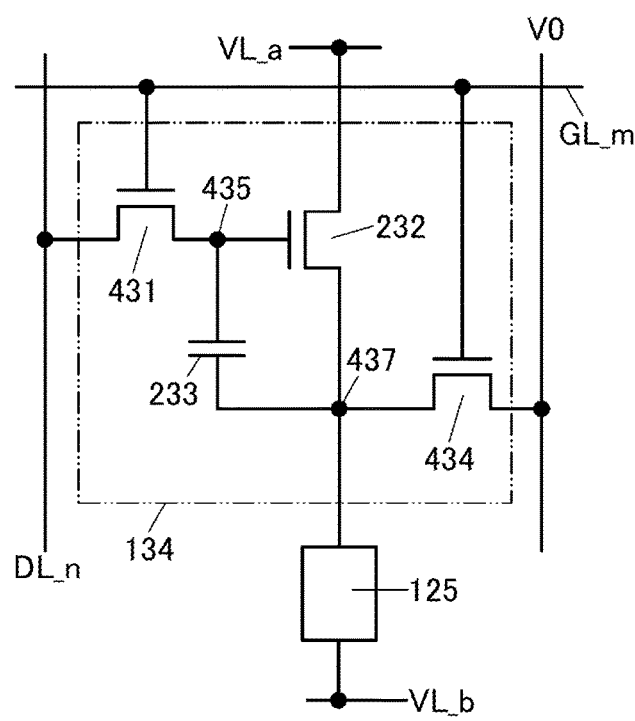
Figure 28C:
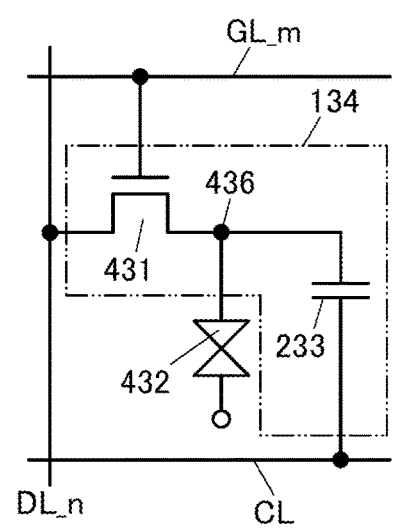

FIGS. 28B and 28C illustrate circuit structures that can be used for the pixel circuits 134 in the display device 200 in FIG. 28A.

[Example of Pixel Circuit for Light-Emitting Display Device]

The pixel circuit 134 in FIG. 28B includes a transistor 431, a capacitor 233, the transistor 232, and a transistor 434. The pixel circuit 134 is electrically connected to the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling writing of a data signal to a node 435.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 has a function of a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other of the anode and the cathode of the light-emitting element 125 is electrically connected to the node 437.

As the light-emitting element 125, for example, an organic electroluminescent element (also referred to as an organic EL element) can be used. Note that the light-emitting element 125 is not limited thereto and may be an inorganic EL element containing, for example, an inorganic material.

As a power supply potential, a potential on the comparatively high potential side or a potential on the comparatively low potential side can be used, for example. For example, a high power supply potential VDD is supplied to one of the potential supply line VL_a and the potential supply line VL_b, and a low power supply potential VSS is supplied to the other.

[Example of Pixel Circuit for Liquid Crystal Display Device]

The pixel circuit 134 in FIG. 28C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method for driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include ECB (electrically controlled birefringence) mode, PDLC (polymer dispersed liquid crystal) mode, PNLC (polymer network liquid crystal) mode, and a guest-host mode. Note that one embodiment of the present invention is not limited thereto, and various liquid crystal elements and driving methods can be used.

The liquid crystal element 432 may be formed using a liquid crystal composition including liquid crystal exhibiting a blue phase and a chiral material. The liquid crystal exhibiting a blue phase has a short response time of 1 ms or less. Furthermore, the liquid crystal is optically isotropic, which makes the alignment process unneeded and the viewing angle dependence small.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. A gate electrode of the transistor 431 is electrically connected to a scan line GL_m. The transistor 431 has a function of controlling writing of a data signal to the node 436.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 has a function of a storage capacitor for storing data written to the node 436.

[Display Element]

The display device of one embodiment of the present invention can employ various modes and can include various elements. The display element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Alternatively, quantum dots may be used as the display element. Examples of the display device including an EL element include an EL display. Examples of a display device including an electron emitter include a field emission display (FED), an SED-type flat panel display (SED: surface-conduction electron-emitter display), and the like. Examples of display devices including quantum dots include a quantum dot display. Examples of the display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of the display device including electronic ink, Electronic Liquid Powder (registered trademark), or an electrophoretic element include electronic paper. In the case of a transflective liquid crystal display or a reflective liquid crystal display, some of or all of pixel electrodes have functions of reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 4

In this embodiment, an example of a transistor that can be used instead of the transistor 232 and/or the transistor 252 described in the above embodiments is described with reference to FIGS. 29A to 29D, FIGS. 30A to 30D, and FIGS. 31A and 31B. A transistor disclosed in this specification and the like can be used as the transistors 431, 434, and the like.

[Bottom-Gate Transistor]

Figure 29A:
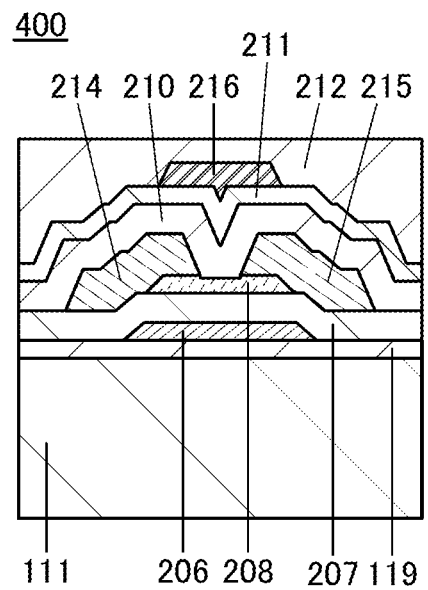
FIGS. 29A to 29D are cross-sectional views each illustrating one embodiment of a transistor.
Figure 29B:
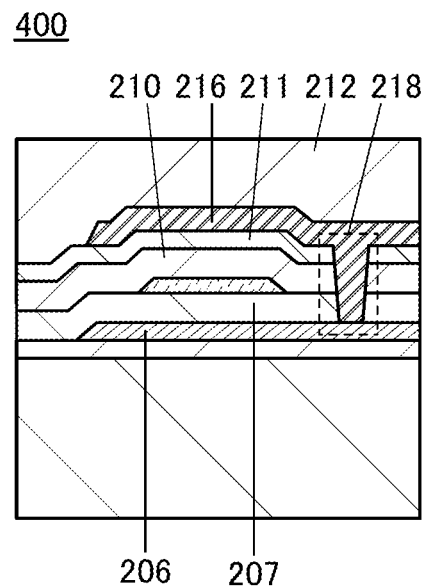

A transistor 400 illustrated in FIGS. 29A and 29B as an example is a channel-etched transistor that is a type of bottom-gate transistor. The transistor 400 includes an electrode 216 over the insulating film 211. The electrode 216 has a function of a back gate electrode. The electrode 216 can be formed using a material and a method that are similar to those of the electrode 206 or the electrode 115.

FIG. 29A is a cross-sectional view of the transistor 400 in the channel length direction. FIG. 29B is a cross-sectional view of the transistor 400 in the channel width direction. As illustrated in FIG. 29B, in the channel width direction, the electrode 206 and the electrode 216 are connected to each other in an opening 218 formed in the insulating films 207, 210, and 211.

In general, a back gate electrode is formed using a conductive film and positioned so that the semiconductor film 208 is positioned between a gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrode 206 and the electrode 216 can both function as a gate electrode. Thus, the insulating films 207, 210, and 211 can all function as a gate insulating layer.

In the case where one of the electrode 206 and the electrode 216 is referred to as a "gate electrode", the other may be referred to as a "back gate electrode". For example, in the transistor 400, in the case where the electrode 216 is referred to as a "gate electrode", the electrode 206 may be referred to as a "back gate electrode". In the case where the electrode 216 is used as a "gate electrode", the transistor 400 can be regarded as a kind of top-gate transistor. Furthermore, one of the electrode 206 and the electrode 216 may be referred to as a "first gate electrode", and the other may be referred to as a "second gate electrode".

By providing the electrode 206 and the electrode 216 with the semiconductor film 208 therebetween and setting the potentials of the electrode 206 and the electrode 216 to be the same, a region in the semiconductor film 208 through which carriers flow is enlarged in the film thickness direction; thus, the number of transferred carriers is increased. As a result, the on-state current and field-effect mobility of the transistor 400 are increased.

Therefore, the transistor 400 has comparatively large on-state current in view of its area. That is, the area occupied by the transistor 400 can be small for required on-state current. According to one embodiment of the present invention, the area occupied by a transistor can be reduced. Therefore, according to one embodiment of the present invention, a semiconductor device having a high degree of integration can be provided.

Furthermore, the gate electrode and the back gate electrode are formed using conductive films and thus each have a function of preventing an electric field generated outside the transistor from influencing the semiconductor film in which the channel is formed (in particular, a function of blocking static electricity).

Since the electrode 206 and the electrode 216 each have a function of blocking an external electric field, charges generated on the substrate 111 side or above the electrode 216 do not affect the semiconductor film 208. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect is caused when the electrodes 206 and 216 have the same potential or different potentials.

The BT stress test is one kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. The smaller the amount of change in threshold voltage by the BT stress test is, the higher the reliability of the transistor is.

By providing the electrode 206 and the electrode 216 and setting the potentials of the electrode 206 and the electrode 216 to be the same, the change in the threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor film from the back gate electrode side. Therefore, photodegradation of the semiconductor film can be prevented and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

Figure 29C:
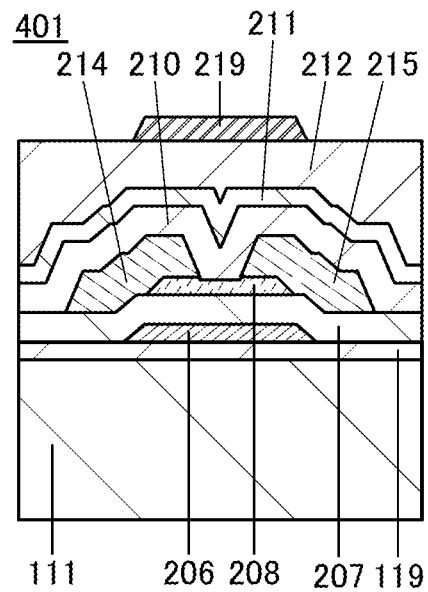
Figure 29D:
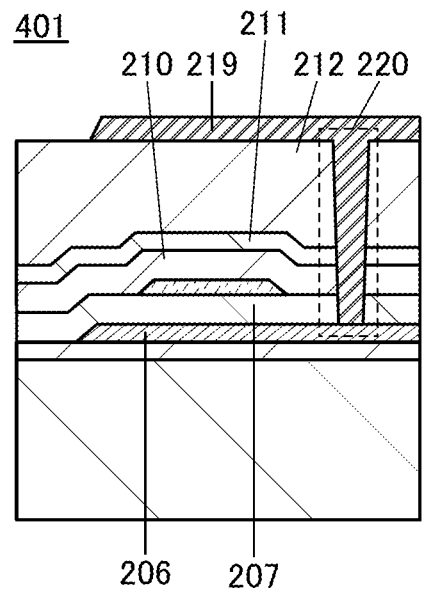

As in a transistor 401 illustrated in FIGS. 29C and 29D, an electrode 219 may be provided over the insulating film 212. The electrode 219 has a function of a back gate electrode. The electrode 219 can be formed using a material and a method that are similar to those of the electrode 115.

FIG. 29C is a cross-sectional view of the transistor 401 in the channel length direction. FIG. 29D is a cross-sectional view of the transistor 401 in the channel width direction. As illustrated in FIG. 29D, in the channel width direction, the electrode 206 and the electrode 219 are connected to each other in an opening 220 formed in the insulating films 207, 210, 211, and 212.

Figure 30A:
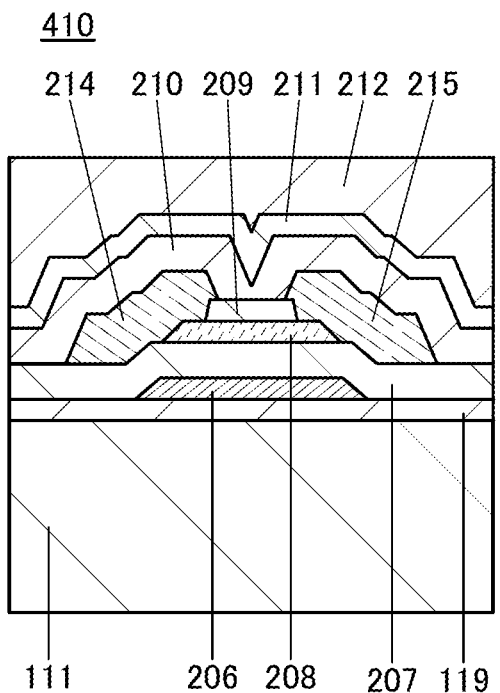
FIGS. 30A to 30D are cross-sectional views each illustrating one embodiment of a transistor.

A transistor 410 illustrated in FIG. 30A as an example is a channel-protective transistor that is a type of bottom-gate transistor. The transistor 410 includes an insulating film 209 that can function as a channel protective film over the semiconductor film 208. The insulating film 209 can be formed using a material and a method that are similar to those of the insulating film 205. Part of the electrode 214 and part of the electrode 215 are formed over the insulating film 209.

The insulating film 209 provided over the semiconductor film 208 can prevent the semiconductor film 208 from being exposed at the time of forming the electrode 214 and the electrode 215. Thus, the semiconductor film 208 can be prevented from being reduced in thickness at the time of forming the electrode 214 and the electrode 215. According to one embodiment of the present invention, a transistor with favorable electrical characteristics can be provided.

Figure 30B:
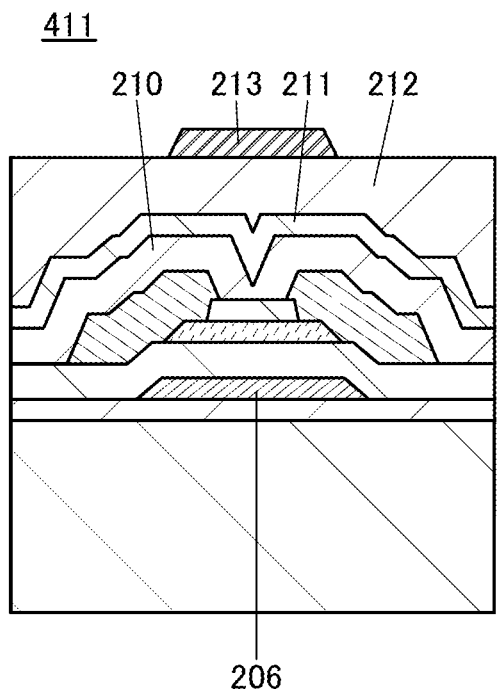

A transistor 411 illustrated in FIG. 30B differs from the transistor 410 in that an electrode 213 that can function as a back gate electrode is provided over the insulating film 212.

The electrode 213 can be formed using a material and a method that are similar to those of the electrode 206. The electrode 213 may be formed between the insulating film 210 and the insulating film 211.

Figure 30C:
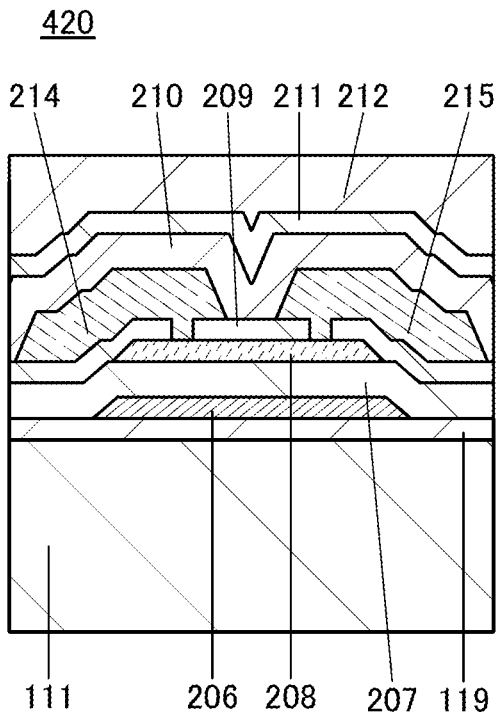

A transistor 420 illustrated in FIG. 30C as an example is a channel-protective transistor that is a type of bottom-gate transistor. The transistor 420 has almost the same structure as the transistor 410 but differs from the transistor 410 in that the insulating film 209 covers the semiconductor film 208. The semiconductor film 208 is electrically connected to the electrode 214 in an opening formed by selectively removing part of the insulating film 209. In addition, the semiconductor film 208 is electrically connected to the electrode 215 in the opening formed by selectively removing part of the insulating film 209. A region in the insulating film 209 that overlaps with a channel formation region can function as a channel protective film.

Figure 30D:
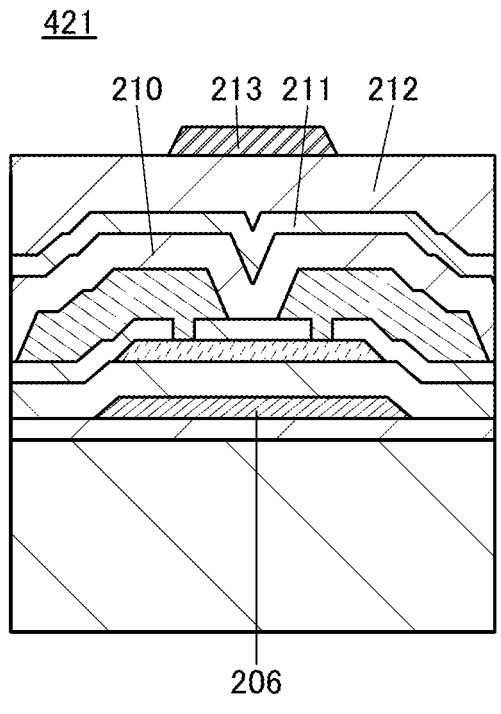

A transistor 421 illustrated in FIG. 30D differs from the transistor 420 in that the electrode 213 that can function as a back gate electrode is provided over the insulating film 212.

The insulating film 209 can prevent the semiconductor film 208 from being exposed at the time of forming the electrode 214 and the electrode 215. Thus, the semiconductor film 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced. According to one embodiment of the present invention, a transistor with favorable electrical characteristics can be provided.

[Top-Gate Transistor]

Figure 31A:
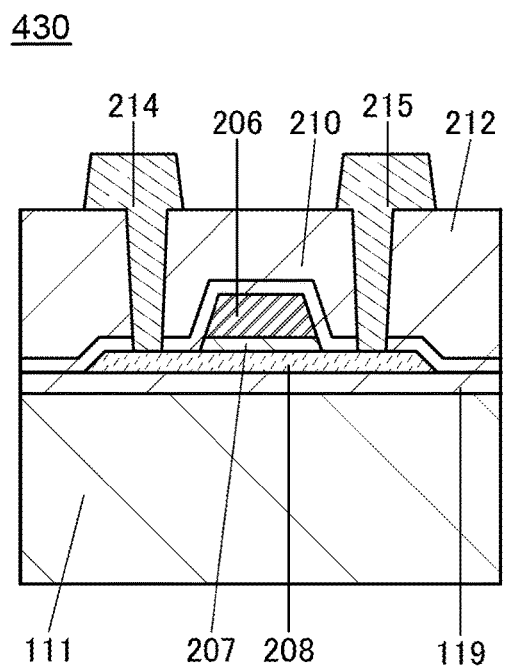
FIGS. 31A and 31B are cross-sectional views each illustrating one embodiment of a transistor.

A transistor 430 illustrated in FIG. 31A as an example is a type of top-gate transistor. The transistor 430 includes the semiconductor film 208 over the insulating film 119; the electrodes 214 and 215 in contact with parts of the semiconductor film 208 over the semiconductor film 208 and the insulating film 119; the insulating film 207 over the semiconductor film 208; and the electrode 206 over the insulating film 207. The insulating film 210 and the insulating film 212 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element is introduced into the semiconductor film 208 using the electrode 206 as a mask, so that an impurity region can be formed in the semiconductor film 208 in a self-aligned manner. According to one embodiment of the present invention, a transistor with favorable electrical characteristics can be provided.

The introduction of the impurity element can be performed with an ion implantation apparatus, an ion doping apparatus, or a plasma treatment apparatus.

As the impurity element, for example, at least one element selected from Group 13 elements and the Group 15 elements can be used. In the case where an oxide semiconductor is used for the semiconductor film 208, it is possible to use at least one kind of element of a rare gas, hydrogen, and nitrogen as the impurity element.

Figure 31B:
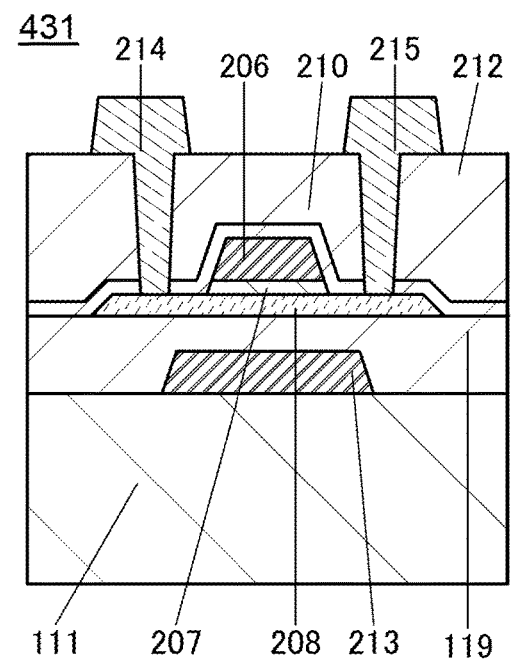

A transistor 431 illustrated in FIG. 31B differs from the transistor 430 in that the electrode 213 overlaps with the semiconductor film 208 with the insulating film 119 therebetween. As described above, the electrode 213 can function as a back gate electrode. Thus, the insulating film 217 can function as a gate insulating film. The insulating film 217 can be formed using a material and a method that are similar to those of the insulating film 205.

The transistor 431 as well as the transistor 411 has comparatively large on-state current in view of its area. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

This embodiment can be implemented in an appropriate combination with any of the structures described in the other embodiments.

Embodiment 5

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is difficult to be observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution TEM image of a plane of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (or molecular radius), and thus disturbs the atomic arrangement of the oxide semiconductor film and decreases crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a clear crystal part cannot be easily found in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM observation image, for example, a clear crystal grain boundary cannot be easily found in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be easily found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a spot is not observed and only a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Consequently, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Furthermore, the film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is 78.6% or higher and lower than 92.3% of the film density of the single crystal oxide semiconductor film having the same composition. For example, the film density of the nc-OS film and the CAAC-OS film is 92.3% or higher and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in an oxide semiconductor film in which the atomic ratio of In to Ga and Zn is 1:1:1, the film density of a single crystal of $InGaZnO_4$ with a rhombohedral crystal structure is 6.357 $g/cm^3$. Accordingly, in the oxide semiconductor film in which the atomic ratio of In to Ga and Zn is 1:1:1, the density of the a-like OS film is higher than or equal to 5.0 $g/cm^3$ and lower than 5.9 $g/cm^3$, and the density of the nc-OS film and the CAAC-OS film is higher than or equal to 5.9 $g/cm^3$ and lower than 6.3 $g/cm^3$.

However, there might be no single crystal oxide semiconductor film having the same composition as the oxide semiconductor film. In that case, single crystal oxide semiconductor films with different compositions are combined in an adequate ratio to calculate film density equivalent to that of a single crystal oxide semiconductor film with the desired composition. The film density of a single crystal oxide semiconductor having the desired composition can be calculated using a weighted average according to the combination ratio of the single crystal oxide semiconductors with different compositions. Note that it is preferable to use as few kinds of single crystal oxide semiconductor film as possible to calculate the film density.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be implemented in an appropriate combination with any of the structures described in the other embodiments.

Embodiment 6

Although the capacitive touch sensor is described as an example of the touch sensor 271 in the above embodiments, one embodiment of the present invention is not limited thereto. A resistive touch sensor may be used as the touch sensor 271. An active touch sensor using an active element such as a transistor may also be used.

In this embodiment, a structure example of an active touch sensor 500 that can be used as the touch sensor 271 and an example of a method for driving the active touch sensor 500 are described with reference to FIGS. 32A, 32B, 32C, 32D-1, and 32D-2 and FIGS. 33A to 33D.

Figure 32A:
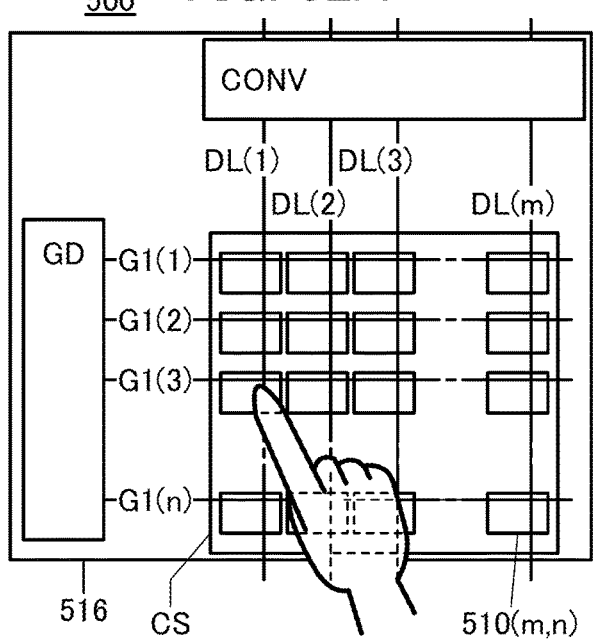
FIGS. 32A, 32B, 32C, 32D-1, and 32D-2 illustrate a structure example of a touch sensor and an example of a method for driving the touch sensor.
Figure 32B:
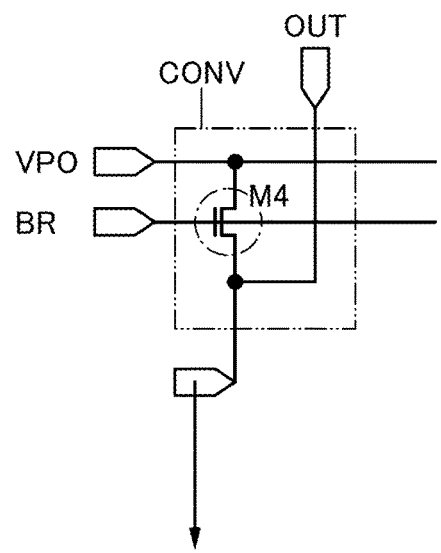
Figure 32C:
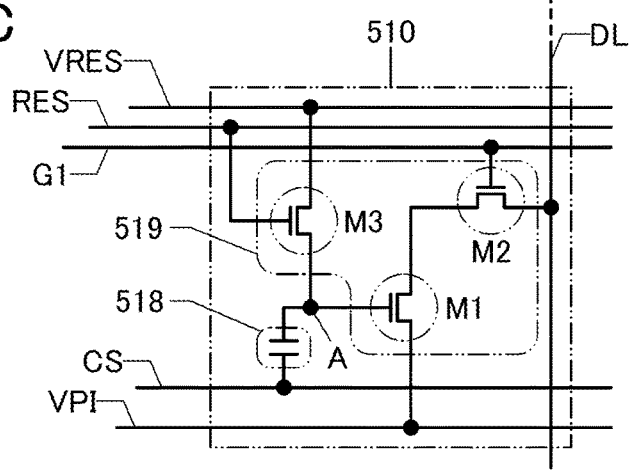
Figures 1, 32D:
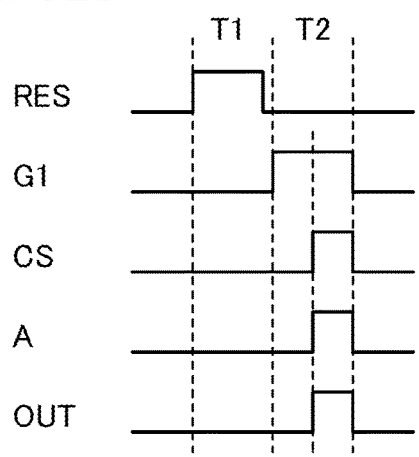
Figures 2, 32D:
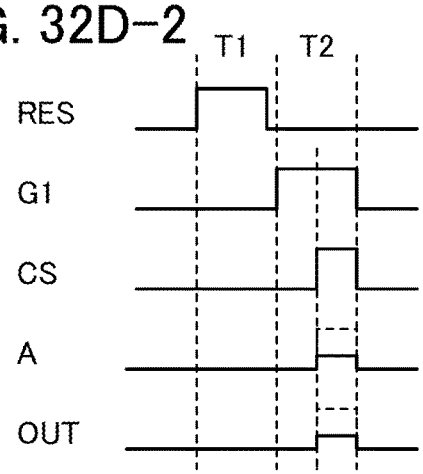

FIG. 32A is a block diagram illustrating a structure of the active touch sensor 500. FIG. 32B is a circuit diagram illustrating a structure of a converter CONV. FIG. 32C is a circuit diagram illustrating a structure of a sensing unit 510. FIGS. 32D-1 and 32D-2 are timing charts each illustrating a method for driving the sensing unit 510.

FIG. 33A is a block diagram illustrating a structure of an active touch sensor 500B. FIG. 33B is a circuit diagram illustrating a structure of a converter CONV. FIG. 33C is a circuit diagram illustrating a structure of a sensing unit 510B. FIG. 33D is a timing chart illustrating a method for driving the touch sensor 500B.

Structure Example 1 of Positional Data Input Portion

The touch sensor 500 illustrated in FIGS. 32A, 32B, 32C, 32D-1, and 32D-2 as an example includes a plurality of sensing units 510 arranged in a matrix, scan lines G1 to which the plurality of sensing units 510 arranged in the row direction are electrically connected, and signal lines DL to which the plurality of sensing units 510 arranged in the column direction are electrically connected (see FIG. 32A).

For example, the plurality of sensing units 510 can be arranged in a matrix of n rows and m columns (n and m are natural numbers greater than or equal to 1).

The sensing unit 510 includes a sensor element 518 that can function as a capacitor and a sensor circuit 519. One electrode of the sensor element 518 is electrically connected to a wiring CS. The other electrode of the sensor element 518 is electrically connected to a node A. Thus, the potential of the node A can be controlled using a control signal supplied through the wiring CS.

<<Sensor Circuit 519>>

The sensor circuit 519 illustrated in FIG. 32C as an example includes a transistor M1, a transistor M2, and a transistor M3. A gate of the transistor M1 is electrically connected to the node A, one of a source and a drain of the transistor M1 is electrically connected to a wiring VPI that can supply a ground potential, and the other of the source and the drain is electrically connected to one of a source and a drain of the transistor M2.

The other of the source and the drain of the transistor M2 is electrically connected to the signal line DL that can supply a sensor signal DATA, and a gate of the transistor M2 is electrically connected to the scan line G1 that can supply a selection signal.

One of a source and a drain of the transistor M3 is electrically connected to the node A, and the other of the source and the drain is electrically connected to a wiring VRES that can supply a potential at which the transistor M1 can be turned on. A gate of the transistor M3 is electrically connected to a wiring RES that can supply a reset signal.

The capacitance of the sensor element 518 changes, for example, when an object comes close to one electrode or the other electrode (node A) of the sensor element 518 or when the distance between one electrode and the other electrode changes. Thus, the sensing unit 510 can supply the sensor signal DATA in accordance with a change in the capacitance of the sensor element 518.

The wiring VRES and the wiring VPI can supply, for example, a ground potential. A wiring VPO and a wiring BR can supply, for example, a high power supply potential.

The wiring RES can supply a reset signal. The scan line G1 can supply a selection signal. The wiring CS can supply a control signal for controlling the potential of the other electrode of the sensor element (the potential of the node A).

The signal line DL can supply the sensor signal DATA. A terminal OUT can supply a signal obtained by conversion based on the sensor signal DATA.

<<Converter CONV>>

The converter CONV has a conversion circuit. A variety of circuits that can convert the sensor signal DATA and supply the resulting signal to the terminal OUT can be used for the converter CONV. For example, a source follower circuit, a current mirror circuit, or the like may be formed by the electrical connection between the converter CONV and the sensor circuit 519.

Specifically, a source follower circuit can be formed with the converter CONV using a transistor M4 (see FIG. 32B). Note that the transistor M4 may be formed in the same process as the transistors M1 to M3.

Any of the transistors described in the above embodiments can be used as the transistors M1 to M4. For example, a Group 4 element, a compound semiconductor, or an oxide semiconductor can be used for a semiconductor film. Specifically, a silicon-containing semiconductor, a gallium arsenide-containing semiconductor, an indium-containing oxide semiconductor, or the like can be used.

The converter CONV and a driver circuit GD may be provided over another substrate (e.g., a single crystal semiconductor substrate or a polycrystalline semiconductor substrate) and may be electrically connected to the sensing unit 510 by a chip on glass (COG) method, a wire bonding method, or the like, or using an FPC or the like.

<Method for Driving Sensor Circuit 519>

A method for driving the sensor circuit 519 is described.

<First Step>

In a first step, a reset signal for turning on the transistor M3 and subsequently turning off the transistor M3 is supplied to the gate of the transistor M3, and the potential of the node A is set at a predetermined potential (see Period T1 in FIG. 32D-1).

Specifically, the reset signal is supplied to the gate of the transistor M3 through the wiring RES. The transistor M3 supplied with the reset signal makes the node A have, for example, a potential at which the transistor M1 can be turned off (see Period T1 in FIG. 32D-1).

<<Second Step>>

In a second step, a selection signal for turning on the transistor M2 is supplied, so that the other of the source and the drain of the transistor M1 is electrically connected to the signal line DL.

Specifically, the selection signal is supplied to the gate of the transistor M2 through the scan line G1. The transistor M2 supplied with the selection signal electrically connects the other of the source and the drain of the transistor M1 to the signal line DL (see Period T2 in FIG. 32D-1).

<<Third Step>>

In a third step, a control signal is supplied to the one electrode of the sensor element 518, and a potential that varies depending on the control signal and the capacitance of the sensor element 518 is supplied to the gate of the transistor M1 through the node A.

Specifically, a rectangular wave control signal is supplied from the wiring CS. When the rectangular wave control signal is supplied to the one electrode of the sensor element 518, the potential of the node A increases in accordance with the capacitance of the sensor element 518 (see the latter half of Period T2 in FIG. 32D-1).

For example, when the sensor element 518 is placed in the air and an object with a higher dielectric constant than the air is placed close to the one electrode of the sensor element 518, the apparent capacitance of the sensor element 518 increases. In that case, a change in the potential of the node A due to the rectangular wave control signal is smaller than that when an object with a higher dielectric constant than the air is not placed close to the one electrode of the sensor element 518 (see a solid line in FIG. 32D-2).

<<Fourth Step>>

In a fourth step, a signal based on a change in the potential of the gate of the transistor M1 is supplied to the signal line DL.

For example, a change in current due to the change in the potential of the gate of the transistor M1 is supplied to the signal line DL.

The converter CONV converts a change in the current flowing through the signal line DL into a change in voltage and outputs the voltage to the terminal OUT.

<<Fifth Step>>

In a fifth step, a selection signal for turning off the transistor M2 is supplied to the gate of the transistor M2.

Each of the scan lines G1(1) to G1(n) performs the first to fifth steps, whereby a selected region in the touch sensor 500 can be known.

Structure Example 2 of Position Data Input Portion

The touch sensor 500B illustrated in FIGS. 33A to 33D as an example differs from the touch sensor 500 in that the sensing unit 510B is provided instead of the sensing unit 510.

The sensing unit 510B is different from the sensing unit 510 in the following points: the one electrode of the sensor element 518 in the sensing unit 510B is electrically connected to the scan line G1 while that in the sensing unit 510 is electrically connected to the wiring CS; and the other of the source and the drain of the transistor M1 in the sensing unit 510B is electrically connected to the signal line DL not via the transistor M2 while that in the sensing unit 510 is electrically connected to the signal line DL via the transistor M2. Here, different structures are described in detail, and the above description is referred to for the other similar structures.

The touch sensor 500B includes the sensing units 510B arranged in a matrix; scan lines G1 to which the sensing units 510B arranged in the row direction are electrically connected; and signal lines DL to which the sensing units 510B arranged in the column direction are electrically connected (see FIG. 33A).

For example, the plurality of sensing units 510B can be arranged in a matrix of n rows and m columns (n and m are natural numbers greater than or equal to 1).

The sensing unit 510B includes the sensor element 518, and the one electrode of the sensor element 518 is electrically connected to the scan line G1. With this structure, a selected scan line G1 can control the potentials of the nodes A of the sensing units 510B to which the selected scan line G1 is electrically connected, by supplying the selection signal.

The signal line DL and the scan line G1 may be formed with the same conductive film.

The one electrode of the sensor element 518 and the scan line G1 may be formed using the same conductive film. For example, one electrode of the sensor element 518 and one electrode of the sensor element 518, which are included in the adjacent sensing units 510B arranged in the row direction, may be connected to each other and the connected electrodes may be used as the scan line G1.

<<Sensor Circuit 519B>>

The sensor circuit 519B illustrated in FIG. 33C includes the transistor M1 and the transistor M3. A gate of the transistor M1 is electrically connected to the node A. One of a source and a drain of the transistor M1 is electrically connected to a wiring VPI that can supply the ground potential. The other of the source and the drain is electrically connected to the signal line DL that can supply the sensing signal DATA.

One of a source and a drain of the transistor M3 is electrically connected to the node A, and the other of the source and the drain is electrically connected to a wiring VRES that can supply a potential at which the transistor M1 can be turned on. A gate of the transistor M3 is electrically connected to a wiring RES that can supply a reset signal.

The capacitance of the sensor element 518 changes, for example, when an object comes close to one electrode or the other electrode (node A) of the sensor element 518 or when the distance between one electrode and the other electrode changes. Thus, the sensing unit 510 can supply the sensor signal DATA in accordance with a change in the capacitance of the sensor element 518.

The wiring VRES and the wiring VPI can supply, for example, a ground potential. A wiring VPO and a wiring BR can supply, for example, a high power supply potential.

Furthermore, the wiring RES can supply the reset signal, and the scan line G1 can supply the selection signal.

The signal line DL can supply the sensing signal DATA. A terminal OUT can supply a signal obtained by conversion based on the sensing signal DATA.

<Method for Driving Sensor Circuit 519B>

Method for driving the sensor circuit 519B is described.

<<First Step>>

In a first step, after the transistor M3 is turned on, a reset signal for turning off the transistor M3 is supplied to the gate of the transistor M3, so that the potential of the first electrode of the sensor element 518 is set to a predetermined potential (see Period T1 in FIG. 33D).

Specifically, the reset signal is supplied from the wiring RES. The transistor M3 to which the reset signal is supplied sets the potential of the node A to a potential at which the transistor M1 is turned off, for example (see FIG. 33C).

<<Second Step>>

In a second step, a selection signal is supplied to the one electrode of the sensor element 518, and a selection signal and the potential that varies depending on the electrostatic capacitance of the sensor element 518 are supplied to the gate of the transistor M1 via the node A (see Period T2 in FIG. 33D).

Specifically, a rectangular selection signal is supplied to the scan line G1(i–1). The sensor element 518 the one electrode of which is supplied with the rectangular selection signal increases the potential of the node A in accordance with the electrostatic capacitance of the sensor element 518.

For example, when the sensor element 518 is placed in the air and an object with a higher dielectric constant than the air is placed close to the one electrode of the sensor element 518, the apparent capacitance of the sensor element 518 increases. In that case, a change in the potential of the node A due to the rectangular wave control signal is smaller than that when an object with a higher dielectric constant than the air is not placed close to the one electrode of the sensor element 518.

<<Third Step>>

In a third step, a signal caused by a change in the potential of the gate of the transistor M1 is supplied to the signal line DL.

For example, a change in current due to the change in the potential of the gate of the transistor M1 is supplied to the signal line DL.

The converter CONV converts a change in the current flowing through the signal line DL into a change in voltage and outputs the voltage to the terminal OUT.

Each of the scan lines G1(1) to G1(n) performs the first to third steps (see Periods T2 to T4 in FIG. 33D). In FIG. 33D, the scan line G1 in the i-th row (i is a natural number of 1 to n) is expressed as the scan line G1(i). According to the above-described structure examples and operation examples, which region in the touch sensor 500B is selected can be sensed.

This embodiment can be implemented in an appropriate combination with any of the structures described in the other embodiments.

Embodiment 7

In this embodiment, structure examples of a light-emitting element that can be used as the light-emitting element 125 are described. Note that an EL layer 320 described in this embodiment corresponds to the EL layer 117 described in the above embodiments.

<Structure of Light-Emitting Element>

Figure 34A:
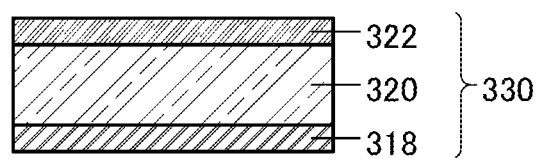
FIGS. 34A and 34B illustrate structure examples of light-emitting elements.

In a light-emitting element 330 illustrated in FIG. 34A, the EL layer 320 is interposed between a pair of electrodes (a first electrode 318 and a second electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, an electron-injection layer, and the like can be used in appropriate combination.

The light-emitting element 330 illustrated in FIG. 34A emits light when current flows because of a potential difference generated between the electrode 318 and the electrode 322 and holes and electrons are recombined in the EL layer 320. In other words, a light-emitting region is formed in the EL layer 320.

In the present invention, light emitted from the light-emitting element 330 is extracted to the outside from the electrode 318 side or the electrode 322 side. Thus, one of the electrode 318 and the electrode 322 is formed of a light-transmitting substance.

Figure 34B:
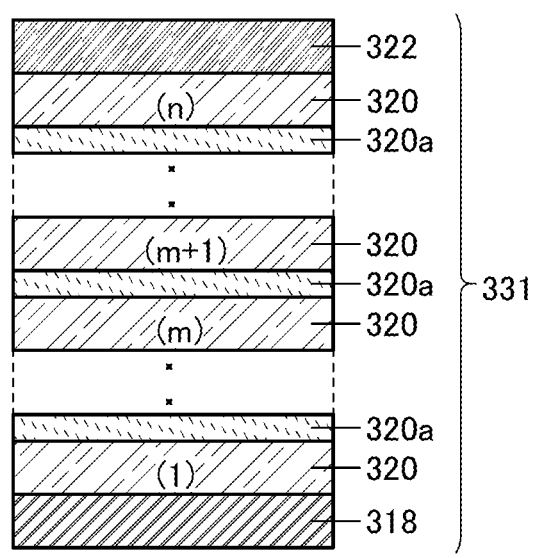

Note that a plurality of EL layers 320 may be stacked between the electrode 318 and the electrode 322 as in a light-emitting element 331 illustrated in FIG. 34B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide and another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to have problems such as energy transfer and quenching and has an expanded choice of materials, and thus can easily have both high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 34B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 34B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including 1 EL layers emitting light of complementary colors, white light emission can be obtained. In a stacked-layer element including two EL layers that emit lights with complementary colors, the combinations of colors are as follows: blue and yellow, blue-green and red, and the like.

Note that in the structure of the above-described stacked-layer element, by providing the charge generation layer between the stacked light-emitting layers, the light-emitting element can emit light in a high luminance region while the current density is kept low. Since the current density can be kept low, the element can have a long lifetime. In addition, the voltage drop due to the resistance of the electrode material can be reduced, whereby uniform light emission in a large area is possible.

This embodiment can be implemented in an appropriate combination with any of the structures described in the other embodiments.

Embodiment 8

In this embodiment, examples of an electronic appliance including the display device of one embodiment of the present invention are described with reference to drawings.

Specific examples of the electronic appliance that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, examples of electronic appliances each including a flexible display device include television devices (also referred to as televisions or television receivers), monitors of computers or the like, cameras such as digital cameras and digital video cameras, digital photo frames, mobile phones (also referred to as mobile phones or mobile phone devices), portable game machines, portable information terminals, audio reproducing devices, and large game machines such as pachinko machines In addition, a lighting device or a display device can be incorporated along a curved inside/outside wall surface of a house or a building or a curved interior/exterior surface of a car.

Figure 35A:
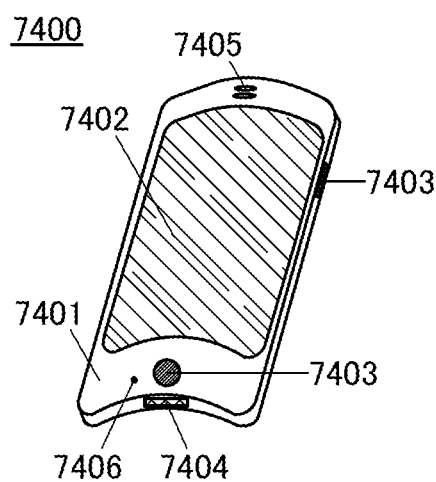
FIGS. 35A to 35E illustrate examples of electronic appliances and lighting devices.

FIG. 35A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is manufactured using the display device for the display portion 7402.

When the display portion 7402 of the mobile phone 7400 illustrated in FIG. 35A is touched with a finger or the like, data can be input to the mobile phone 7400. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; switching images from a mail creation screen to a main menu screen.

Here, the display portion 7402 includes the display device of one embodiment of the present invention. Thus, the mobile phone can have a curved display portion and high reliability.

Figure 35B:
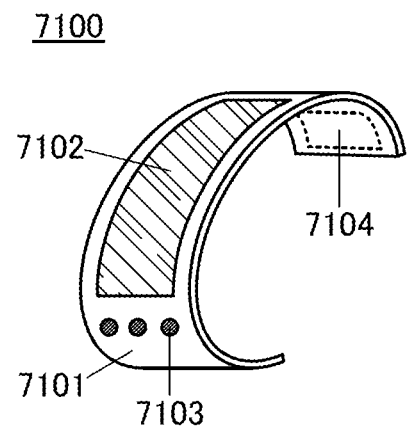

FIG. 35B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the mobile display device can have a curved display portion and high reliability.

Figure 35C:
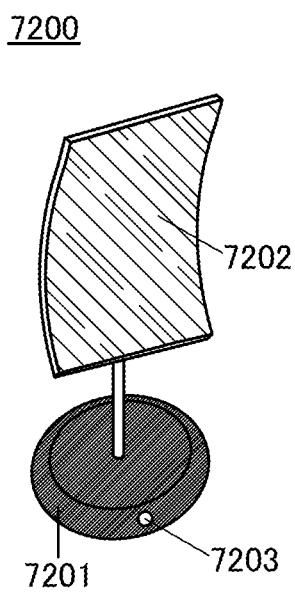
Figure 35D:
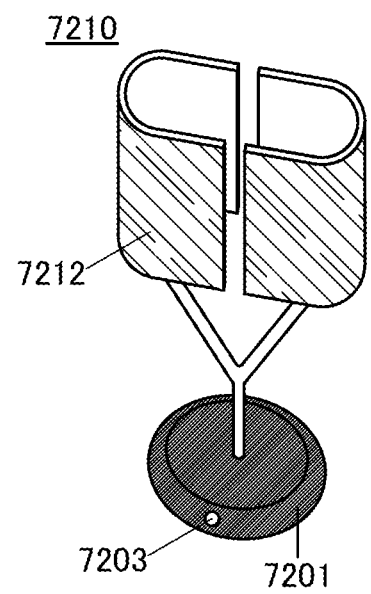
Figure 35E:
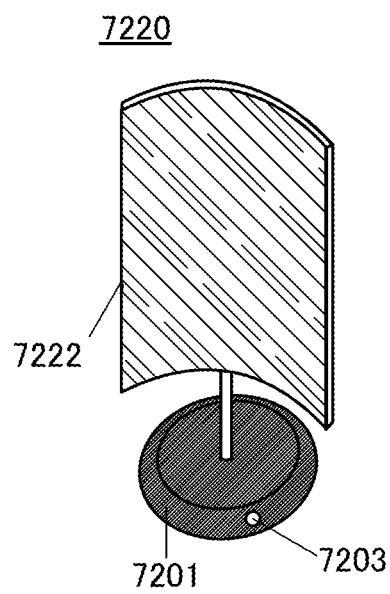

FIGS. 35C to 35E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 35C includes a light-emitting portion 7202 with a wave-shaped light-emitting surface and thus is a good-design lighting device.

A light-emitting portion 7212 included in the lighting device 7210 illustrated in FIG. 35D has two convex-curved light-emitting portions symmetrically placed. Thus, light radiates from the lighting device 7210 in all directions.

The lighting device 7220 illustrated in FIG. 35E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 36A:
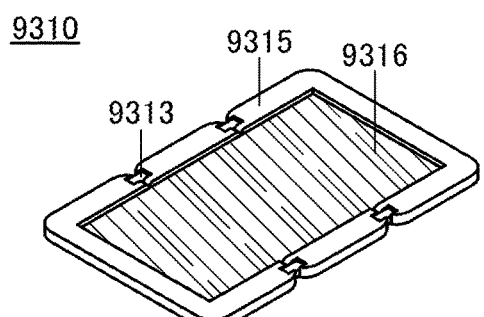
FIGS. 36A to 36I illustrate examples of electronic appliances.
Figure 36B:
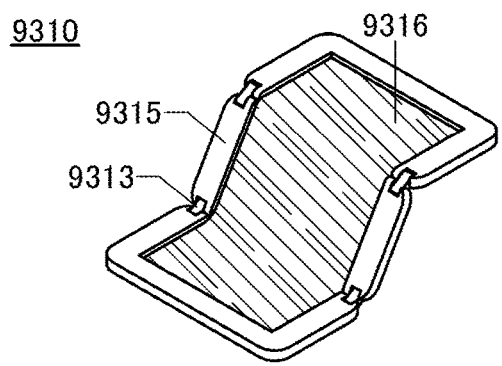
Figure 36C:
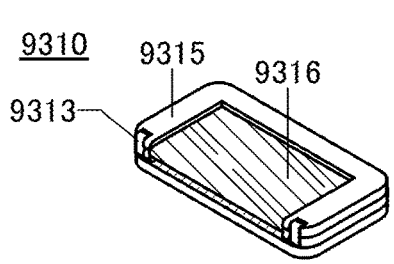

FIGS. 36A to 36C illustrate a foldable portable information terminal 9310 as an example of an electronic appliance. FIG. 36A illustrates the portable information terminal 9310 that is opened. FIG. 36B illustrates the portable information terminal 9310 that is being opened or being folded. FIG. 36C illustrates the portable information terminal 9310 that is folded. The portable information terminal 9310 includes a display panel 9316, housings 9315, and hinges 9313. The portable information terminal 9310 is highly portable when folded. When the portable information terminal 9310 is opened, a seamless large display region is obtained; thus, the display image is highly browsable.

The display panel 9316 included in the portable information terminal 9310 is supported by the three housings 9315 joined together by the hinges 9313. The display panel 9316 can be folded at the hinges 9313. The portable information terminal 9310 can be reversibly changed in shape from an opened state to a folded state. The display device of one embodiment of the present invention can be used for the display panel 9316. For example, a display device that can be bent with a radius of curvature of greater than or equal to 1 mm and less than or equal to 150 mm can be used. The display panel 9316 may include a touch sensor.

Note that in one embodiment of the present invention, a sensor that senses whether the display panel 9316 is in a folded state or an unfolded state may be used. The operation of a folded portion (or a portion that becomes invisible by a user by folding) of the display panel 9316 may be stopped by a control device through the acquisition of data indicating the folded state of the display panel 9316. Specifically, display of the portion may be stopped. In the case where a touch sensor is included, detection by the touch sensor may be stopped.

Similarly, the control device of the display panel 9316 may acquire data indicating the unfolded state of the display panel 9316 to resume displaying and sensing by the touch sensor.

Figure 36D:
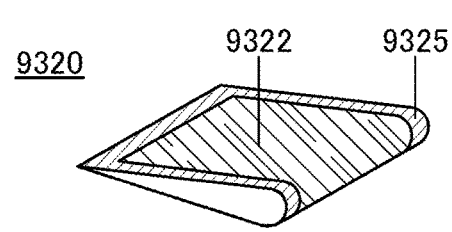
Figure 36E:
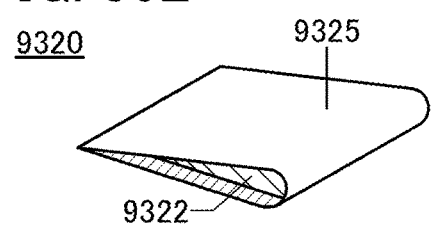

FIGS. 36D and 36E each illustrate a foldable portable information terminal 9320. FIG. 36D illustrates the portable information terminal 9320 that is folded so that a display portion 9322 is on the outside. FIG. 36E illustrates the portable information terminal 9320 that is folded so that the display portion 9322 is on the inside. When the portable information terminal 9320 is not used, the portable information terminal 9320 is folded so that a non-display portion 9325 faces the outside, whereby the display portion 9322 can be prevented from being contaminated or damaged. The display device of one embodiment of the present invention can be used for the display portion 9322.

Figure 36F:
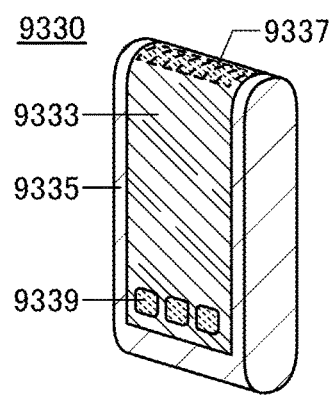
Figure 36G:
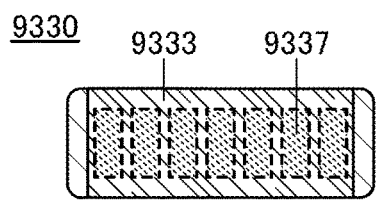
Figure 36H:
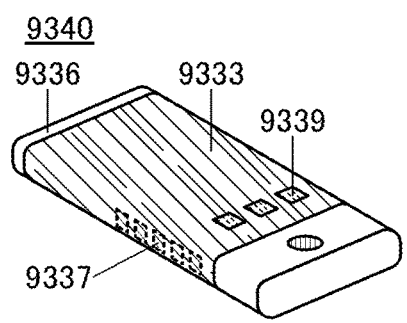

FIG. 36F is a perspective view illustrating an external shape of a portable information terminal 9330. FIG. 36G is a top view of the portable information terminal 9330. FIG. 36H is a perspective view illustrating an external shape of a portable information terminal 9340.

The portable information terminals 9330 and 9340 each function as, for example, one or more of a telephone set, a notebook, and an information browsing system. Specifically, the portable information terminals 9330 and 9340 each can be used as a smartphone.

The portable information terminals 9330 and 9340 can display characters and image information on their plurality of surfaces. For example, one or more operation buttons 9339 can be displayed on the front surface (FIG. 36F). In addition, information 9337 indicated by dashed rectangles can be displayed on the top surface (FIG. 36G) or on the side surface (FIG. 36H). Examples of the information 9337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 9339, an icon, or the like may be displayed in place of the information 9337. Although FIGS. 36F and 36G illustrate an example in which the information 9337 is displayed at the top and side surfaces, one embodiment of the present invention is not limited thereto. The information 9337 may be displayed, for example, on the bottom or rear surface.

For example, a user of the portable information terminal 9330 can see the display (here, the information 9337) with the portable information terminal 9330 put in a breast pocket of his/her clothes.

Specifically, a caller's phone number, name, or the like of an incoming call is displayed on the front surface of the portable information terminal 9330. Thus, the user can see the display without taking out the portable information terminal 9330 from the pocket and decide whether to answer the call.

The display device of one embodiment of the present invention can be used for a display portion 9333 mounted in each of a housing 9335 of the portable information terminal 9330 and a housing 9336 of the portable information terminal 9340. One embodiment of the present invention can provide a highly reliable display device having a curved display portion with a high yield.

Figure 36I:
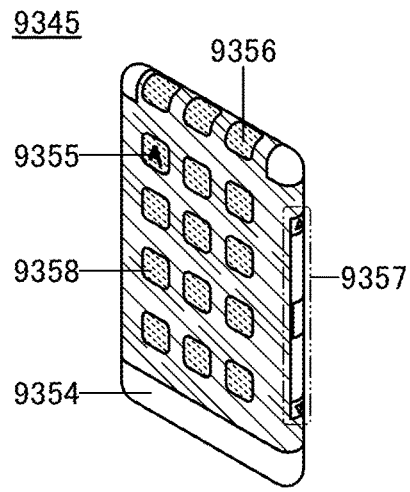

As in a portable information terminal 9345 illustrated in FIG. 36I, data may be displayed on three or more surfaces. Here, data 9355, data 9356, and data 9357 are displayed on different surfaces.

The display device of one embodiment of the present invention can be used for a display portion 9358 included in a housing 9354 of the portable information terminal 9345. One embodiment of the present invention can provide a highly reliable display device having a curved display portion with a high yield.

This embodiment can be implemented in an appropriate combination with any of the structures described in the other embodiments.

This application is based on Japanese Patent Application serial No. 2014-097943 filed with the Japan Patent Office on May 9, 2014, the entire contents of which are hereby incorporated by reference.

What is claimed is:

1. A light-emitting device comprising:
a light-emitting element;
an organic resin film; and
a film,
wherein the organic resin film is in contact with the light-emitting element,
wherein the light-emitting element comprises a first electrode, an EL layer, and a second electrode,
wherein the film is in contact with the second electrode,
wherein the film is in contact with a side surface of the organic resin film, and
wherein the film contains oxygen and at least one of zinc and gallium.

2. The light-emitting device according to claim 1, further comprising an insulating film,
wherein the insulating film is in contact with the film.

3. The light-emitting device according to claim 1,
wherein the film contains indium, M (M is Al, Ga, Y, Zr, Sn, La, Ce, or Nd), zinc, and oxygen,
wherein the atomic proportion of M is larger than the atomic proportion of indium, and
wherein the atomic proportion of zinc is larger than the atomic proportion of indium.

4. The light-emitting device according to claim 1, further comprising a transistor,
wherein the transistor is connected to the light-emitting element.

5. An electronic appliance comprising:
the light-emitting device according to claim 1; and
a housing.

6. A light-emitting device comprising:
a light-emitting element;
an organic resin film;
a first film; and
a second film,
wherein the organic resin film is in contact with the light-emitting element,
wherein the light-emitting element comprises a first electrode, an EL layer, and a second electrode,
wherein the second film is over the first film and in contact with the first film,
wherein the first film is in contact with the second electrode,
wherein the first film is in contact with a side surface of the organic resin film,
wherein the first film contains oxygen and at least one of zinc and gallium, and
wherein the second film contains indium and oxygen.

7. The light-emitting device according to claim 6,
wherein the first film contains indium, M (M is Al, Ga, Y, Zr, Sn, La, Ce, or Nd), zinc, and oxygen,
wherein the atomic proportion of M is larger than the atomic proportion of indium, and wherein the atomic proportion of zinc is larger than the atomic proportion of indium.

8. The light-emitting device according to claim 6, further comprising a transistor,
wherein the transistor is connected to the light-emitting element.

9. An electronic appliance comprising:
the light-emitting device according to claim 6; and
a housing.

10. A light-emitting device comprising:
a light-emitting element;
an organic resin film;
a first film; and
a second film,
wherein the organic resin film is in contact with the light-emitting element,
wherein the light-emitting element comprises a first electrode, an EL layer, and a second electrode,
wherein the first film is over the second film and in contact with the second film,
wherein the second film is in contact with the second electrode,
wherein the second film is in contact with a side surface of the organic resin film,
wherein the first film contains oxygen and at least one of zinc and gallium, and
wherein the second film contains indium and oxygen.

11. The light-emitting device according to claim 10,
wherein the first film contains indium, M (M is Al, Ga, Y, Zr, Sn, La, Ce, or Nd), zinc, and oxygen,
wherein the atomic proportion of M is larger than the atomic proportion of indium, and
wherein the atomic proportion of zinc is larger than the atomic proportion of indium.

12. The light-emitting device according to claim 10, further comprising a transistor,
wherein the transistor is connected to the light-emitting element.

13. An electronic appliance comprising:
the light-emitting device according to claim 10; and
a housing.

* * * * *